(12) United States Patent
Yoshimizu et al.

(10) Patent No.: US 11,923,325 B2
(45) Date of Patent: Mar. 5, 2024

(54) STORAGE SYSTEM, MEMORY CHIP UNIT, AND WAFER

(71) Applicant: Kioxia Corporation, Tokyo (JP)

(72) Inventors: Yasuhito Yoshimizu, Yokkaichi Mie (JP); Takashi Fukushima, Yokkaichi Mie (JP); Tatsuro Hitomi, Yokohama Kanagawa (JP); Arata Inoue, Chigasaki Kanagawa (JP); Masayuki Miura, Yokkaichi Mie (JP); Shinichi Kanno, Tokyo (JP); Toshio Fujisawa, Yokohama Kanagawa (JP); Keisuke Nakatsuka, Kobe Hyogo (JP); Tomoya Sanuki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 170 days.

(21) Appl. No.: 17/695,654

(22) Filed: Mar. 15, 2022

(65) Prior Publication Data

US 2022/0223552 A1    Jul. 14, 2022

Related U.S. Application Data

(63) Continuation of application No. PCT/JP2020/039590, filed on Oct. 21, 2020.

(30) Foreign Application Priority Data

Nov. 15, 2019 (WO) .................. PCT/JP2019/044870

(51) Int. Cl.
*H01L 23/00* (2006.01)
*G06F 11/07* (2006.01)
*H01L 23/544* (2006.01)

(52) U.S. Cl.
CPC ............ *H01L 24/05* (2013.01); *G06F 11/073* (2013.01); *G06F 11/0751* (2013.01);
(Continued)

(58) Field of Classification Search
CPC ................... H01L 24/05; H01L 23/544; H01L 2223/5446; H01L 2224/05139;
(Continued)

(56) References Cited

U.S. PATENT DOCUMENTS 4,489,397 A   12/1984 Lee
5,404,099 A    4/1995 Sahara
(Continued)

FOREIGN PATENT DOCUMENTS

JP    H05-291368 A    11/1993
JP    2005-228788 A    8/2005
(Continued)

*Primary Examiner* — Giovanni Astacio-Oquendo
(74) *Attorney, Agent, or Firm* — Allen & Overy LLP

(57) ABSTRACT

A memory chip unit includes a pad electrode including first and second portions, and a memory cell array. A prober includes a probe card and a movement mechanism. The probe card includes a probe electrode to be in contact with the pad electrode, and a memory controller electrically coupled to the probe electrode and executes reading and writing on the memory cell array. The movement mechanism executes a first operation that brings the probe electrode into contact with the first portion and does not bring the probe electrode into contact with the second portion, and
(Continued)

a second operation that does not bring the probe electrode into contact with the first portion and brings the probe electrode into contact with the second portion.

29 Claims, 34 Drawing Sheets

(52) U.S. Cl.
CPC .... *H01L 23/544* (2013.01); *H01L 2223/5446* (2013.01); *H01L 2224/05139* (2013.01); *H01L 2224/05144* (2013.01); *H01L 2224/05147* (2013.01); *H01L 2224/05155* (2013.01); *H01L 2224/05157* (2013.01); *H01L 2224/05164* (2013.01); *H01L 2924/14511* (2013.01)

(58) Field of Classification Search
CPC . H01L 2224/05144; H01L 2224/05147; H01L 2224/05155; H01L 2224/05157; H01L 2224/05164; H01L 2924/14511; G06F 11/073; G06F 11/0751; G11C 2029/5602; G11C 29/56016; G01R 31/28; G01R 31/26
USPC .......... 324/754.07, 754.03, 754.01, 537, 500
See application file for complete search history.

(56) References Cited

U.S. PATENT DOCUMENTS

| | | | |
|---|---|---|---|
| 10,146,700 | B2 | 12/2018 | Flynn et al. |
| 10,332,860 | B2 | 6/2019 | Fricker et al. |
| 2008/0175080 | A1 | 7/2008 | Kim et al. |
| 2012/0091211 | A1 | 4/2012 | Kuroda |
| 2014/0375349 | A1 | 12/2014 | Lee |
| 2015/0035036 | A1 | 2/2015 | Konno et al. |
| 2017/0179027 | A1 | 6/2017 | Kim et al. |
| 2019/0164910 | A1 | 5/2019 | Roh |
| 2019/0227116 | A1 | 7/2019 | Boduch et al. |
| 2020/0381316 | A1* | 12/2020 | Lee .................. H01L 24/89 |
| 2021/0149568 | A1* | 5/2021 | Yoshimizu ........... G06F 3/0644 |
| 2023/0095908 | A1* | 3/2023 | Shi ................ G01R 1/0408 324/756.07 |

FOREIGN PATENT DOCUMENTS

| | | |
|---|---|---|
| JP | 2007-096190 A | 4/2007 |
| JP | 2010-512586 A | 4/2010 |
| JP | 2010-287113 A | 12/2010 |
| JP | 2015-028982 A | 2/2015 |
| TW | 201916323 A | 4/2019 |

\* cited by examiner

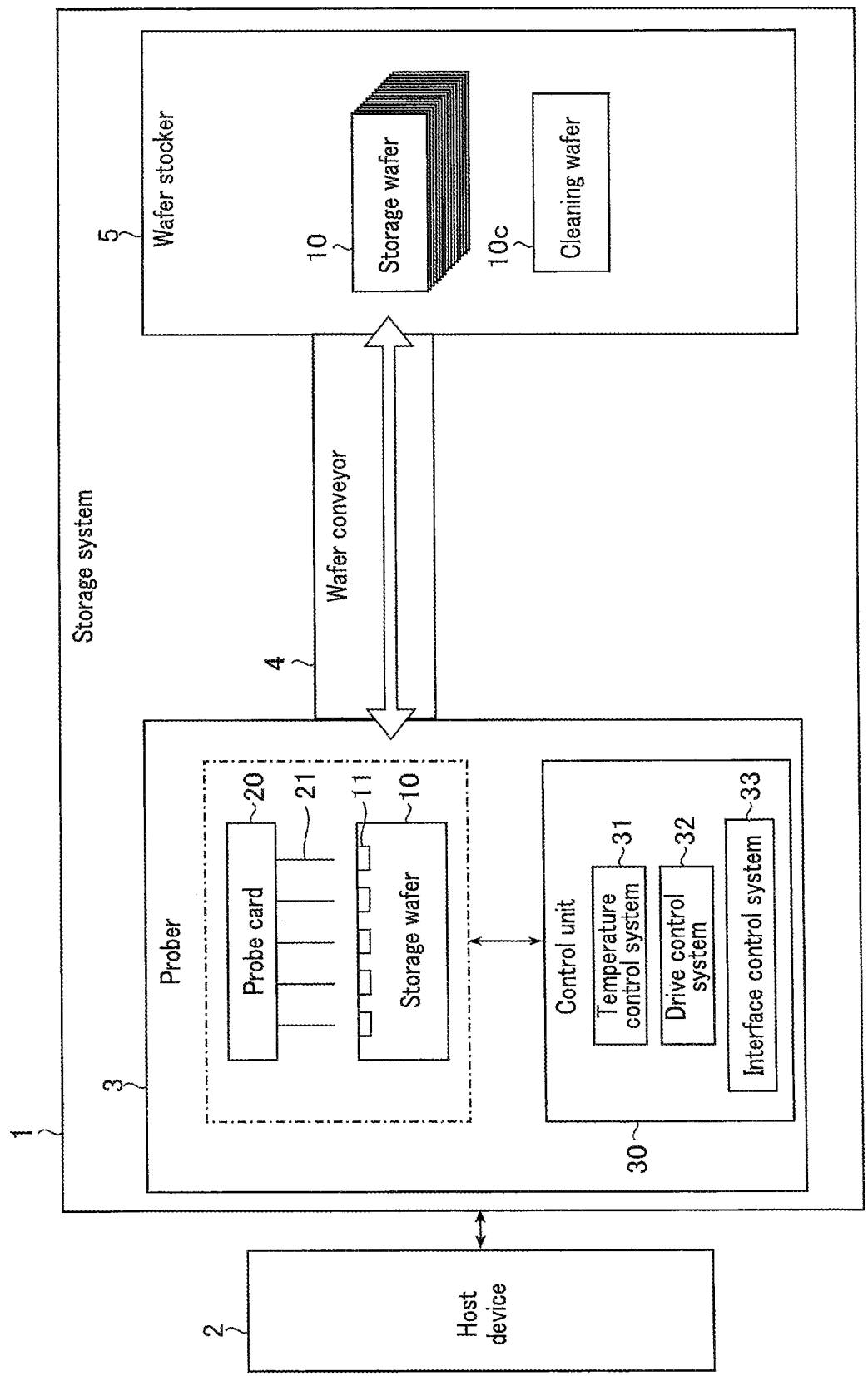
F I G. 1

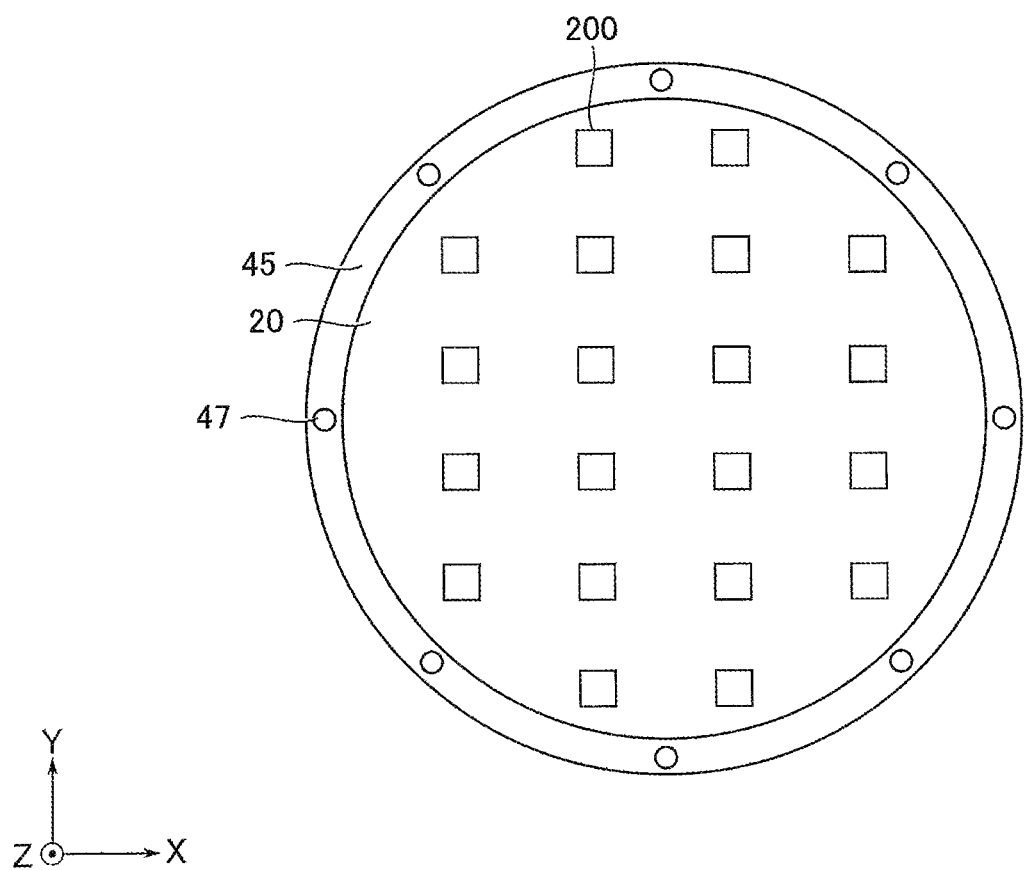
F I G. 3

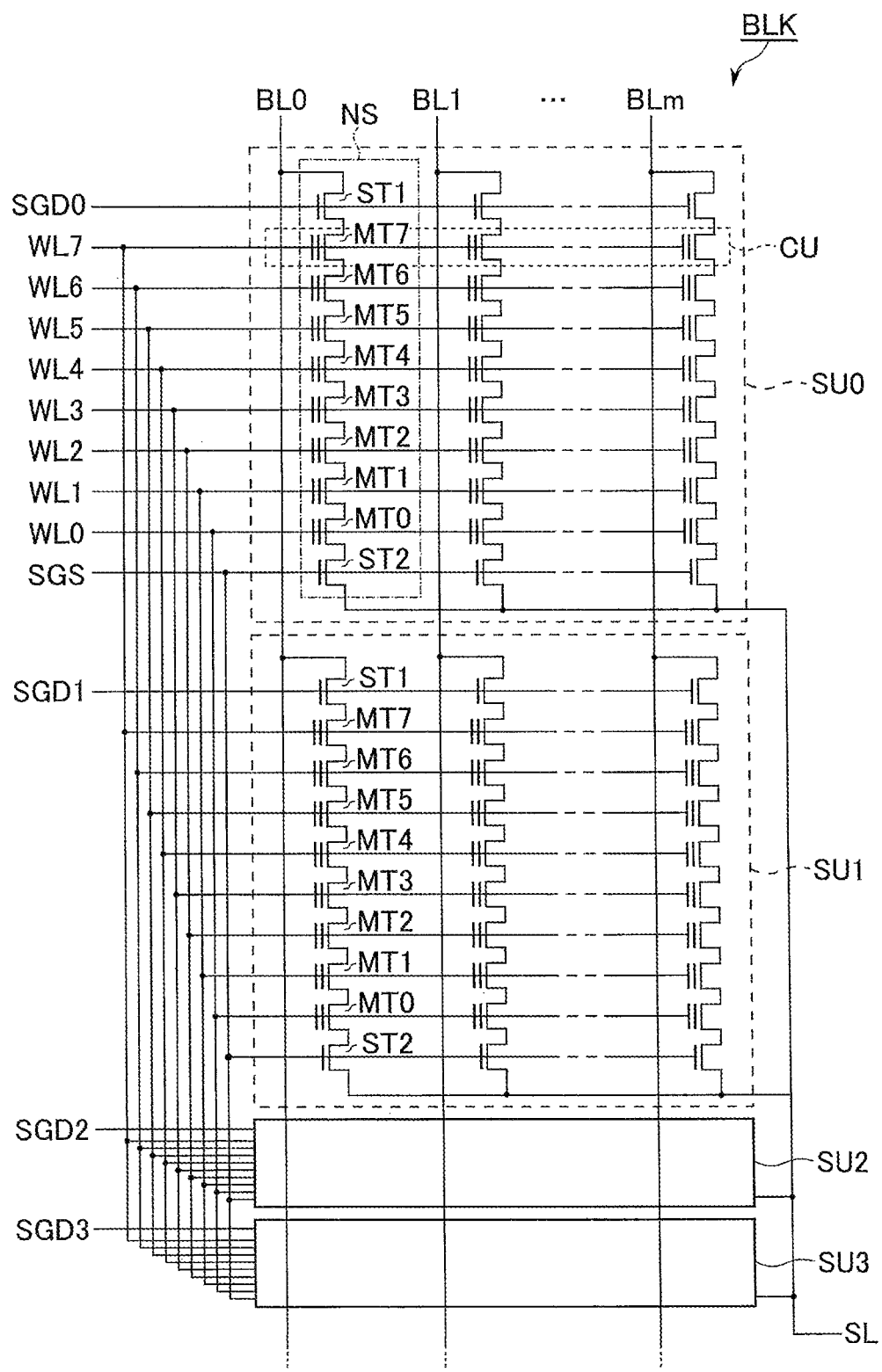
F I G. 9

335

| Type | | Number of probing | Defect flag |
|---|---|---|---|
| Wafer or card | Pad group | | |
| Storage wafer — W1 | PdG1 | 10 | True |
| | PdG2 | 8 | True |
| | PdG3 | 3 | False |
| | ⋮ | ⋮ | ⋮ |
| | PdGn | 0 | False |
| Storage wafer — W2 | PdG1 | 9 | True |
| | PdG2 | 1 | False |
| | PdG3 | 0 | False |
| | ⋮ | ⋮ | ⋮ |
| | PdGn | 0 | False |
| ⋮ | ⋮ | ⋮ | ⋮ |
| Probe card | | 31 | |

F I G. 13

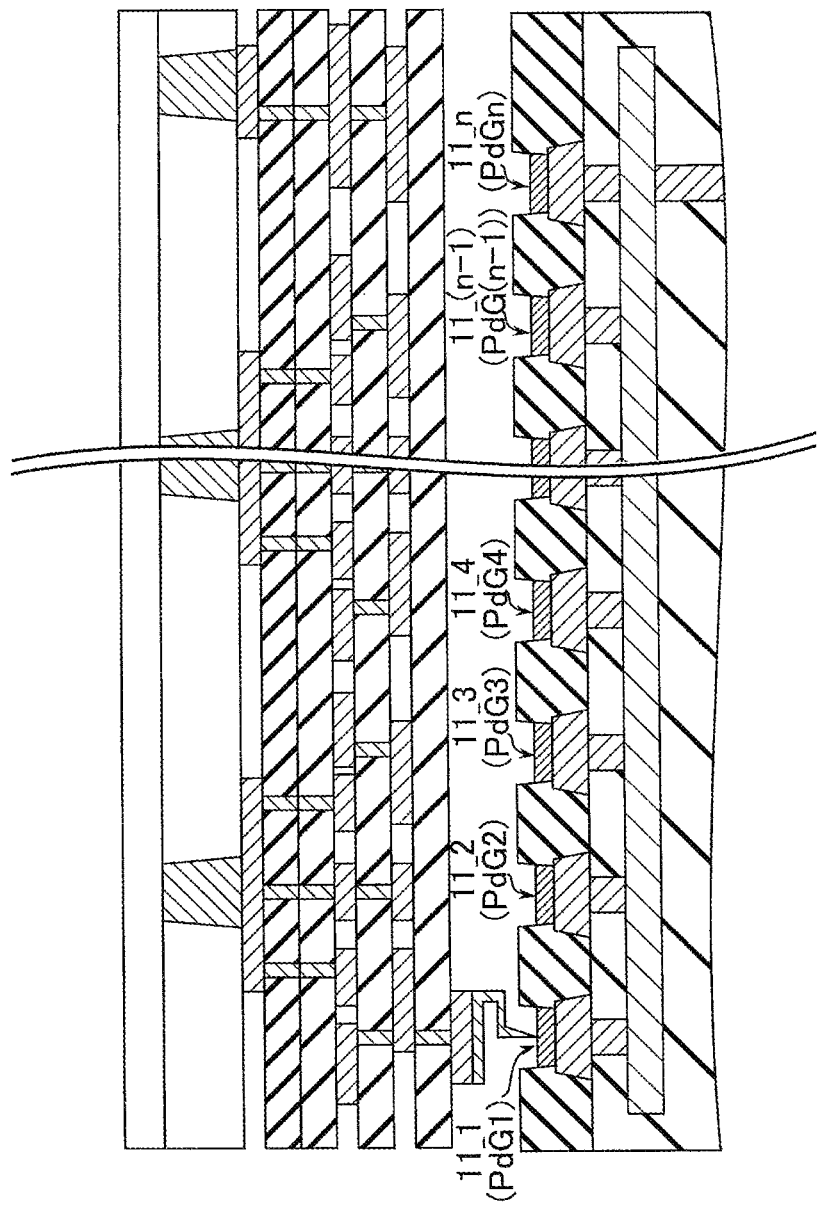
F I G. 18

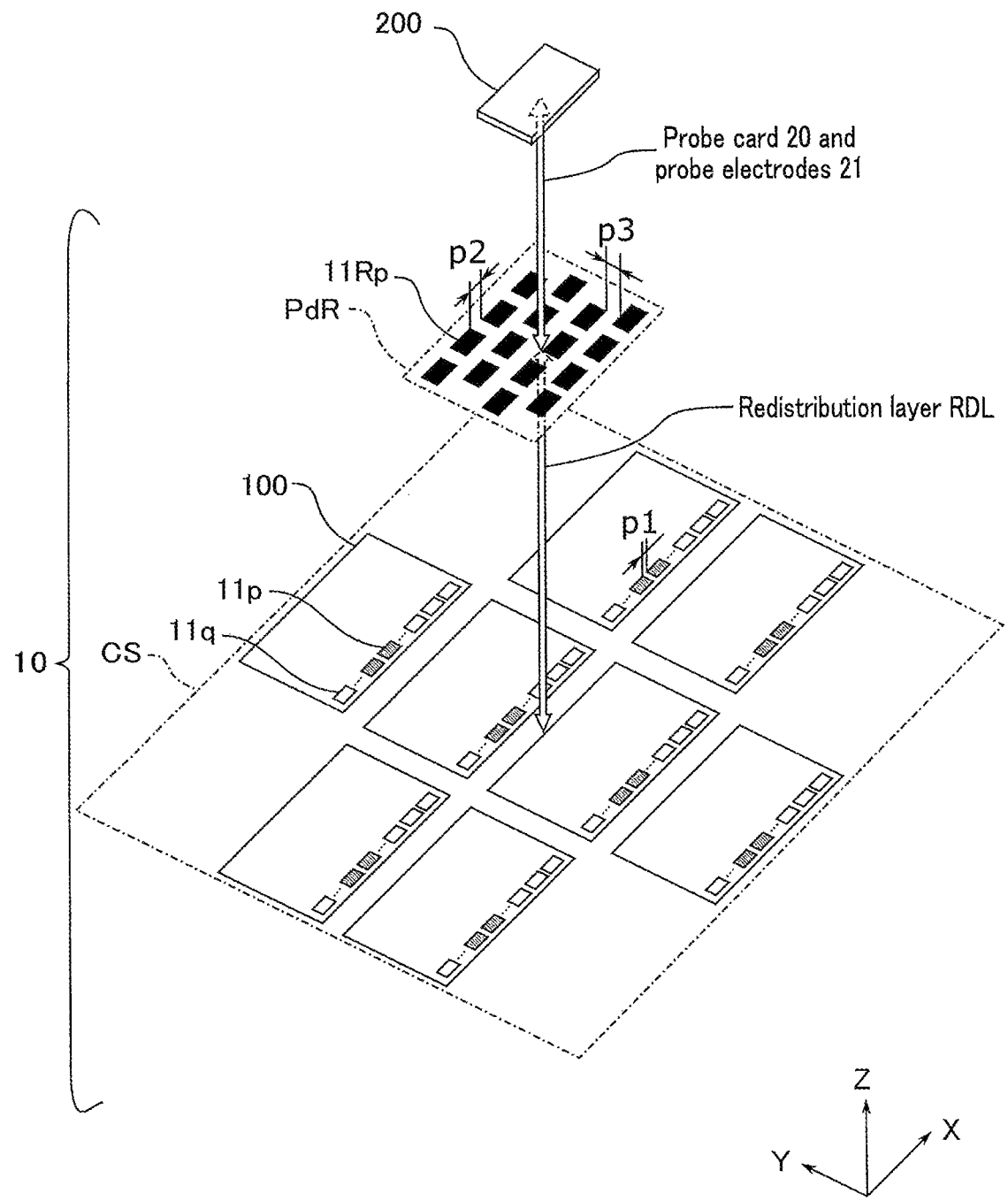
F I G. 30

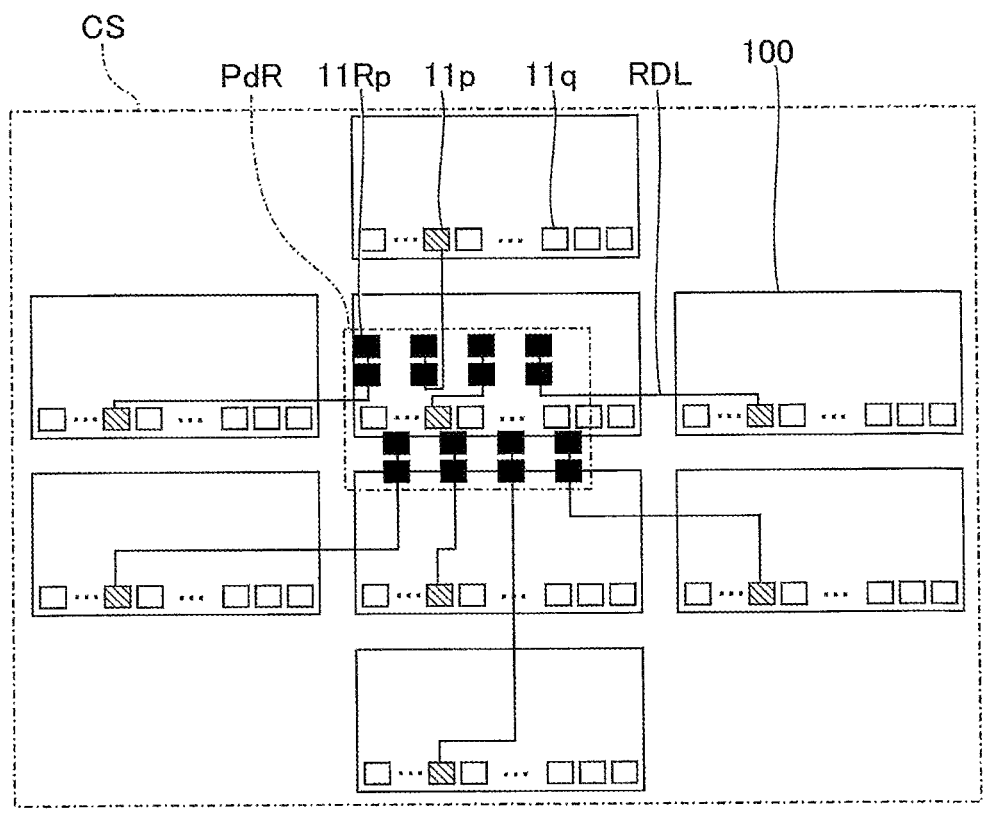
F I G. 34

STORAGE SYSTEM, MEMORY CHIP UNIT, AND WAFER

CROSS-REFERENCE TO RELATED APPLICATIONS

This application is a Continuation Application of PCT Application No. PCT/JP2020/039590, filed Oct. 21, 2020, and based upon and claiming the benefit of priority from PCT Application No. PCT/JP2019/044870, filed Nov. 15, 2019, the entire contents of which are incorporated herein by reference.

FIELD

Embodiments described herein relate generally to a storage system, a memory chip, and a wafer.

BACKGROUND

A wafer provided with a plurality of NAND flash memories as semiconductor memories, and a prober that brings a pad electrode and a probe electrode on the wafer into contact with each other are known.

BRIEF DESCRIPTION OF THE DRAWINGS

FIG. 1 is a block diagram for explaining a configuration of a storage system according to a first embodiment.

FIG. 3 is a top view for explaining a configuration of a probe card according to the first embodiment.

FIG. 9 is a circuit diagram for explaining a configuration of a memory cell array according to the first embodiment.

FIG. 13 is a conceptual diagram of a probe management table in the storage system according to the first embodiment.

FIG. 18 is a schematic diagram for explaining touchdown processing in the storage system according to the first embodiment.

FIG. 30 is a schematic view illustrating a configuration of redistributed pad electrodes according to a third embodiment.

FIG. 34 is a top view illustrating a positional relation between redistributed pad electrodes and pad electrodes before being redistributed according to a second modification of the third embodiment.

DETAILED DESCRIPTION

Figure 2:
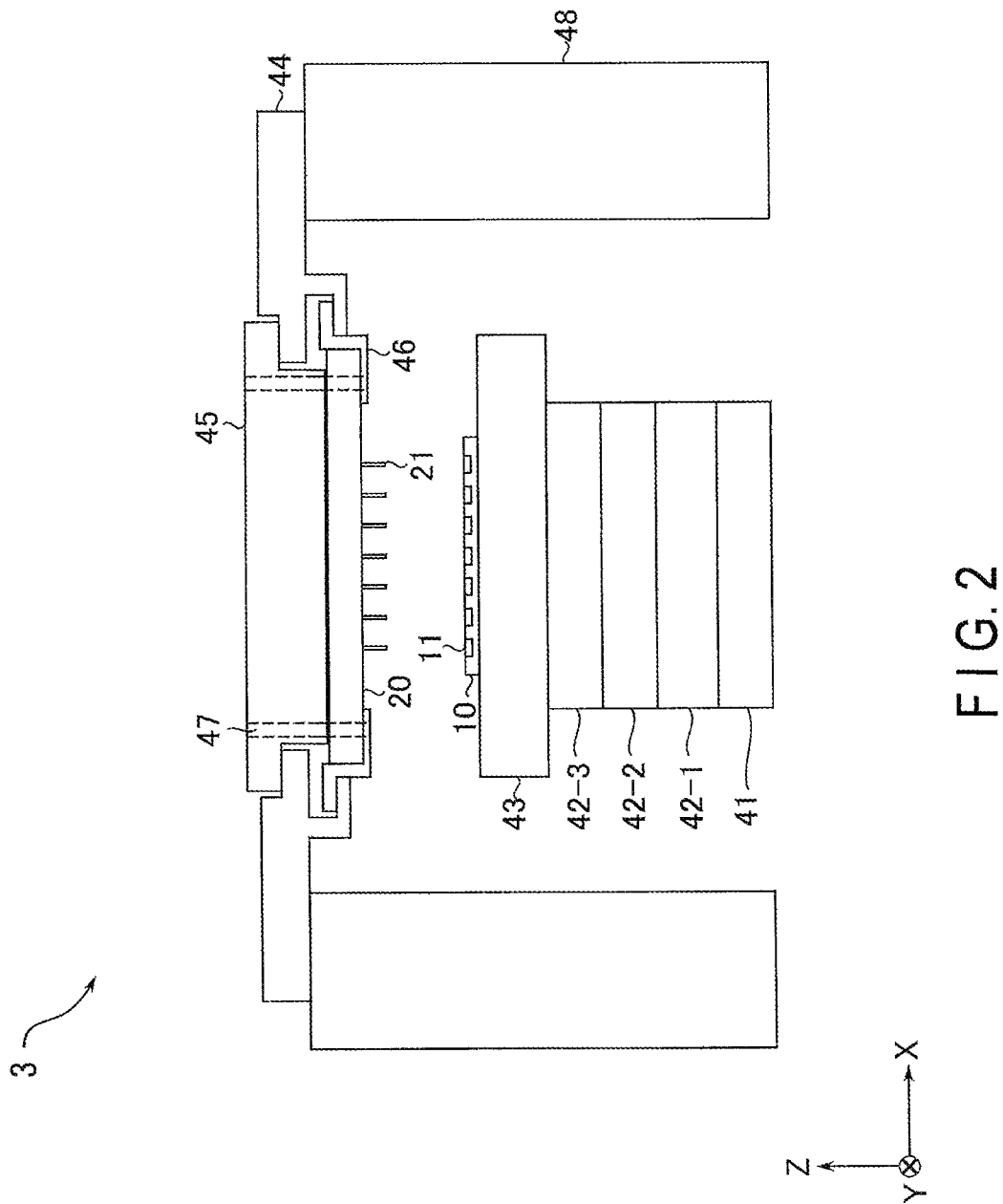
FIG. 2 is a side view for explaining a structure of a prober according to the first embodiment.

In general, according to one embodiment, a storage system includes a first memory chip unit including a first pad electrode including a first portion and a second portion electrically coupled to each other, and a first memory cell array electrically coupled to the first pad electrode; and a prober that is able to hold the first memory chip unit and executes reading and writing on the first memory cell array of the held first memory chip unit. The prober includes a probe card including a first probe electrode that is able to be in contact with the first pad electrode of the held first memory chip unit, and a first memory controller that is able to be electrically coupled to the first probe electrode and execute reading and writing on the first memory cell array via the first probe electrode, and a movement mechanism that moves the probe card or the held first memory chip unit to bring the first pad electrode of the held first memory chip unit into contact with the first probe electrode. The movement mechanism executes a first operation that brings the first probe electrode into contact with the first portion of the first pad electrode and does not bring the first probe electrode into contact with the second portion of the first pad electrode, and a second operation that does not bring the first probe electrode into contact with the first portion of the first pad electrode and brings the first probe electrode into contact with the second portion of the first pad electrode.

Hereinafter, embodiments will be described with reference to the drawings. Note that, in the following description, components having the same function and configuration are denoted by common reference numerals. In addition, in a case where a plurality of components having the common reference numerals are distinguished, the common reference numerals are added with suffixes to be distinguished. Note that, in a case where the plurality of components do not need to be particularly distinguished, only the common reference numerals are attached to the plurality of components, and no suffixes are attached thereto.

1. First Embodiment

A storage system according to a first embodiment will be described. Hereinafter, a storage system including a storage wafer including a plurality of NAND chip units (memory devices as NAND flash memories) and a prober including a probe card on which a plurality of NAND controller chips are mounted and configured to electrically couple the storage wafer and the probe card by physically contacting the storage wafer and the probe card will be described.

1.1 Configuration

A configuration of the storage system according to the first embodiment will be described.

1.1.1 Configuration of Storage System

First, an outline of the configuration of the storage system according to the first embodiment will be described using FIG. 1. As illustrated in FIG. 1, a storage system 1 operates, for example, based on an instruction from a host device 2. The storage system 1 includes a prober 3, a wafer conveyor 4, and a wafer stocker 5.

The prober 3 includes a probe card 20 and a control unit 30, and a storage wafer 10 or a cleaning wafer 10c is placed in the prober 3. The storage wafer 10 is a wafer before dicing or a wafer before dicing on which a redistribution layer is provided, and includes a plurality of NAND flash memories (hereinafter, referred to as "NAND chip units", which are not illustrated in the drawings) provided in units of chips, and a plurality of pad electrodes 11 are provided on a surface of the storage wafer 10. The cleaning wafer 10c is used for cleaning processing for improving degraded electrical characteristics of a plurality of probe electrodes 21 provided in the probe card 20.

The probe card 20 includes the plurality of probe electrodes 21. Each of the plurality of probe electrodes 21 is electrically coupled to each of memory controllers (hereinafter, referred to as "NAND controller chips", which are not illustrated in the drawings) mounted on the probe card 20 and provided in units of chips.

The control unit 30 includes, for example, a temperature control system 31, a drive control system 32, and an interface control system 33, and controls the entire operation of the prober 3.

The temperature control system 31 controls a temperature environment to which the probe card 20 and the storage wafer 10 or the cleaning wafer 10c are exposed in the prober 3. In the present embodiment, for example, the temperature control system 31 performs control such that the temperatures of the probe card 20 and the storage wafer 10 or the cleaning wafer 10c do not change from the predetermined temperatures.

The drive control system 32 has a mechanism capable of three-dimensionally and freely displacing the storage wafer 10 with respect to the probe card 20. In addition, the drive control system 32 has a function of contacting the plurality of pad electrodes 11 on the storage wafer 10 and the plurality of probe electrodes 21 on the corresponding probe card 20 by controlling the mechanism.

The interface control system 33 controls communication between the host device 2 and the probe card 20. In addition, the interface control system 33 controls the temperature control system 31, the drive control system 32, the wafer conveyor 4, and the like based on a control result of the communication.

The wafer conveyor 4 has a function of conveying the storage wafer 10 or the cleaning wafer 10c between the prober 3 and the wafer stocker 5.

The wafer stocker 5 stores a plurality of storage wafers 10 and cleaning wafers 10c that are not placed in the prober 3.

1.1.2 Configuration of Prober

Next, a configuration of the prober of the storage system according to the first embodiment will be described using FIG. 2.

FIG. 2 is a side view schematically illustrating a configuration of the prober 3 in a state where the storage wafer 10 is placed. Hereinafter, a placement surface of the storage wafer 10 with respect to the prober 3 is defined as an XY plane, and a direction perpendicular to the XY plane and directed from the storage wafer 10 toward the probe card 20 is defined as a Z direction (or an upward direction). In addition, a surface of the storage wafer 10 facing the probe card 20 is also referred to as a "front surface" or a "top surface" of the storage wafer 10.

As illustrated in FIG. 2, the prober 3 includes a base 41, a plurality of stages 42 (42-1, 42-2, and 42-3), a wafer chuck 43, a head stage 44, a reinforcing plate (Stiffener) 45, a card holder 46, a fixture 47, and a support 48.

On a top surface of the base 41, the stage 42-1 is provided with an X displacement mechanism (not illustrated in the drawings) interposed therebetween. The stage 42-1 is configured to be freely movable in an X direction with respect to the base 41 by the X displacement mechanism. On a top surface of the stage 42-1, the stage 42-2 is provided with a Y displacement mechanism (not illustrated in the drawings) interposed therebetween. The stage 42-2 is configured to be freely movable in a Y direction with respect to the stage 42-1 by the Y displacement mechanism. On a top surface of the stage 42-2, the stage 42-3 is provided with a Zθ displacement mechanism (not illustrated in the drawings) interposed therebetween. The stage 42-3 is configured to be freely movable in the Z direction and freely rotatable on the XY plane with respect to the stage 42-2 by the Zθ displacement mechanism. The stages 42-1 to 42-3 are parts of a mechanism included in the drive control system 32 and capable of freely displacing the storage wafer 10 with respect to the probe card 20.

The wafer chuck 43 is provided on a top surface of the stage 42-3 and holds the storage wafer 10. In the wafer chuck 43, for example, a temperature sensor, and a heater and a cooler (both of which are not illustrated in the drawings) capable of controlling the temperature of the storage wafer 10 are included. The temperature control system 31 controls the heater and the cooler based on information from the temperature sensor, and controls the temperature of the storage wafer 10 through the wafer chuck 43. The temperature sensor, the heater, and the cooler are included in the temperature control system 31.

The head stage 44 has, for example, a ring shape and is supported above the wafer chuck 43 by the support 48. In a space inside the ring of the head stage 44, the reinforcing plate 45 and the card holder 46 each having a ring shape are provided so as to be supported by the head stage 44. The reinforcing plate 45 is provided on the probe card 20, and sandwiches the probe card 20 between the reinforcing plate 45 and the card holder 46. The card holder 46 supports the probe card 20 in a space inside the ring of the card holder 46. The probe card 20 is fixed to the reinforcing plate 45 and the card holder 46 by the fixture 47, so that a position of the probe card 20 with respect to the wafer chuck 43 (and the storage wafer 10 on the wafer chuck 43) is fixed, and displacement caused by thermal expansion or the like is suppressed.

Note that the head stage 44 may be provided with a camera (not illustrated in the drawings) for detecting a representative position (for example, an outer edge of the wafer, an alignment mark provided on the wafer, and the like) on the storage wafer 10 (or the cleaning wafer 10c). The drive control system 32 can more accurately recognize a reference position based on information from the camera, and can perform precise alignment.

FIG. 3 is a top view of the probe card 20 fixed in the prober 3.

As illustrated in FIG. 3, an outer peripheral portion of the probe card 20 is fixed by the ring-shaped reinforcing plate 45, and a plurality of NAND controller chips 200 are provided in a center portion of the probe card 20. Note that, in the storage system 1 according to the present embodiment, the temperature in the prober 3 is maintained at a substantially constant temperature by the temperature control system 31 without a large temperature change. As a result, an amount of displacement caused by the thermal expansion or the like of the probe card 20 is suppressed to a small amount. Therefore, in the reinforcing plate 45, it is sufficient to fix the outer peripheral portion of the probe card 20 to cope with the displacement, and a configuration to fix the center portion of the probe card 20 can be omitted. As a result, more chips can be mounted on the probe card 20.

Figure 4:
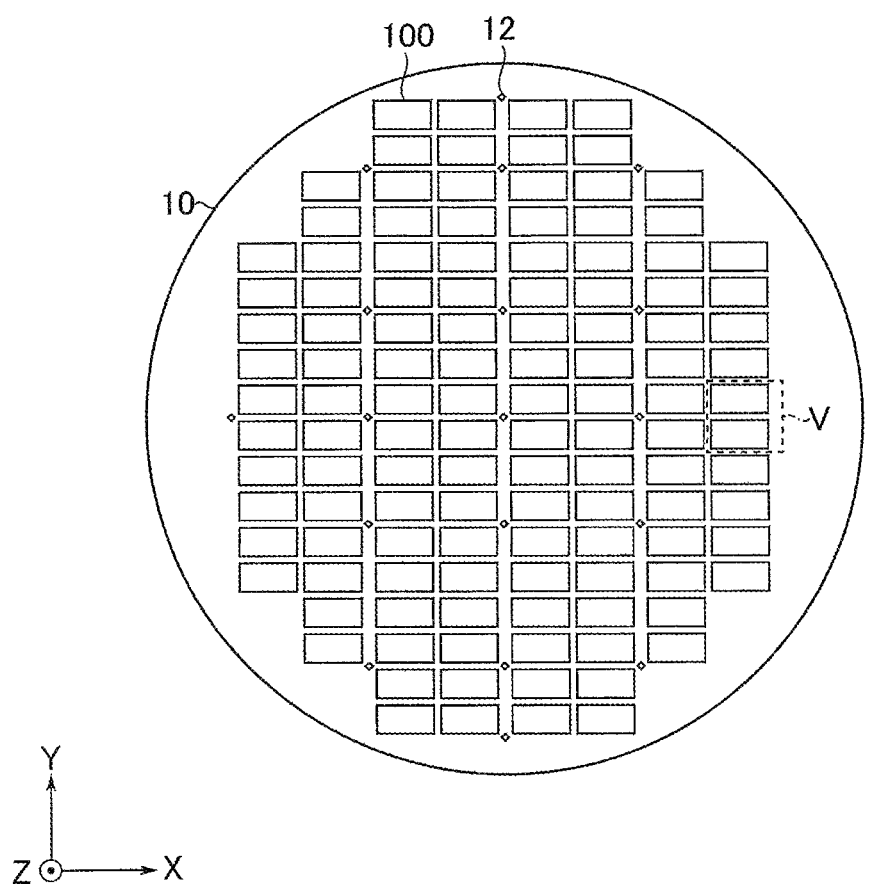
FIG. 4 is a top view for explaining a configuration of a storage wafer according to the first embodiment.
Figure 5:
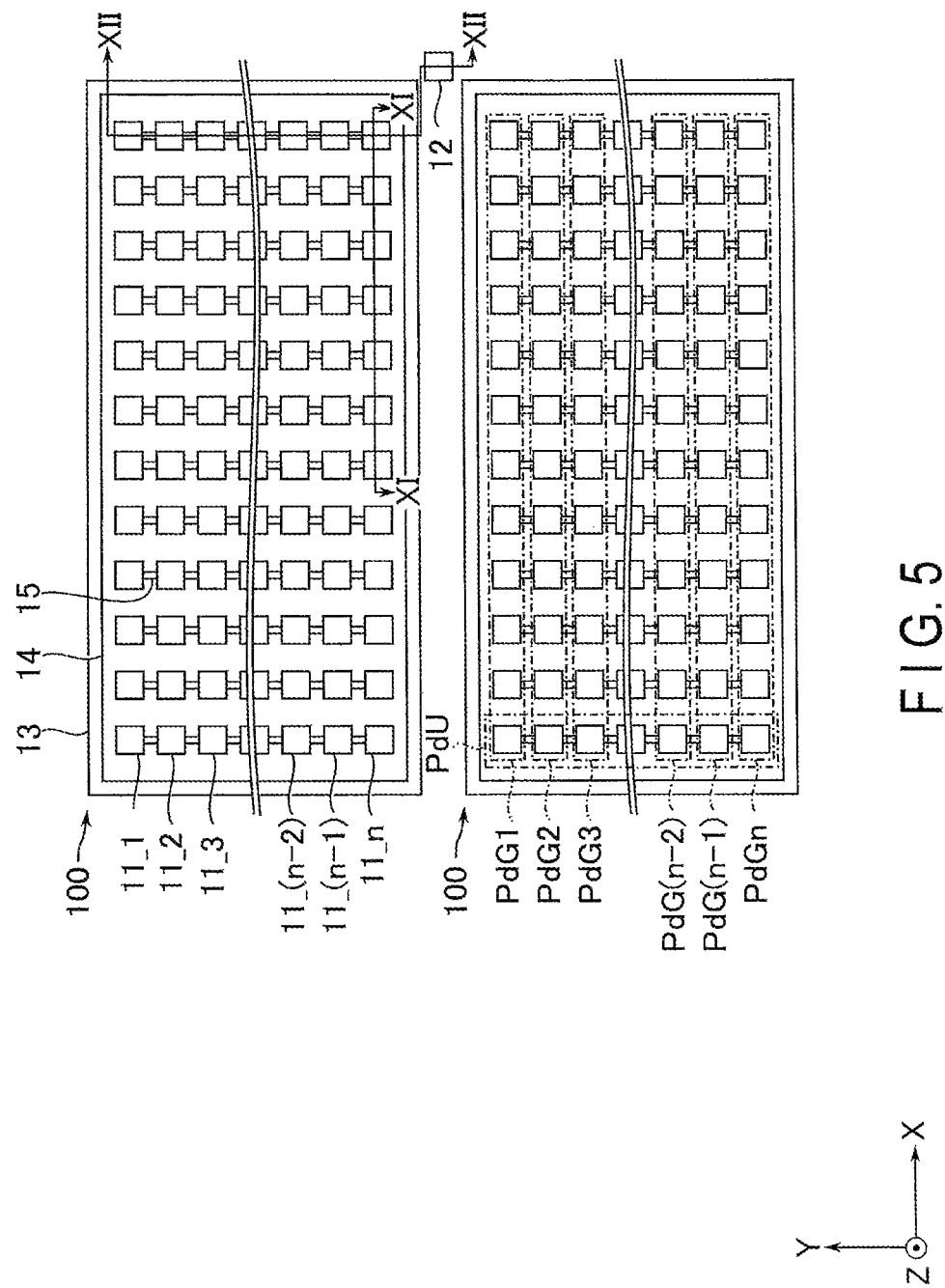
FIG. 5 is a top view of a NAND chip unit illustrating a region V in FIG. 4.

FIG. 4 is a top view of the storage wafer 10 held by the wafer chuck 43, and FIG. 5 is an enlarged view of a region V in FIG. 4.

As illustrated in FIG. 4, the storage wafer 10 is provided with a plurality of NAND chip units 100. In addition, a plurality of alignment marks 12 are provided between the NAND chip units 100. The NAND chip unit 100 is a minimum unit memory device that can be controlled based on a control signal from the NAND controller chip 200.

As illustrated in FIG. 5, a rectangular dicing line 13 is provided on the storage wafer 10 so as to surround the NAND chip unit 100, and the alignment mark 12 is provided outside the dicing line 13. The dicing line 13 is a region through which a blade passes when the storage wafer 10 is separated for each NAND chip unit 100 by dicing processing. Note that, in the present embodiment, the dicing processing is not executed along the dicing line 13. However, since the storage wafer 10 according to the present embodiment can be manufactured by a part of the manufacturing process of the memory device manufactured from the NAND chip unit 100 cut out in units of chips, a configuration substantially unnecessary in the present embodiment, such as the dicing line 13, can be provided.

A rectangular edge seal 14 is provided inside the dicing line 13, and a circuit constituting the NAND chip unit 100 is provided inside the edge seal 14.

Inside the edge seal 14, a plurality of pad electrodes 11 are provided in a matrix on a top surface of the storage wafer 10. More specifically, n pad electrodes $11\_1, 11\_2, 11\_3, \ldots, 11\_(n-2), 11\_(n-1)$, and $11\_n$ electrically coupled by an interconnect 15 are provided along a −Y direction in this order (n is an integer of 2 or more). The n pad electrodes $11\_1$ to $11\_n$ correspond to one pad unit PdU. A plurality of pad units PdU electrically noncoupled from each other are provided along the X direction. A set of pad electrodes $11\_i$ ($1 \leq i \leq n$) arranged along the X direction and independent from each other corresponds to one pad group PdGi. That is, n pad groups PdG1 to PdGn having equivalent functions are provided on a top surface of one NAND chip unit 100.

1.1.3 Communication Function Configuration of Prober and Storage Wafer

Figure 6:
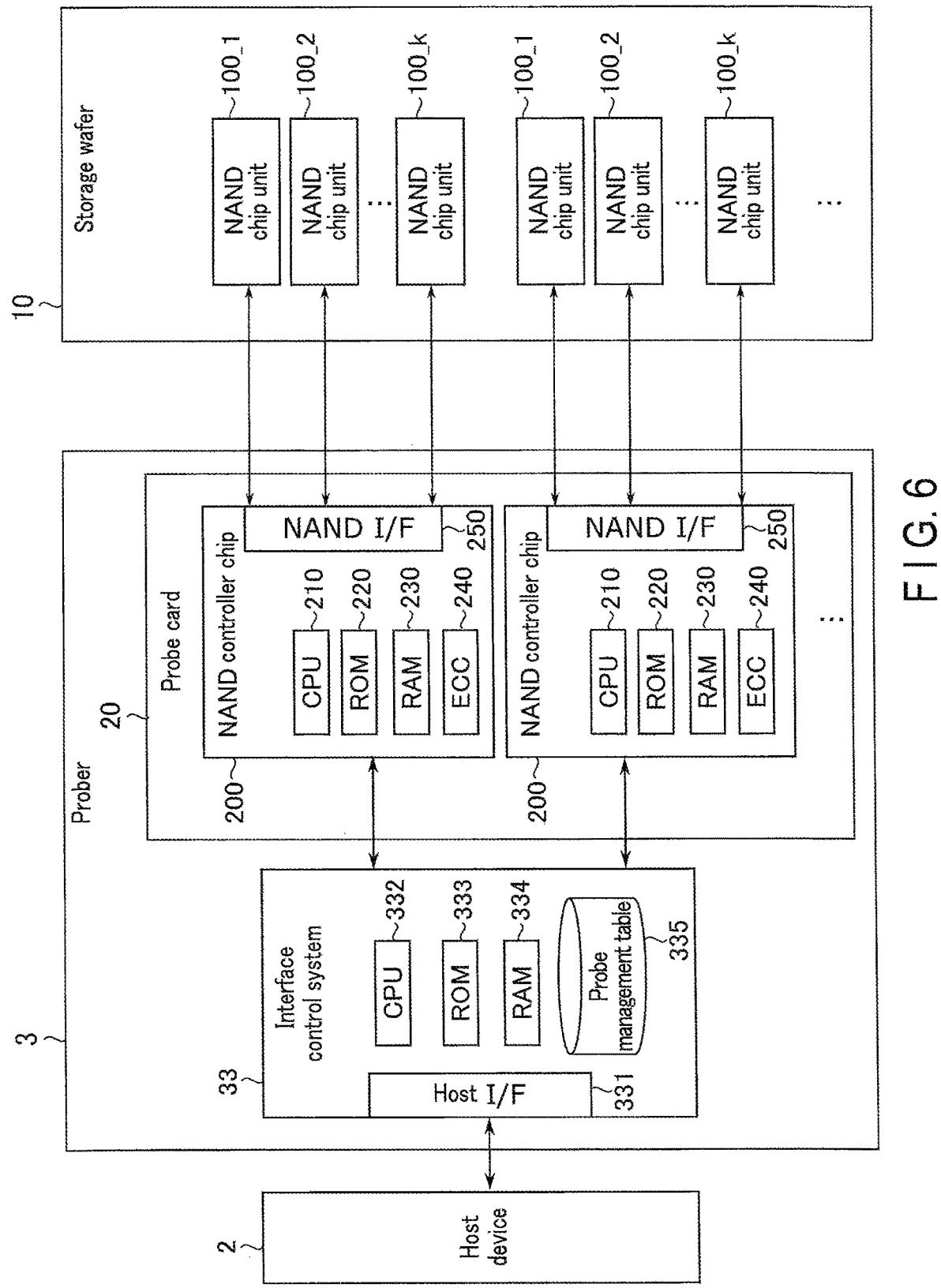
FIG. 6 is a block diagram for explaining coupling between the prober and the storage wafer according to the first embodiment.

Next, a configuration of a communication function between the prober and the storage wafer according to the first embodiment will be described using a block diagram illustrated in FIG. 6. FIG. 6 illustrates an example of a coupling relation when the probe card 20 and the NAND chip units 100 come into contact with each other and are electrically coupled to each other by the drive control system 32.

As illustrated in FIG. 6, the interface control system 33 is coupled to the host device 2 by a host bus. The host device 2 is, for example, a personal computer or the like, and the host bus is, for example, a bus conforming to PCIe (PCI EXPRESS (trademark) (Peripheral component interconnect express)).

The interface control system 33 includes, for example, a host interface circuit 331, a central processing unit (CPU) 332, a read only memory (ROM) 333, and a random access memory (RAM) 334. Note that a function of each of the units 331 to 334 of the interface control system 33 described below can be realized by either a hardware configuration or a combination configuration of hardware resources and firmware.

The host interface circuit 331 is coupled to the host device 2 via a host bus, and transfers a command and data received from the host device 2 to one of the plurality of NAND controller chips 200 according to an instruction from the CPU 332. In response to a command from the CPU 332, data from the NAND controller chip 200 is transferred to the host device 2.

The CPU 332 mainly controls an interface related to data transmission in the prober 3. For example, when a write command is received from the host device 2, the CPU 332 determines a NAND controller chip 200 to control write processing in response to the write command, and transfers write data DAT to the determined NAND controller chip 200. This is similarly applied to read processing and erasing processing. Further, the CPU 332 executes various controls on the other control systems (the temperature control system 31 and the drive control system 32) in the prober 3.

The ROM 333 stores firmware for controlling the temperature control system 31, the drive control system 32, and the plurality of NAND controller chips 200.

The RAM 334 is, for example, a dynamic random access memory (DRAM), and temporarily stores write data DAT and read data DAT. Further, the RAM 334 is used as a work area of the CPU 332, and stores various management tables and the like. Examples of the management table include a probe management table 335 that manages information on how many times the probe electrode 21 has been attached to and detached from the pad electrode 11 on the storage wafer 10. Details of the probe management table 335 will be described later.

Each of the plurality of NAND controller chips 200 on the probe card 20 is electrically coupled to a set of the plurality of NAND chip units 100 in the storage wafer 10.

In the example of FIG. 6, k NAND chip units 100_1, 100_2, . . . , and 100_k are coupled in parallel to one NAND controller chip 200. The plurality of NAND controller chips 200 each coupled to the k NAND chip units 100_1 to 100_k control the k NAND chip units 100_1 to 100_k in parallel based on an instruction from the interface control system 33.

The NAND controller chip 200 is, for example, a system-on-a-chip (SoC) having a field programmable gate array (FPGA) function, and includes a CPU 210, a ROM 220, a RAM 230, an ECC circuit 240, and a NAND interface circuit 250. Note that a function of each of the units 210 to 250 of the NAND controller chip 200 described below can be realized by either a hardware configuration or a combination configuration of hardware resources and firmware.

The CPU 210 controls the entire operation of the NAND controller chip 200. For example, when a write command is received from the host device 2 via the interface control system 33, the CPU 210 issues a write command to the NAND interface circuit 250 in response to the write command. This is similarly applied to read processing and erasing processing. Further, the CPU 210 executes various processing for controlling the NAND chip unit 100.

The ROM 220 stores firmware and the like for controlling the NAND chip unit 100.

The RAM 230 is, for example, a DRAM, and temporarily stores write data and read data DAT. Further, the RAM 230 is used as a work area of the CPU 210, and stores various management tables and the like.

The ECC circuit 240 performs error detection and error correction processing on data stored in the NAND chip units 100. That is, the ECC circuit 240 generates an error correction code and gives the error correction code to the write data DAT, at the time of data write processing, and decodes the error correction code and detects the presence or absence of an error bit, at the time of data read processing. When the error bit is detected, a position of the error bit is specified, and an error is corrected. Error correction methods include, for example, hard-decision decoding (Hard bit decoding) and soft-decision decoding (Soft bit decoding). As a hard-decision decoding code used for the hard-decision decoding, for example, a Bose-Chaudhuri-Hocquenghem (BCH) code, a Reed-Solomon (RS) code, or the like can be used, and as a soft-decision decoding code used for the soft-decision decoding, for example, a Low Density Parity Check (LDPC) code or the like can be used.

The NAND interface circuit 250 is coupled to the NAND chip units 100 via a NAND bus and manages communication with the NAND chip units 100. In addition, various signals are output to the NAND chip units 100 based on a command received from the CPU 210. Further, during the write processing, the write command issued by the CPU 210 and the write data DAT in the RAM 230 are transferred to a NAND chip unit 100 as input/output signals. Furthermore, during the read processing, the read command issued by the CPU 210 is transferred to a NAND chip unit 100 as an input/output signal, and the data DAT read from the NAND chip unit 100 is received as an input/output signal and transferred to the RAM 230.

With the above configuration, all the NAND chip units 100 provided in the storage wafer 10 can be controlled in parallel.

1.1.4 Configuration of NAND Chip Unit

Next, a configuration of the NAND chip unit according to the first embodiment will be described.

Figure 7:
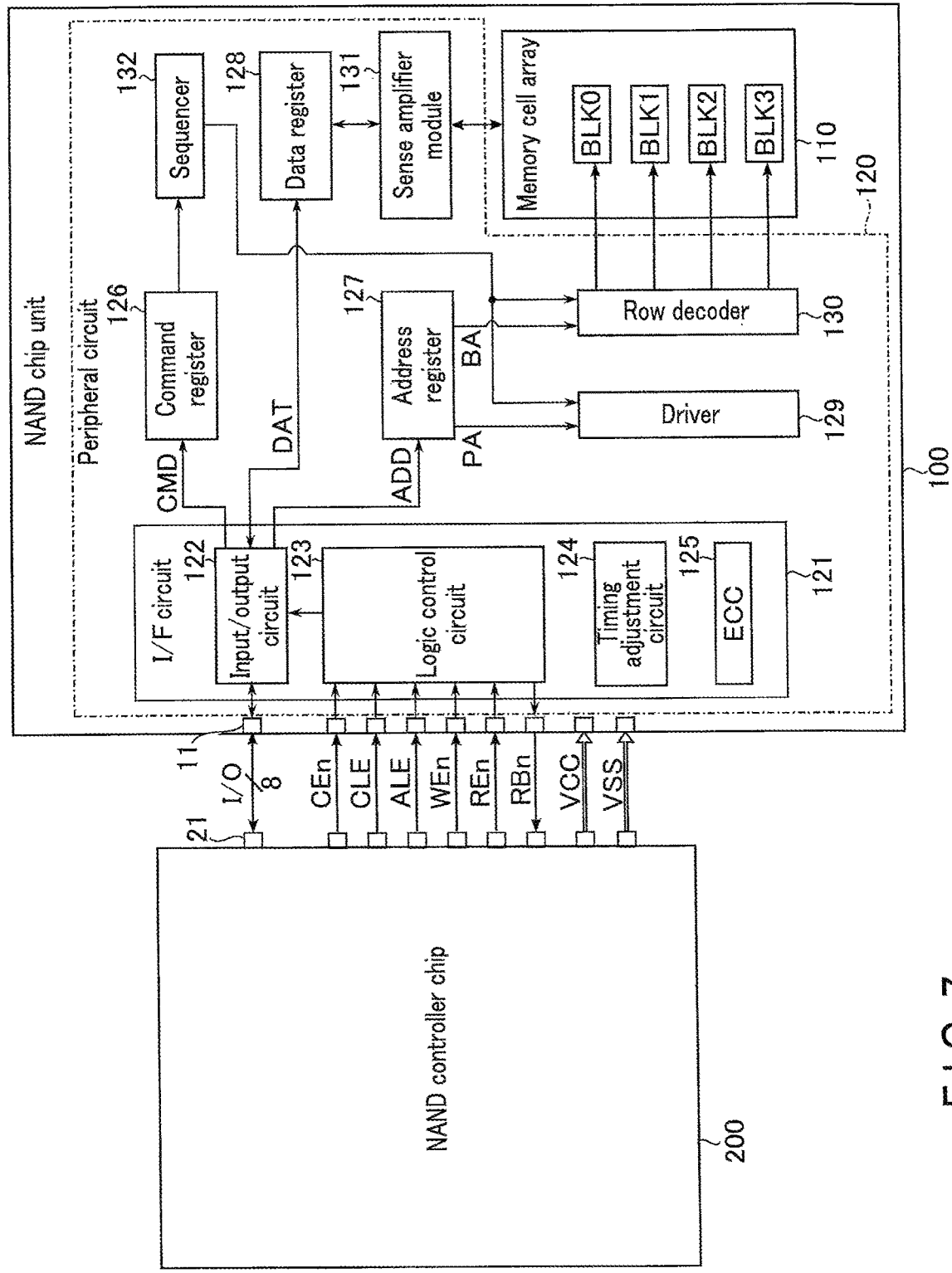
FIG. 7 is a block diagram for explaining a configuration of a NAND chip unit according to the first embodiment.

FIG. 7 is a block diagram illustrating a functional configuration of the NAND chip unit according to the first embodiment. FIG. 7 illustrates details of a coupling relation between one NAND controller chip 200 and one NAND chip unit 100 in FIG. 6.

As illustrated in FIG. 7, the NAND chip unit 100 is coupled to the NAND controller chip 200 in the probe card 20 by a NAND bus. The NAND bus is a transmission path that transmits and receives signals according to a NAND interface, and includes probe electrodes 21 and pad electrodes 11.

Specific examples of the signal of the NAND interface are a chip enable signal CEn, a command latch enable signal CLE, an address latch enable signal ALE, a write enable signal WEn, a read enable signal REn, a ready/busy signal RBn, and an input/output signal I/O. Note that, in the following description, in a case where "n" is added as a suffix to a signal name, the signal is negative logic. That is, this indicates that the signal is a signal asserted at a "low (L)" level.

The signal CEn is a signal for enabling the NAND chip unit 100 and is asserted at the "L" level. The signals CLE and ALE are signals for notifying the NAND chip unit 100 that the input signals I/O to the NAND chip unit 100 are a command CMD and an address ADD, respectively. The signal WEn is asserted at the "L" level and is a signal for causing the NAND chip unit 100 to take the input signal I/O. The signal REn is also asserted at the "L" level and is a signal for reading the output signal I/O from the NAND chip unit 100. The ready/busy signal RBn is a signal indicating whether the NAND chip unit 100 is in a ready state (for example, a state in which a command from the NAND controller chip 200 can be received) or a busy state (for example, a state in which the command from the NAND controller chip 200 cannot be received), and the "L" level indicates the busy state. The input/output signal I/O is, for example, an 8-bit signal. In addition, the input/output signal I/O is an entity of data transmitted and received between the NAND chip unit 100 and the NAND controller chip 200, and is a command CMD, an address ADD, and data DAT such as write data and read data.

Further, the NAND chip unit 100 is supplied with voltages VCC and VSS from the NAND controller chip 200 via the coupling between the probe electrodes 21 and the pad electrodes 11, for example. The voltages VCC and VSS are a power supply voltage and a ground voltage in the NAND chip unit 100, respectively.

The NAND chip unit 100 includes a memory cell array 110 and a peripheral circuit 120.

The memory cell array 110 includes a plurality of blocks BLK each including a plurality of nonvolatile memory cells associated with a row and a column. The block BLK is, for example, a data erasing unit, and four blocks BLK0 to BLK3 are illustrated in FIG. 7 as an example. In addition, the memory cell array 110 stores data given from the NAND controller chip 200.

The peripheral circuit 120 includes an I/F circuit 121, a command register 126, an address register 127, a data register 128, a driver 129, a row decoder 130, a sense amplifier module 131, and a sequencer 132.

The I/F circuit 121 is a circuit group that mainly manages an interface between the pad electrodes 11 and the other portions in the peripheral circuit 120 in the NAND chip unit 100, and includes an input/output circuit 122, a logic control circuit 123, a timing adjustment circuit 124, and an ECC circuit 125.

The input/output circuit 122 transmits and receives the signal I/O to and from the NAND controller chip 200. When the signal I/O is received from the NAND controller chip 200, the input/output circuit 122 distributes the signal I/O to the command CMD, the address ADD, and the data DAT based on information from the logic control circuit 123. The input/output circuit 122 transfers the command CMD to the command register 126 and transfers the address ADD to the address register 127. Further, the input/output circuit 122 transmits and receives the write data and read data DAT to and from the data register 128.

The logic control circuit 123 receives the signals CEn, CLE, ALE, WEn, and REn from the NAND controller chip 200, and sends information for identifying the command CMD, the address ADD, and the data DAT in the signal I/O to the input/output circuit 122. Further, the logic control circuit 123 transfers the signal RBn to the NAND controller chip 200 and notifies the NAND controller chip 200 of a state of the NAND chip unit 100.

The timing adjustment circuit 124 is, for example, a latch circuit, and is provided between the pad electrodes 11 and the input/output circuit 122 and the logic control circuit 123 to adjust timing of various signals.

The ECC circuit 125 is provided, for example, between the input/output circuit 122 and the command register 126, the address register 127, and the data register 128, and performs error detection and error correction processing on data stored in the NAND chip unit 100. The ECC circuit 125 has a configuration equivalent to that of the ECC circuit 240 and is configured to be able to decode data encoded by the ECC circuit 240. That is, at the time of the data write processing, the write data DAT to which the error correction code has been given by the ECC circuit 240 is decoded, and the presence or absence of the error bit is detected. Then, when the error bit is detected, the position of the error bit is specified, and the error is corrected. In addition, at the time of the data read processing, the read data DAT to which the error correction code has been given by the ECC circuit 240 is decoded, and the presence or absence of the error bit is detected. Then, when the error bit is detected, the position of the error bit is specified, the error is corrected, and the read data DAT is encoded again and transmitted to the NAND controller chip 200.

The command register 126 holds the command CMD received from the NAND controller chip 200. The address register 127 holds the address ADD received from the NAND controller chip 200. The address ADD includes a block address BA and a page address PA. The data register 128 holds write data DAT received from the NAND controller chip 200 or read data DAT received from the sense amplifier module 131.

The driver 129 supplies voltages to the row decoder 130 based on the page address PA in the address register 127 for the selected block BLK.

The row decoder 130 selects one of the blocks BLK0 to BLK3 based on the block address BA in the address register 127, and selects a word line in the selected block BLK.

At the time of reading data, the sense amplifier module 131 reads data by sensing a threshold voltage of a memory cell transistor in the memory cell array 110. Then, the read data DAT is output to the NAND controller chip 200 via the data register 128. At the time of writing data, the write data DAT received from the NAND controller chip 200 via the data register 128 is transferred to the memory cell array 110.

The sequencer 132 controls the entire operation of the NAND chip unit 100 based on the command CMD held in the command register 126.

Figure 8:
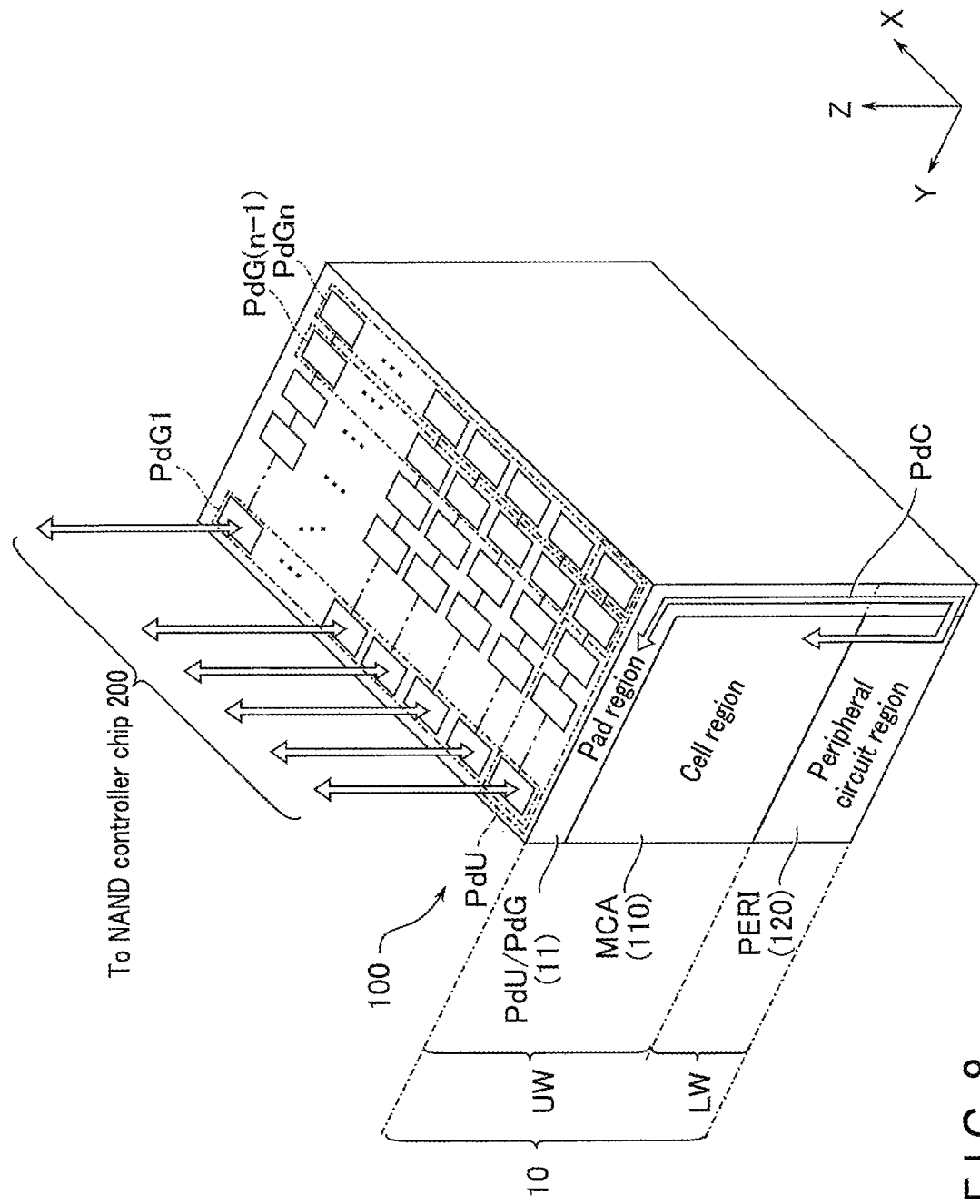
FIG. 8 is a schematic diagram for explaining the configuration of the NAND chip unit according to the first embodiment.

FIG. 8 is a perspective view illustrating an example of a three-dimensional positional relation of various components in the NAND chip unit 100 in the storage wafer 10. In FIG. 8, the arrangement of the components of the NAND chip unit 100 along the Z direction is schematically illustrated.

As illustrated in FIG. 8, the storage wafer 10 includes, for example, a wafer LW on which the peripheral circuit 120 is formed and a wafer UW on which the memory cell array 110 and the plurality of pad electrodes 11 are formed. The two wafers LW and UW are formed by bonding a surface of the wafer LW on which the peripheral circuit 120 has been formed (a surface opposite to a surface on which the wafer LW is exposed) and a surface of the wafer UW on which the memory cell array 110 and the plurality of pad electrodes 11 have been formed (a surface opposite to a surface on which the wafer UW is exposed). Therefore, the NAND chip unit 100 has a configuration in which a peripheral circuit region PERI corresponding to the peripheral circuit 120, a cell region MCA corresponding to the memory cell array 110, and a pad region PdU/PdG corresponding to the plurality of pad electrodes 11 are stacked along the Z direction. At the end of the NAND chip unit 100, a pad contact region PdC that electrically couples the pad region PdU/PdG and the peripheral circuit region PERI and extends along the Z direction is further provided. With the above configuration, signals received from the NAND controller chip 200 using one of the pad groups PdG1 to PdGn can be transferred to the peripheral circuit region PERI via the pad contact region PdC. The peripheral circuit region PERI can transfer signals to the cell region MCA based on the transferred signal.

1.1.5 Configuration of Memory Cell Array

Next, a configuration of the memory cell array 110 will be described.

FIG. 9 is a circuit diagram of a block BLK of the memory cell array 110.

As illustrated in FIG. 9, the block BLK includes, for example, four string units SU (SU0 to SU3). In addition, each string unit SU includes a plurality of NAND strings NS. The number of blocks in the memory cell array 110 and the number of string units in the block BLK are arbitrary.

Each of the NAND strings NS includes, for example, eight memory cell transistors MT (MT0 to MT7) and selection transistors ST1 and ST2. The memory cell transistor MT includes a control gate and a charge storage film, and stores data in a nonvolatile manner. In addition, the memory cell transistor MT is coupled in series between a source of the selection transistor ST1 and a drain of the selection transistor ST2.

Gates of the selection transistors ST1 included in the plurality of NAND strings NS of each of the string units SU0 to SU3 are coupled to selection gate lines SGD0 to SGD3, respectively. On the other hand, gates of the selection transistors ST2 included in the plurality of NAND strings NS of each of the string units SU0 to SU3 are commonly coupled to, for example, a selection gate line SGS. Alternatively, the gates of the selection transistors ST2 included in the plurality of NAND strings NS of each of the string units SU0 to SU3 may be coupled to the selection gate lines SGS0 to SGS3 different for each string unit. Further, control gates of the memory cell transistors MT0 to MT7 included in the plurality of NAND strings NS in the same block BLK are commonly coupled to word lines WL0 to WL7, respectively.

Further, drains of the selection transistors ST1 of the NAND strings NS in the same column included in the plurality of blocks BLK in the memory cell array 110 are commonly coupled to bit lines BL (BL0 to BLm, where m is a natural number of 2 or more). That is, the bit lines BL commonly couple the NAND strings NS in the same column among the plurality of blocks BLK. Further, sources of the plurality of selection transistors ST2 are commonly coupled to a source line SL.

That is, the string unit SU is an aggregate of the NAND strings NS coupled to the different bit lines BL and coupled to the same selection gate line SGD. In the string unit SU, an aggregate of the memory cell transistors MT commonly coupled to the same word line WL is also referred to as a cell unit CU (or a memory cell group). Further, the block BLK is an aggregate of a plurality of string units SU sharing the word lines WL. Further, the memory cell array 110 is an aggregate of a plurality of blocks BLK sharing the bit lines BL.

Figure 10:
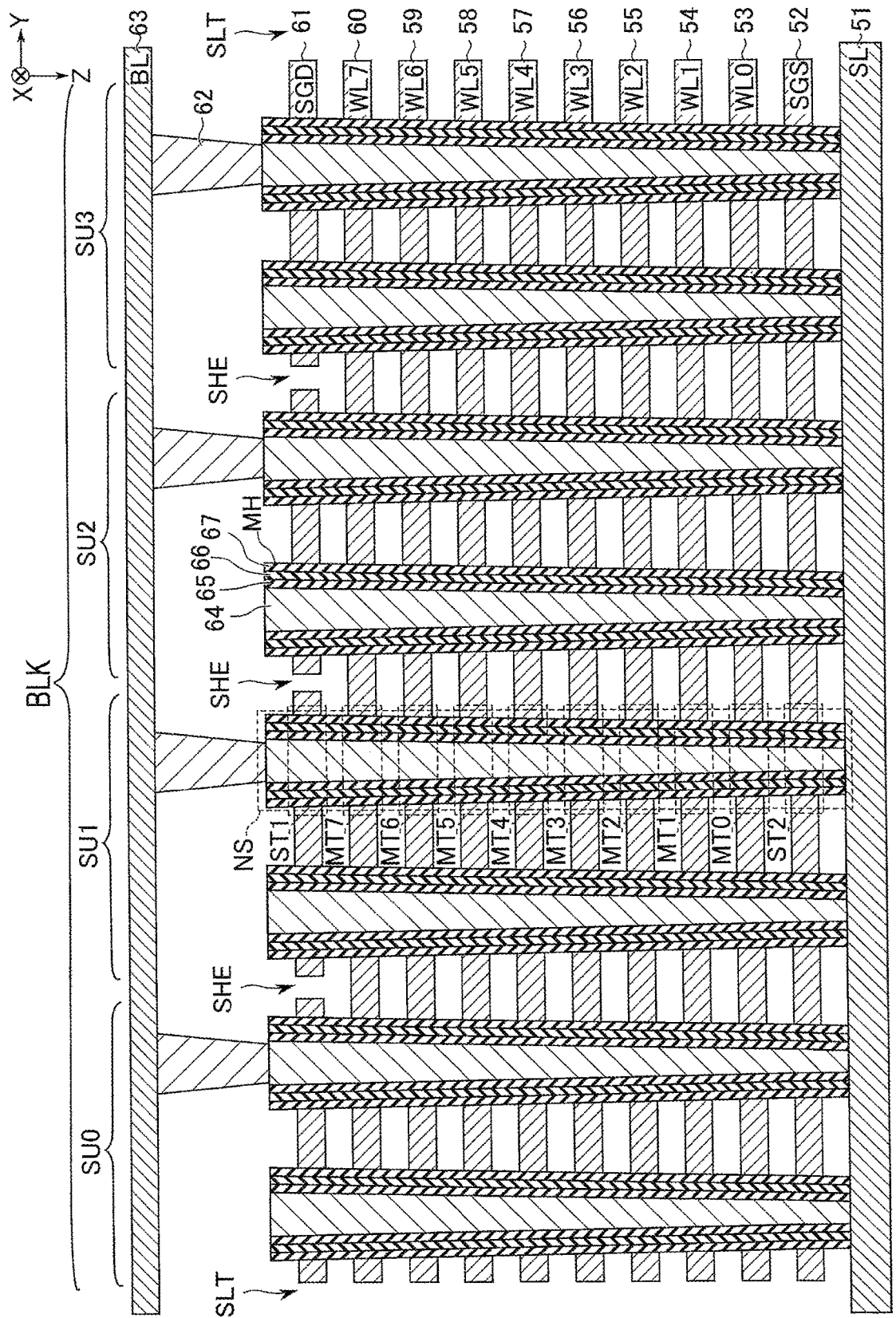
FIG. 10 is a cross-sectional view for explaining the configuration of the memory cell array according to the first embodiment.

FIG. 10 is a cross-sectional view of the block BLK, and illustrates eight NAND strings NS arranged along the Y direction. Among the eight NAND strings NS, four sets each including two NAND strings NS arranged along the Y direction correspond to the string units SU0, SU1, SU2, and SU3. Note that, as described above, since the memory cell array 110 is formed on the wafer UW and then bonded to the wafer LW, the upper side (-Z direction) in the drawing is referred to as "above" only in the description of FIG. 10.

As illustrated in FIG. 10, a plurality of NAND strings NS are formed above a conductor 51 functioning as the source line SL. That is, a conductor 52 functioning as the selection gate line SGS, eight layers of conductors 53 to 60 functioning as the word lines WL0 to WL7, and a conductor 61 functioning as the selection gate line SGD are sequentially stacked above the conductor 51. An insulator not illustrated in the drawings is formed between the stacked conductors. The conductors 52 to 61 are divided by an insulator SLT not illustrated in the drawings between the blocks BLK. In addition, the conductor 61 is divided by an insulator SHE not illustrated in the drawings between the string units SU. As described above, the conductor 61 is shorter than the conductors 52 to 60 along the Y direction.

A pillar-shaped conductor 64 that passes through these conductors 61 to 52 and reaches the conductor 51 is formed. A tunnel insulating film 65, a charge storage film 66, and a block insulating film 67 are sequentially formed on a side surface of the conductor 64, so that the memory cell transistor MT and the selection transistors ST1 and ST2 are formed. The conductor 64 includes, for example, polysilicon, functions as a current path of the NAND string NS, and is a region where a channel of each transistor is formed. The tunnel insulating film 65 and the block insulating film 67 include, for example, silicon oxide ($SiO_2$), and the charge storage film 66 includes, for example, silicon nitride (SiN). In addition, a conductor 63 functioning as the bit line BL is provided above the conductor 64. The conductor 64 and the conductor 63 are electrically coupled via, for example, a conductor 62 functioning as a contact plug. In the example of FIG. 10, among the eight NAND strings NS arranged along the Y direction, four NAND strings NS corresponding to the string units SU0 to SU3 and one conductor 63 are electrically coupled.

A plurality of the above configurations are arranged in the X direction, and the block BLK is formed by the aggregate of the plurality of NAND strings NS arranged in the X direction. Then, the plurality of blocks BLK are arranged in the Y direction, so that the memory cell array 110 is formed.

1.1.6 Cross-Sectional Configurations of Storage Wafer and Probe Card

Next, cross-sectional configurations of the storage wafer and the probe card according to the first embodiment will be described.

1.1.6.1 Configuration Corresponding to Pad Group

Figure 11:
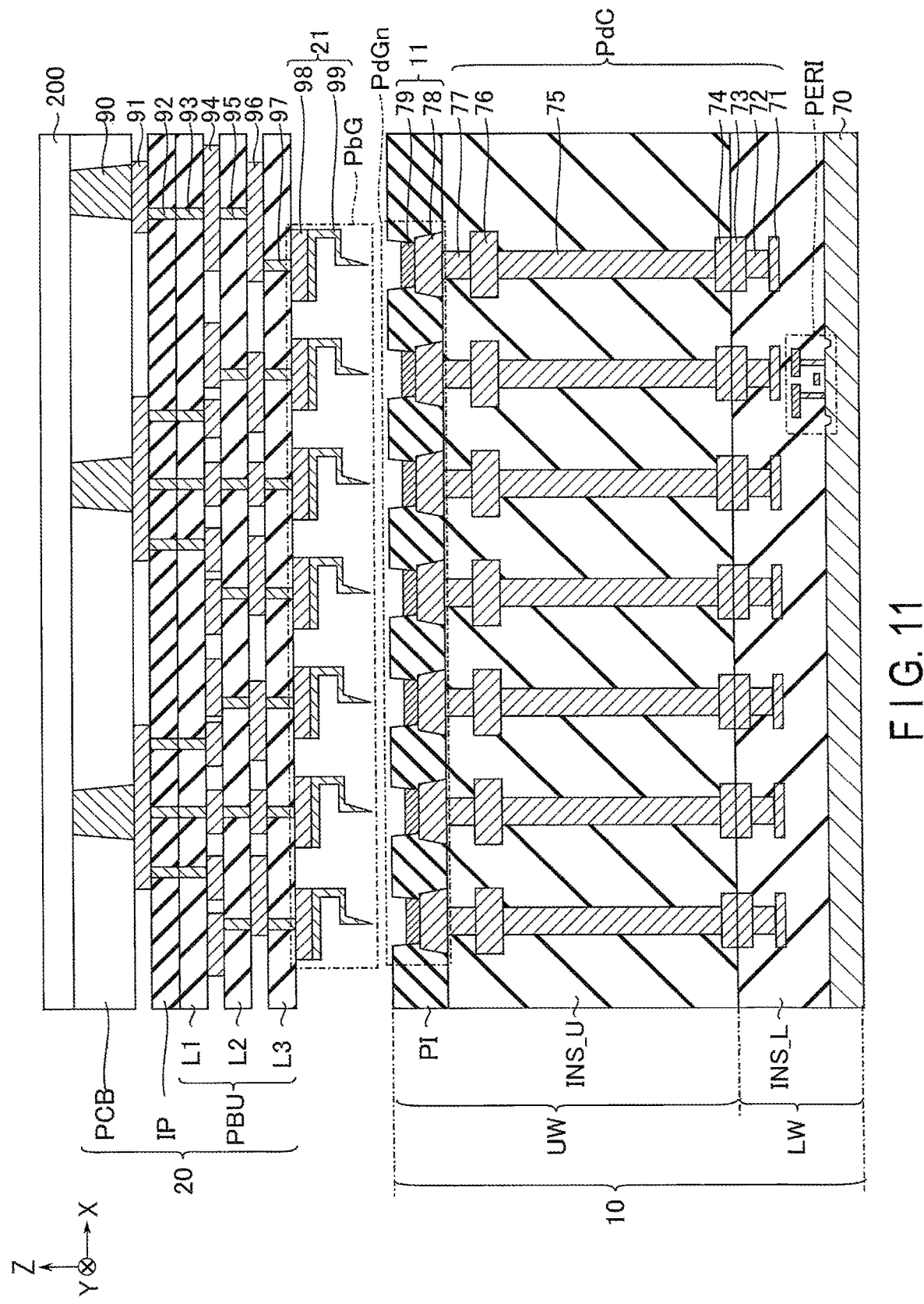
FIG. 11 is a cross-sectional view of the probe card and the storage wafer taken along the line XI-XI of FIG. 7.

FIG. 11 is a cross-sectional view taken along the line XI-XI in FIG. 5, and illustrates an example of a configuration corresponding to the pad group according to the first embodiment. FIG. 11 also illustrates an XZ cross section of the probe card 20 when the plurality of probe electrodes 21 are brought into contact with the pad group PdGn, in addition to an XZ cross section obtained by cutting the storage wafer 10 along the pad group PdGn. Note that FIG. 11 illustrates a cross section in a state before the probe electrodes 21 comes into contact with the pad electrodes 11 after the alignment in the XY plane between the storage wafer 10 and the probe card 20 is completed.

First, a cross-sectional configuration of the storage wafer 10 will be described.

As illustrated in FIG. 11, in the wafer LW, a peripheral circuit PERI (FIG. 11 illustrates a transistor as an example) is provided on the semiconductor substrate 70. A conductor 71 is provided above the peripheral circuit PERI. The conductor 71 is electrically coupled to the peripheral circuit PERI via a conductor not illustrated in the drawings. A conductor 72 functioning as a contact is provided on a top surface of the conductor 71. A conductor 73 is provided on a top surface of the conductor 72. A top surface of the conductor 73 reaches a bonding surface (that is, a top surface of the wafer LW) with the wafer UW and is used as a pad electrode at the time of bonding with the wafer UW. For example, one set of the conductors 71 to 73 is provided corresponding to each of the plurality of pad electrodes 11 in the pad group PdG. In addition, a plurality of sets of conductors 71 to 73 are electrically insulated from each other by an insulator INS_L.

A portion of the storage wafer 10 above the conductor 73 corresponds to the wafer UW. A conductor 74 used as a pad electrode at the time of bonding with the wafer LW is provided on a top surface of the conductor 73. A conductor 75 functioning as a contact is provided on a top surface of the conductor 74. A conductor 76 functioning as the interconnect 15 for electrically coupling the plurality of pad electrodes 11_1 to 11_n in the pad unit PdU is provided on a top surface of the conductor 75. As described later, the conductor 76 extends, for example, along the Y direction. A conductor 77 that functions as a contact for electrically coupling the interconnect 15 and the pad electrode 11 is provided on a top surface of the conductor 76. For example, one set of the conductors 74 to 77 is provided corresponding to each of the plurality of pad electrodes 11 in the pad group PdG. In addition, a plurality of sets of conductors 74 to 77 are electrically insulated from each other by an insulator INS_U.

A conductor 78 that functions as a part of the pad electrode 11 is provided on a top surface of the conductor 77. The conductor 78 includes, for example, aluminum (Al). A conductor 79 that functions as a part of the pad electrode 11 and has a contact surface with the probe electrode 21 on the top surface of the storage wafer 10 is provided on a top surface of the conductor 78. The conductor 79 is, for example, a dissimilar metal to the conductor 78 grown on the conductor 78 by an electroless plating growth method, and includes at least one metal selected from nickel (Ni), gold (Au), cobalt (Co), palladium (Pd), copper (Cu), and silver (Ag). The conductor 79 is harder than the conductor 78, for example, and is less likely to be damaged by contact with the probe electrode 21. A set of the plurality of conductors 78 and 79 arranged along the X direction constitutes the pad group PdG (in the example of FIG. 11, the pad group PdGn), and is electrically noncoupled from each other by an insulator PI. A top surface of each of the plurality of conductors 79 is located, for example, below (in the −Z direction) a top surface of the insulator PI.

Next, a cross-sectional configuration of the probe card 20 will be described.

The probe card 20 includes a printed circuit board PCB, an interposer IP, and a probe unit PBU, all of which have an insulating base. The probe unit PBU includes, for example, a plurality of layers L1, L2, and L3 stacked in this order from the side of the interposer IP along the Z direction. The probe electrode 21 includes, for example, a conductor 98 having a flat plate shape and a probe pin 99.

The NAND controller chip 200 is mounted on a top surface of the printed circuit board PCB, and the interposer IP is provided on a bottom surface of the printed circuit board PCB with a conductor 91 interposed therebetween. The layer L1 is provided on a bottom surface of the interposer IP. The layer L2 is provided on a bottom surface of the layer L1 with a conductor 94 interposed therebetween, and the layer L3 is provided on a bottom surface of the layer L2 with a conductor 96 interposed therebetween. The conductor 98 is provided on a bottom surface of the layer L3. The probe pin 99 is provided on a bottom surface of the conductor 98. The probe pin 99 is, for example, a cantilever supported on one side by the conductor 98, and is formed in a needle shape in which a tip on the side of the pad electrode 11 is convex. As a result, the probe electrode 21 and the pad electrode 11 can be brought into contact with each other while interference between the probe pin 99 and a peripheral edge portion of the pad electrode 11 is suppressed.

Further, conductors 90, 92, 93, 95, and 97 penetrating the printed circuit board PCB, the interposer IP, and the layers L1 to L3 in the Z direction are provided inside the printed circuit board PCB, the interposer IP, and the layers L1 to L3, respectively. The conductor 90 electrically couples the NAND controller chip 200 and the conductor 91. The conductors 92 and 93 electrically couples the conductor 91 and the conductor 94. The conductor 95 electrically couples the conductor 94 and the conductor 96. The conductor 97 electrically couples s the conductor 96 and the conductor 98.

In the above configuration, various signals output from the NAND controller chip 200 can be transferred to the desired probe pins 99 by appropriately interconnecting the conductors 91, 94, and 96.

In addition, as illustrated in FIG. 11, each of the plurality of probe electrodes 21 is disposed at a position where it is possible to contact the corresponding pad electrode 11 in the pad group PdGn in the XY plane.

1.1.6.2 Configuration Corresponding to Pad Unit and Alignment Mark

Figure 12:
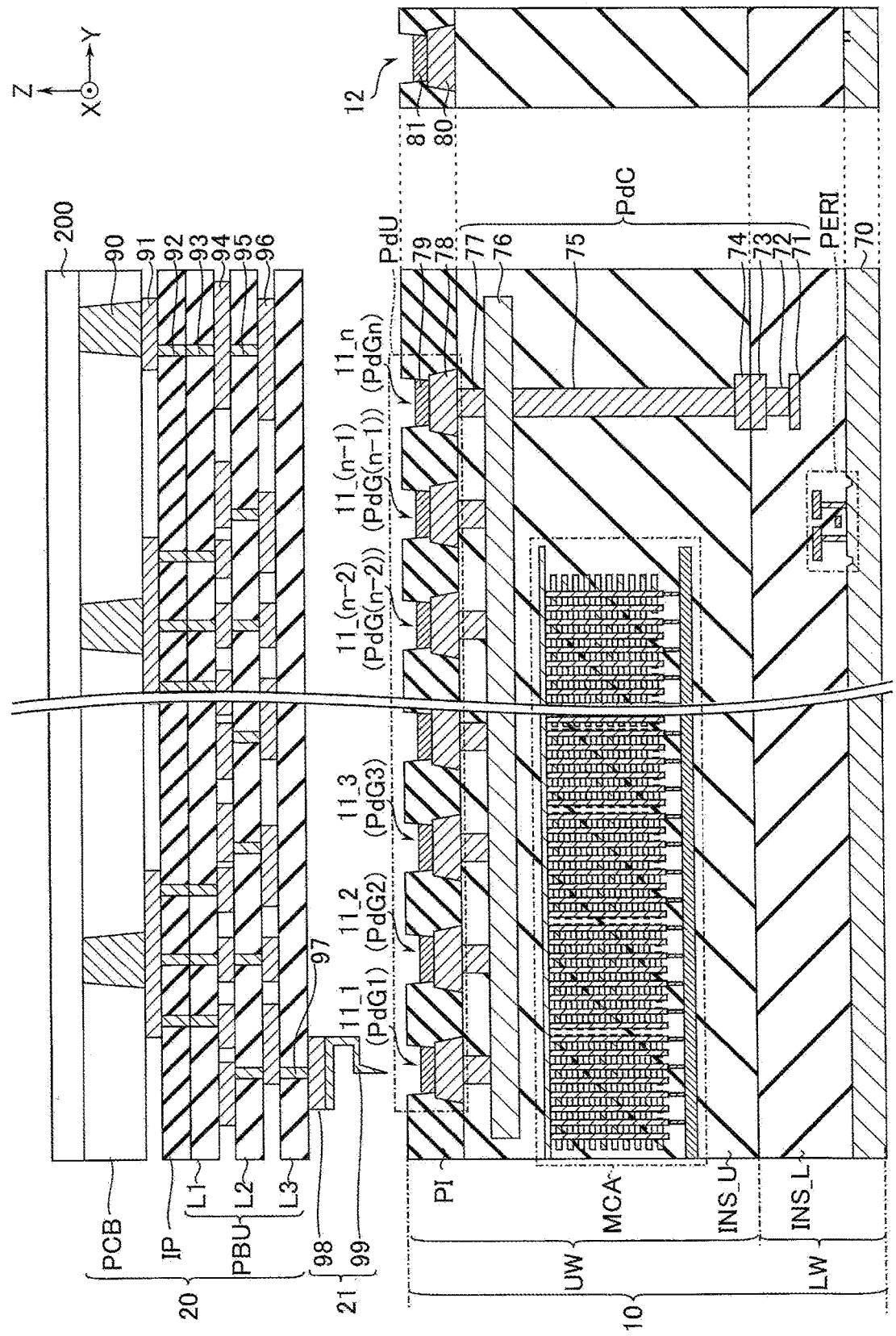
FIG. 12 is a cross-sectional view of the probe card and the storage wafer taken along the line XII-XII of FIG. 7.

FIG. 12 is a cross-sectional view taken along the line XII-XII in FIG. 5, and illustrates an example of a configuration corresponding to the pad unit and the alignment mark according to the first embodiment. In FIG. 12, in addition to a YZ cross section obtained by cutting the storage wafer 10 along the pad unit PdU and the alignment mark 12, a YZ cross section of the probe card 20 when the probe electrode 21 is brought into contact with the pad electrode 11_1 of the pad unit PdU is also illustrated. Note that, similarly to FIG. 11, FIG. 12 illustrates a cross section in a state before the probe electrode 21 comes into contact with the pad electrode 11 after the alignment in the XY plane between the storage wafer 10 and the probe card 20 is completed.

First, a cross-sectional configuration of the storage wafer 10 will be described.

Since the configuration of the wafer LW is the same as that in FIG. 11, the description thereof is omitted.

As illustrated in FIG. 12, in the wafer UW, a memory cell array MCA is provided between the conductor 76 and a boundary between the wafer LW and the wafer UW. The memory cell array MCA is electrically coupled to the peripheral circuit PERI by a conductor not illustrated in the drawings.

As described above, the conductor 76 extends along the Y direction. More specifically, for example, the length of the conductor 76 along the Y direction is equal to or more than the distance between the pad electrode 11_1 and the pad electrode 11_n at both ends of the pad unit PdU.

The plurality of conductors 78 arranged along the Y direction are provided between the conductor 76 and the pad unit PdU. In addition, the plurality of pad electrodes 11_1 to 11_n in the pad unit PdU are commonly coupled to the conductor 76. As a result, the plurality of pad electrodes 11 in the pad unit PdU can function as electrically equivalent pad electrodes.

The alignment mark 12 is formed on a top surface of the insulator INS_U so as to have the same configuration as the pad electrode 11, for example. More specifically, a conductor 80 is provided on the top surface of the insulator INS_U. The conductor 80 includes, for example, aluminum (Al). A conductor 81 having a surface exposed on the top surface of the storage wafer 10 is provided on a top surface of the conductor 80. The conductor 81 is a dissimilar metal to the conductor 80 grown on the conductor 80 by an electroless plating growth method, and includes, for example, at least one metal selected from nickel (Ni), gold (Au), cobalt (Co), palladium (Pd), copper (Cu), and silver (Ag). A top surface of the conductor 81 is located, for example, below (in the −Z direction) the top surface of the insulator PI. The conductors 80 and 81 are electrically noncoupled from the other conductors provided on the storage wafer 10 by the insulator PI.

Next, a cross-sectional configuration of the probe card 20 will be described.

The outline of the configuration of the probe card 20 is as described in FIG. 11, but in FIG. 12, the number of probe electrodes 21 with respect to the illustrated pad electrodes 11 is different. More specifically, the probe electrode 21 is allocated to any one of the plurality of pad electrodes 11 in the pad unit PdU. That is, the probe electrode 21 is disposed such that only one probe electrode 21 is allocated to the plurality of electrically equivalent pad electrodes 11.

Note that processing of determining which pad electrode 11 in the pad unit PdU the probe electrode 21 is to be brought into contact with is executed by the interface control system 33 based on the probe management table 335, for example.

1.1.7 Probe Management Table

FIG. 13 is a conceptual diagram illustrating the probe management table according to the first embodiment. The probe management table 335 may be stored in a nonvolatile manner in the host device 2, for example. In this case, the probe management table 335 may be transferred from the host device 2 simultaneously with the start of the storage system 1 and stored in the RAM 334 in the interface control system 33. In addition, the probe management table 335 may be stored in the storage wafer 10 in response to an event such as update.

As illustrated in FIG. 13, the probe management table 335 is information in which the number of probes and a defect flag are associated with a type.

The type includes, for example, a "wafer or card" item for identifying the storage wafer 10 and the probe card 20, and a "pad group" item for identifying the pad group PdG in the storage wafer 10.

The "wafer or card" item is classified into a "storage wafer" item and a "probe card" item. The "storage wafer" item uniquely specifies each of the plurality of storage wafers 10 (in FIG. 13, W1, W2, . . . ) that can be stored in the wafer stocker 5. The "probe card" item specifies the probe card 20 (that is, the probe electrode 21). The "pad group" item is associated with the "storage wafer" item and uniquely specifies the pad group PdG (PdG1, PdG2, PdG3, . . . , and PdGn) in the storage wafer 10.

The number of probes indicates the number of times contact processing (touchdown processing) of the probe electrode 21 with respect to the pad electrode 11 is executed using the pad group PdG or the probe electrode 21 in the storage wafer 10 specified by the corresponding type. The example of FIG. 13 illustrates a case where the touchdown processing is performed 10 times, 8 times, 3 times, . . . , and 0 times on the pad groups PdG1, PdG2, PdG3, . . . , and PdGn of the storage wafer W1, respectively, and the touchdown processing is performed 9 times, 1 time, 0 times, . . . , and 0 times on the pad groups PdG1, PdG2, PdG3, . . . , and PdGn of the storage wafer W2, respectively. Further, the example of FIG. 13 illustrates that the probe electrode 21 has been used for a total of 31 touchdown processing.

The defect flag indicates whether or not the pad group PdG in the storage wafer 10 specified by the corresponding type is defective (that is, the pad group PdG cannot be used for the touchdown processing). The example of FIG. 13 illustrates a case where, in the storage wafer W1, the pad groups PdG1 and PdG2 are defective ("True"), and the other pad groups PdG3 to PdGn are not defective ("False"). Further, the example of FIG. 13 illustrates a case where, in the storage wafer W2, the pad group PdG1 is defective ("True") and the other pad groups PdG2 to PdGn are not defective ("False").

By referring to the probe management table 335 described above, the interface control system 33 can determine which pad group PdG should be used for the touchdown processing for each storage wafer 10.

1.2 Operation

Next, an operation of the storage system according to the first embodiment will be described.

1.2.1 Basic Processing According to Data Communication

Figure 14:
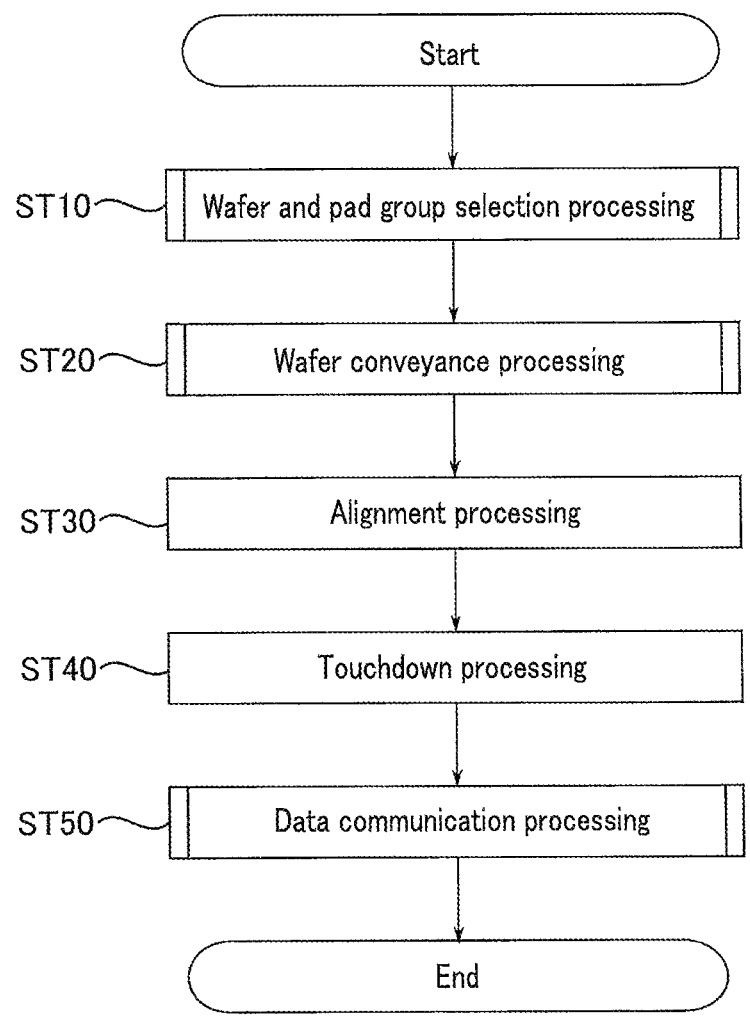
FIG. 14 is a flowchart for explaining basic processing in the storage system according to the first embodiment.

FIG. 14 is a flowchart illustrating basic processing executed at the time of data communication in the storage system according to the first embodiment.

As illustrated in FIG. 14, in step ST10, when a data read request, a data write request, or the like is received from the host device 2, the prober 3 executes wafer and pad group selection processing. The wafer and pad group selection processing includes processing of selecting the storage wafer 10 to be placed in the prober 3 and the pad group PdG to be brought into contact with the probe electrode 21 in the storage wafer 10.

In step ST20, the wafer conveyor 4 executes wafer conveyance processing of conveying the storage wafer 10 selected in step ST10 from the wafer stocker 5 to the prober 3.

In step ST30, the prober 3 executes alignment processing of aligning the pad electrode 11 on the storage wafer 10 selected in step ST10 with respect to the probe electrode 21 on the probe card 20. For example, the prober 3 eliminates the deviation between the storage wafer 10 and the probe card 20 on the XY plane using the alignment mark 12 or the like provided on the storage wafer 10.

In step ST40, the prober 3 moves the storage wafer 10, which has been caused to face the probe card 20 in step ST30, in the Z direction and executes touchdown processing of bringing the probe electrode 21 into contact with the pad group PdG selected in step ST10. The NAND controller chip 200 on the prober 3 and the NAND chip unit 100 in the storage wafer 10 are electrically coupled by the touchdown processing.

In step ST50, the NAND controller chip 200 and the NAND chip unit 100 execute data communication processing based on a request from the host device 2.

In this way, the basic processing ends.

1.2.2 Wafer and Pad Group Selection Processing

Next, details of the wafer and pad group selection processing will be described using a flowchart illustrated in FIG. 15. Steps ST11 to ST19 in FIG. 15 are an example illustrating details of step ST10 in FIG. 14.

Figure 15:
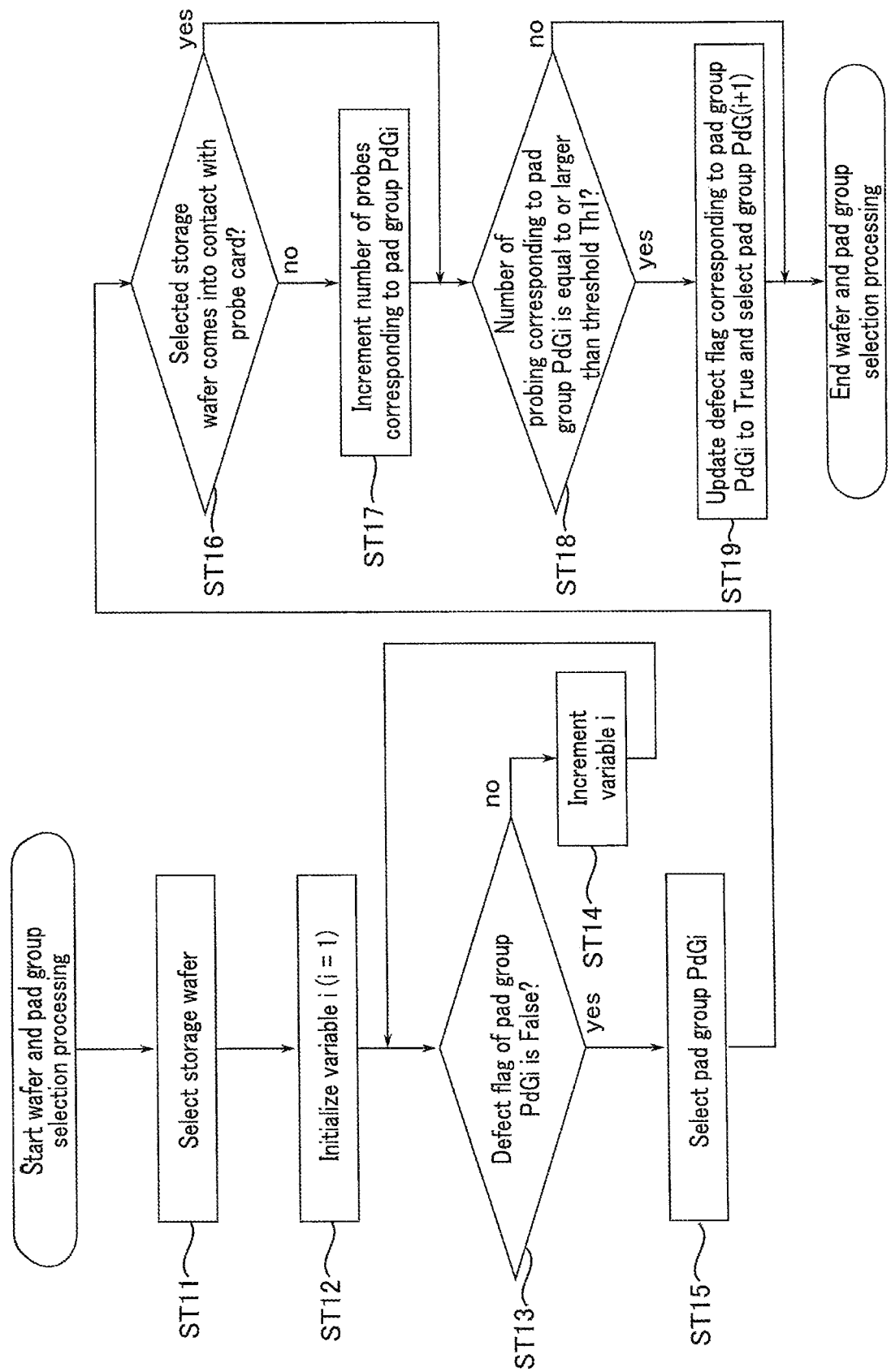
FIG. 15 is a flowchart for explaining wafer and pad group selection processing in the storage system according to the first embodiment.

As illustrated in FIG. 15, in step ST11, the prober 3 selects the storage wafer 10 to be accessed based on a request from the host device 2. In the following description, the storage wafer 10 selected in step ST11 is also referred to as the "selected storage wafer 10".

In step ST12, the prober 3 initializes a variable i to "1" ($1 \le i \le n$).

In step ST13, the prober 3 refers to the probe management table 335 and determines whether or not the defect flag corresponding to the pad group PdGi of the selected storage wafer 10 is "False". When the corresponding defect flag is not "False" (step ST13; no), the prober 3 determines that the pad group PdGi cannot be used, and the processing proceeds to step ST14. When the corresponding defect flag is "False" (step ST13; yes), the prober 3 determines that the pad group PdGi can be used, and the processing proceeds to step ST15.

In step ST14, the prober 3 increments the variable i and returns the processing to step ST13. As a result, steps ST13 and ST14 are repeated until it is determined that the pad group PdGi can be used.

In step ST15, the prober 3 selects the pad group PdGi as the pad group PdG to be brought into contact with the probe electrode 21.

In step ST16, the prober 3 confirms, for example, whether or not the selected storage wafer 10 has already come into contact with the probe card 20. When the selected storage wafer 10 does not come in contact with the probe card 20 (step ST16; no), the processing proceeds to step ST17, and when the selected storage wafer 10 already comes into contact with the probe card 20 (step ST16; yes), the processing proceeds to step ST18.

In step ST17, the prober 3 refers to the probe management table 335 and increments the number of probing corresponding to the pad group PdGi selected in step ST15.

In step ST18, the prober 3 refers to the probe management table 335 and determines whether or not the number of probes corresponding to the pad group PdGi selected in step ST15 is equal to or larger than a threshold Th1. When the number of probes is equal to or larger than the threshold Th1

(step ST18; yes), the processing proceeds to step ST19. When the number of probes is less than the threshold Th1 (step ST18; no), the processing omits step ST19.

In step ST19, the prober 3 refers to the probe management table 335, updates the defect flag corresponding to the pad group PdGi selected in step ST15 to "True", and then reselects a pad group PdG(i+1) instead of the pad group PdGi.

In this way, the wafer and pad group selection processing ends. Note that, in the following description, the pad group PdG selected after the wafer and pad group selection processing is also referred to as the "selected pad group PdG".

1.2.3 Wafer Conveyance Processing

Next, details of the wafer conveyance processing will be described using a flowchart illustrated in FIG. 16. Steps ST21 to ST26 in FIG. 16 are an example illustrating details of step ST20 in FIG. 14.

Figure 16:
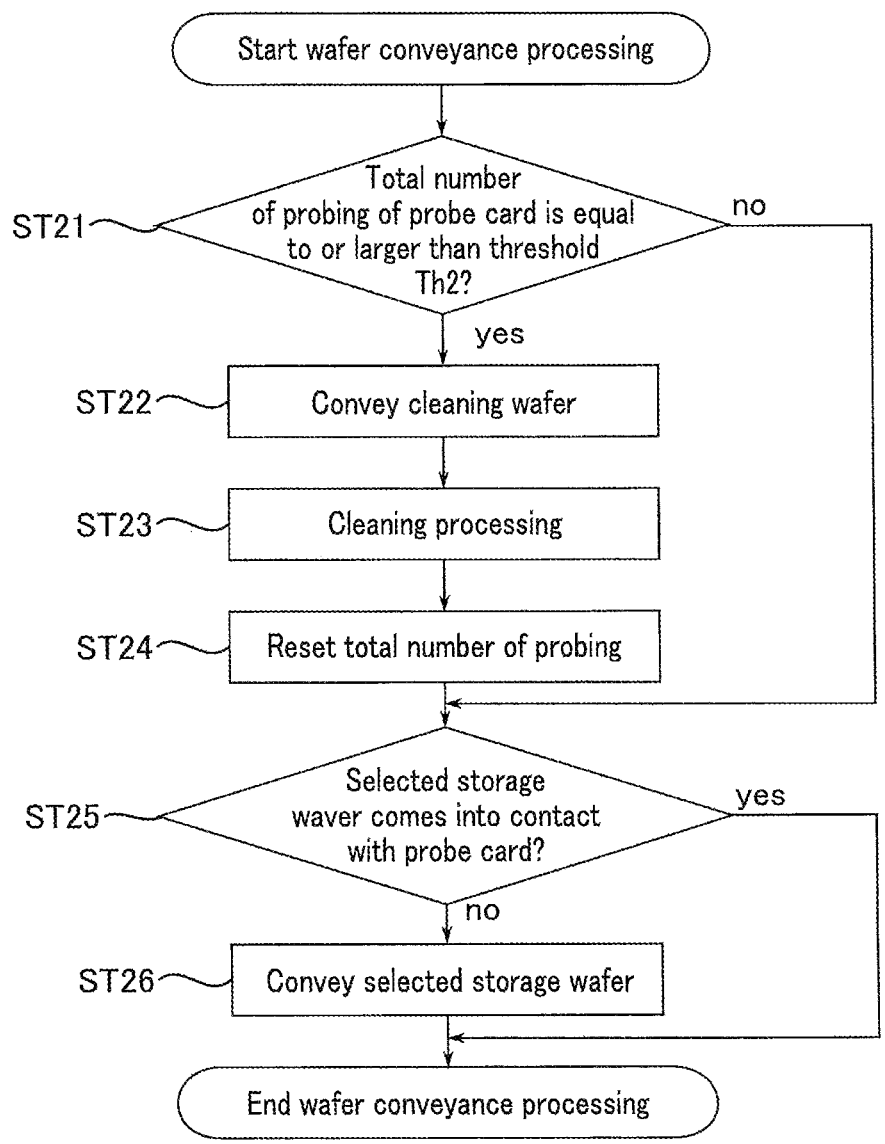
FIG. 16 is a flowchart for explaining wafer conveyance processing in the storage system according to the first embodiment.

As illustrated in FIG. 16, in step ST21, the prober 3 refers to the probe management table 335 and determines whether or not the number of probes corresponding to the probe card 20 is equal to or larger than a threshold Th2. As described above, since the number of probes corresponding to the probe card 20 means the total number (total number of probes) of touchdown processing using the probe card 20, the threshold Th2 can be set to a value larger than the threshold Th1. When the total number of probes is equal to or larger than the threshold Th2 (step ST21; yes), the prober 3 determines that cleaning processing of the probe electrode 21 is required, and the processing proceeds to step ST22. When the total number of probes is less than the threshold Th2 (step ST21; no), the prober 3 determines that the cleaning processing is unnecessary, and the processing proceeds to step ST25.

In step ST22, the wafer conveyor 4 conveys the cleaning wafer 10c from the wafer stocker 5 to the prober 3.

In step ST23, the prober 3 brings the probe electrodes 21 into contact with the cleaning wafer 10c and executes the cleaning processing. For example, the drive control system 32 drives a stage 32-1 and a stage 32-2 to displace the cleaning wafer 10c on the XY plane with respect to the probe electrodes 21. As a result, the tips of the probe electrodes 21 can be polished, dirt such as a metal of the pad electrode 11 attached to the tips of the probe electrodes 21 can be removed, and electrical characteristics of the probe electrode 21 can be improved.

In step ST24, the prober 3 resets the number of probes corresponding to the probe card 20 in the probe management table 335 to "0".

In step ST25, the prober 3 determines whether or not the selected storage wafer 10 has come into contact with the probe card 20. When the selected storage wafer 10 does not come in contact with the probe card 20 (step ST25; no), the processing proceeds to step ST26, and when the selected storage wafer 10 already comes into contact with the probe card 20 (step ST25; yes), the processing omits step ST26.

In step ST26, the wafer conveyor 4 conveys the selected storage wafer 10 from the wafer stocker 5 to the prober 3.

In this way, the wafer conveyance processing ends.

1.2.4 Data Communication Processing

Next, details of the data communication processing will be described.

1.2.4.1 Write Processing

Figure 17:
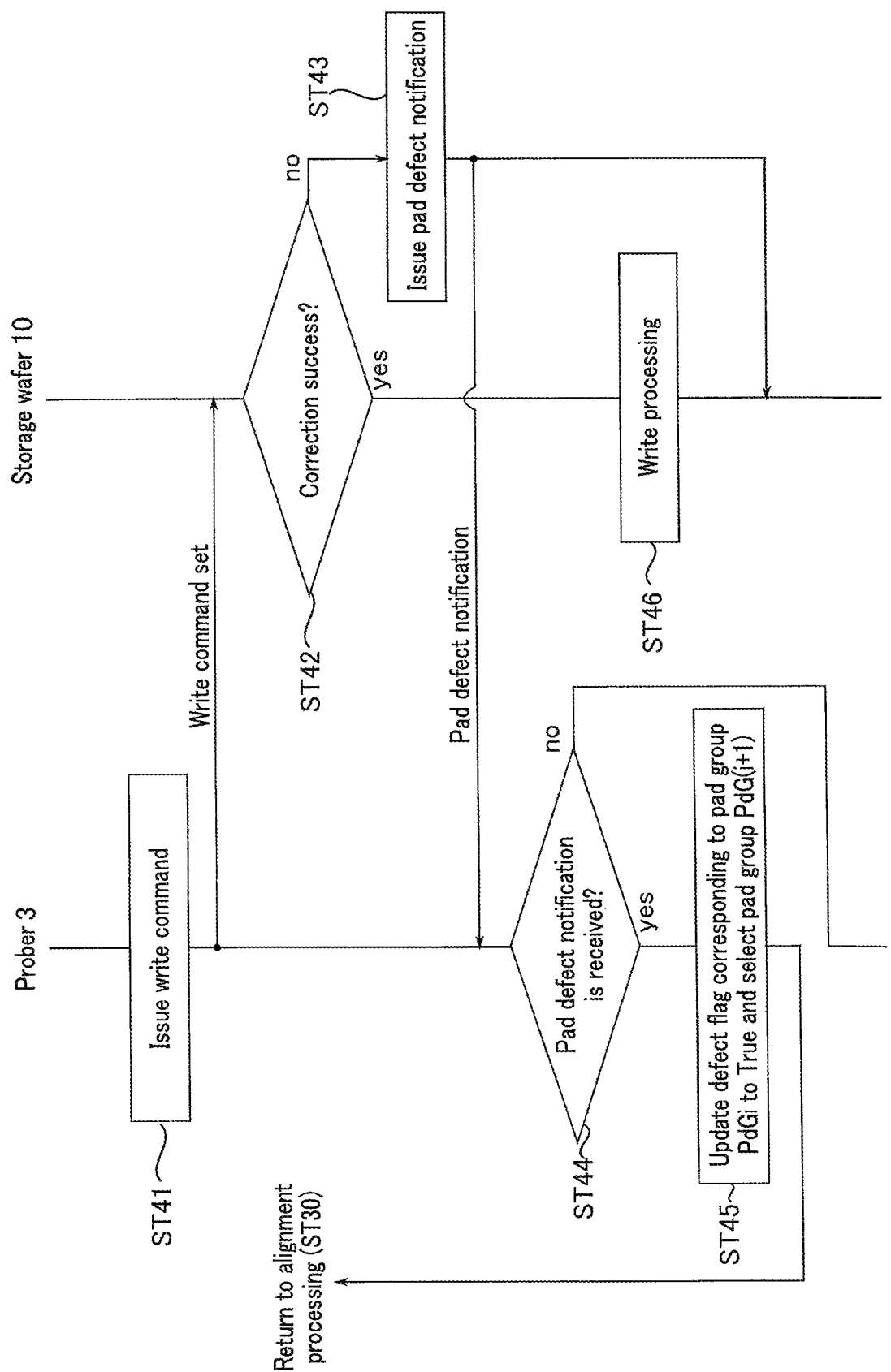
FIG. 17 is a flowchart for explaining write processing in the storage system according to the first embodiment.

First, as an example of the data communication processing, a case of write processing will be described using a flowchart illustrated in FIG. 17. FIG. 17 illustrates an example of a flow of the write processing after the alignment processing and the touchdown processing are executed following the wafer conveyance processing and the prober 3 and the storage wafer 10 are electrically coupled.

As illustrated in FIG. 17, in step ST41, the NAND controller chip 200 in the prober 3 issues a write command CMD based on a data write request from the host device 2. In addition, the NAND controller chip 200 sends a write command set including the write command CMD, the address ADD, and the write data DAT to the NAND chip unit 100. The processing of the prober 3 proceeds to step ST44.

In step ST42, when the write command set is received, the ECC circuit 125 in the NAND chip unit 100 executes error detection and correction processing on the write data DAT. When an error is not included in the write data DAT or when the error can be corrected by the ECC circuit 125 (step ST42; yes), the processing proceeds to step ST46. In step ST46, the NAND chip unit 100 executes the write processing to store data in the memory cell array 110, and the processing of the NAND chip unit 100 ends.

On the other hand, when the number of error bits included in the write data DAT exceeds the number of bits correctable by the ECC circuit 125 and the error cannot be corrected by the ECC circuit 125 (step ST42; no), the processing proceeds to step ST43.

Note that the error detection and correction processing by the ECC circuit 125 is executed based on an error correction code given in the ECC circuit 240 in the NAND controller chip 200. Further, in the above example, the case where the error detection and correction processing is executed on the write data DAT has been described, but the present disclosure is not limited thereto, and the error detection and correction processing may be similarly executed on the write command CMD and the address ADD. Further, as preprocessing of step ST42, timing deviations occurring in various signals input to the NAND chip unit 100 may be adjusted by the timing adjustment circuit 124 to achieve synchronization of the various signals.

In step ST43, the NAND chip unit 100 determines that an error correction failure by the ECC circuit 125 is caused by a defect of the pad electrode 11, and issues a pad defect notification. In addition, the pad defect notification is sent to the NAND controller chip 200.

In step ST44, the NAND controller chip 200 determines whether or not the pad defect notification has been received. When the pad defect notification is received (step ST44; yes), the processing proceeds to step ST45. When the pad defect notification is not received (step ST44; no), the processing of the prober 3 ends.

In step ST45, the interface control system 33 refers to the probe management table 335, updates the defect flag corresponding to the selected pad group PdGi to "True", and selects the pad group PdG(i+1) as a new selected pad group PdG. Then, the processing returns to the alignment processing (ST30).

Figure 19:
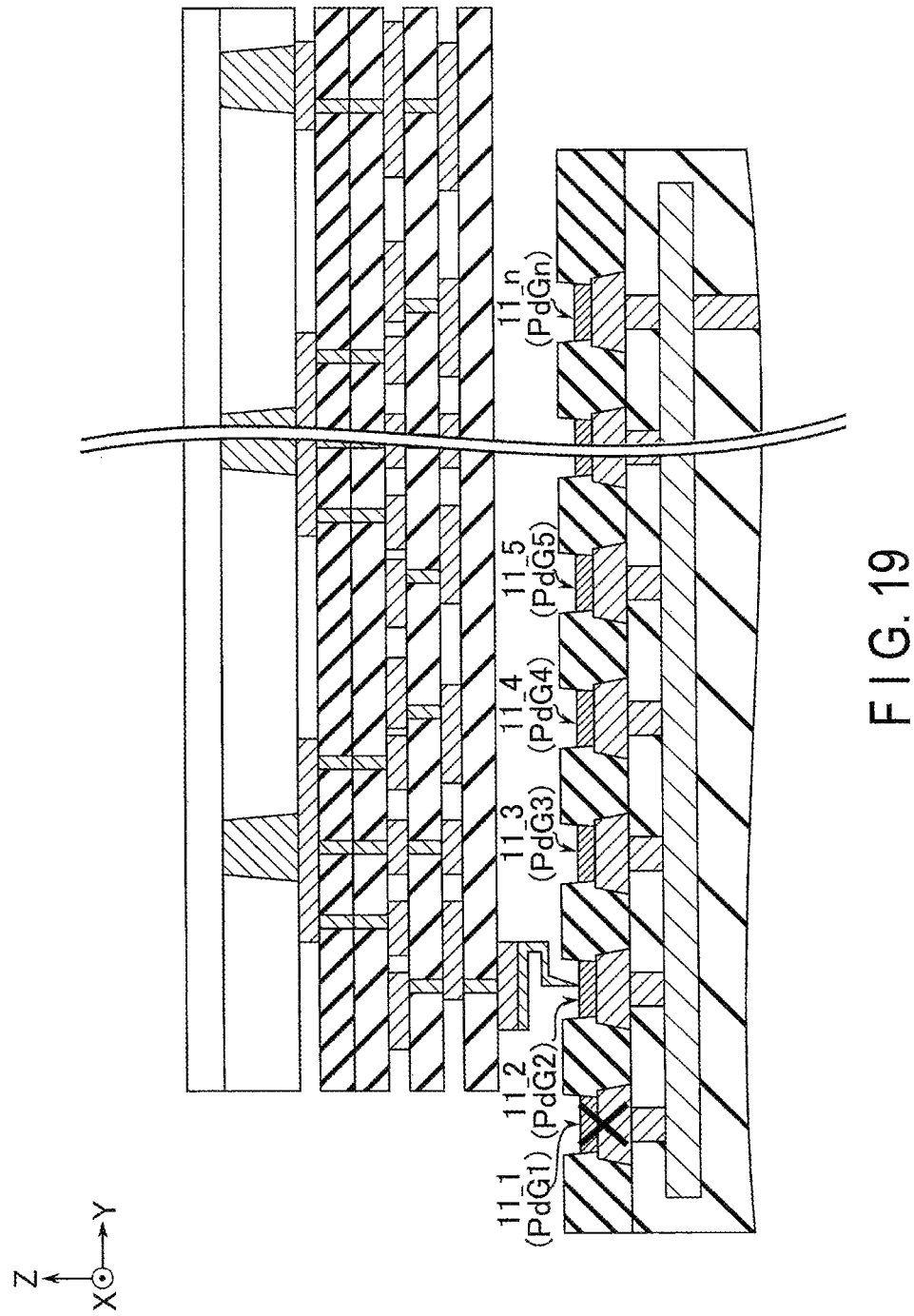
FIG. 19 is a schematic diagram for explaining the touchdown processing in the storage system according to the first embodiment.

FIGS. 18 and 19 are cross-sectional views illustrating the probe card and the NAND chip unit after the touchdown processing in the storage system according to the first embodiment. Specifically, FIG. 18 illustrates a state at the time of the alignment processing and the touchdown processing executed on the selected pad group PdG1 before the write processing illustrated in FIG. 17. FIG. 19 illustrates a state at the time of the alignment processing and the touchdown processing after a new selected pad group PdG2 is selected instead of the pad group PdG1 in step ST45 of the write processing illustrated in FIG. 17.

As illustrated in FIG. 18, when the pad group PdG1 is selected as the selected pad group PdG1 prior to the execution of the write processing, the prober 3 executes the alignment processing and the touchdown processing such that the pad group PdG1 and the probe electrodes 21 come into contact with each other. In addition, the write command set or the like is sent from the NAND controller chip 200 to the NAND chip unit 100 via the pad group PdG1.

When an error of a signal received via the pad group PdG1 cannot be corrected by the ECC circuit 125, the pad group PdG1 is damaged due to an influence of the repeated touchdown processing or the like, and degradation of electrical characteristics is suspected. Therefore, the NAND chip unit 100 sends the pad defect notification to the NAND controller chip 200, and the prober 3 determines that the pad group PdG1 is an unusable pad group PdG regardless of whether or not the number of probes of the pad group PdG1 reaches the threshold Th1 in response to the NAND controller chip 200 receiving the pad defect notification. Instead of the pad group PdG1 determined to be unusable, the prober 3 newly selects a pad group PdG2 which is unused or in which the number of probes does not reach the threshold Th1.

Subsequently, as illustrated in FIG. 19, the prober 3 executes the touchdown processing so that the pad group PdG2 and the probe electrodes 21 come into contact with each other. In addition, the write command set or the like is sent again from the NAND controller chip 200 to the NAND chip unit 100 via the pad group PdG2.

By executing the operation as described above, the pad group PdG that can perform favorable communication can be appropriately selected, and desired data can be written to the NAND chip unit 100.

Note that the pad groups PdG are desirably selected in order from the side farther from the conductor 75 coupling the pad region and the peripheral circuit region. Specifically, for example, as illustrated in FIGS. 18 and 19, after the pad group PdG1 is selected, the pad group PdG2 closer to the conductor 75 than the pad group PdG1 is desirably selected. As a result, it is possible to suppress the presence of a defective pad electrode in a conductive path between the probe electrode 21 and the conductor 75. Therefore, it is possible to suppress communication between the NAND controller chip 200 and the NAND chip unit 100 from being inhibited by the defective pad electrode.

1.2.4.2 Read Processing

Next, as an example of further data communication processing, a case of read processing will be described using a flowchart illustrated in FIG. 20. Similarly to FIG. 17, FIG. 20 illustrates an example of a flow of the read processing after the alignment processing and the touchdown processing are executed following the wafer conveyance processing and the prober 3 and the storage wafer 10 are electrically coupled.

Figure 20:
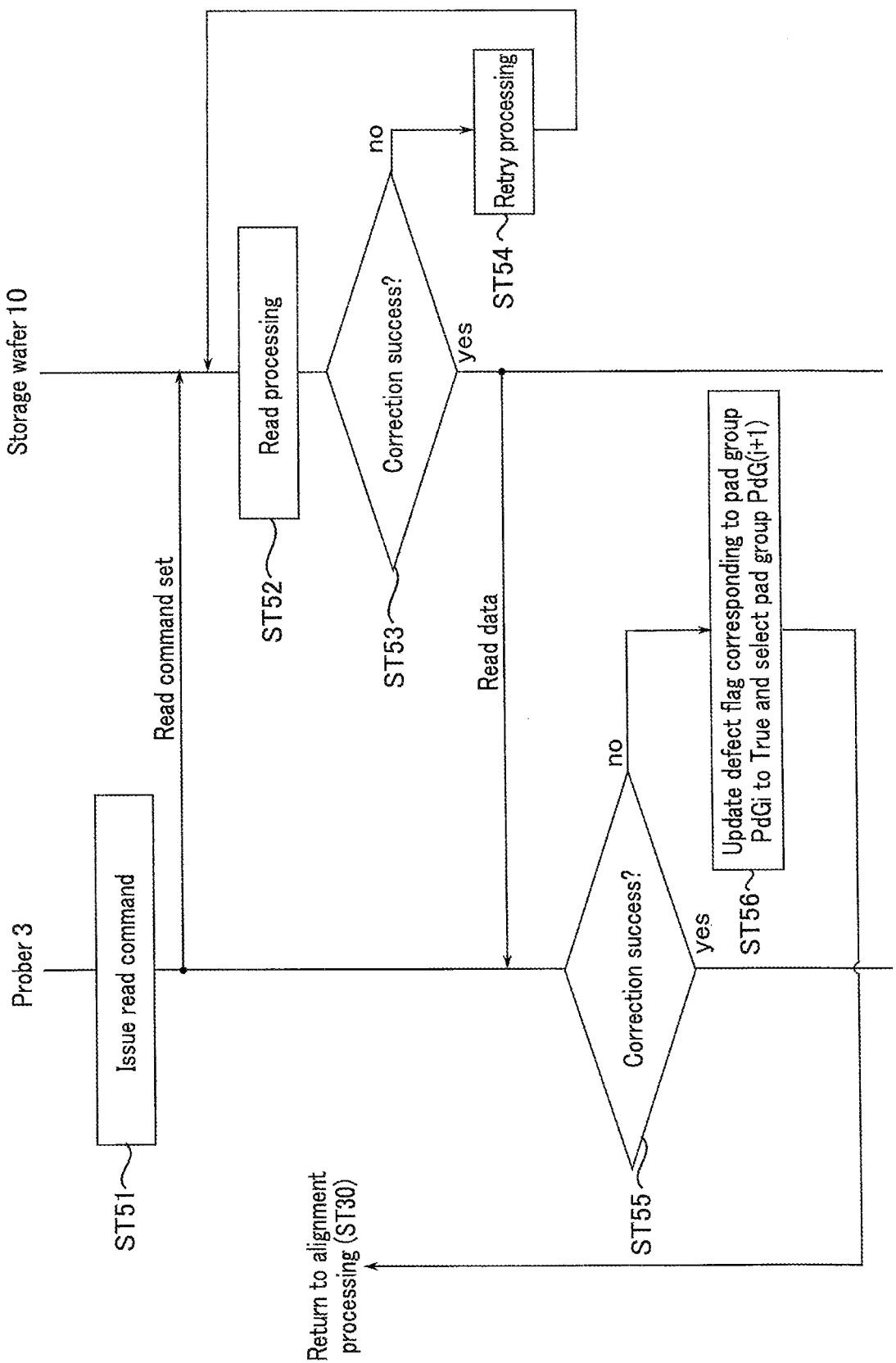
FIG. 20 is a flowchart for explaining read processing in the storage system according to the first embodiment.

As illustrated in FIG. 20, in step ST51, the NAND controller chip 200 in the prober 3 issues a read command CMD based on a data read request from the host device 2. In addition, the NAND controller chip 200 sends a read command set including the read command CMD and the address ADD to the NAND chip unit 100. The processing of the prober 3 proceeds to step ST55.

In step ST52, when the read command set is received, the NAND chip unit 100 reads the data DAT corresponding to the designated address ADD from the memory cell array 110 and stores the data DAT in the data register 128. Note that, at the time of reception of the read command set, timing deviations occurring in various signals input to the NAND chip unit 100 may be adjusted by the timing adjustment circuit 124 to achieve synchronization of the various signals.

In step ST53, the ECC circuit 125 executes error detection and correction processing on the read data DAT stored in the data register 128. When an error is not included in the read data DAT or when the error can be corrected by the ECC circuit 125 (step ST53; yes), the NAND chip unit 100 sends the read data DAT to the NAND controller chip 200 via the input/output circuit 122, and the processing of the NAND chip unit 100 ends.

On the other hand, when the error of the read data DAT cannot be corrected by the ECC circuit 125 (step ST53; no), the processing proceeds to step ST54. In step ST54, for example, the NAND chip unit 100 changes the condition of the read processing and executes the read processing again (retry processing), and attempts to reduce the number of error bits included in the read data DAT to such an extent that the ECC circuit 125 can perform error correction. When the error detection and correction processing on the read data DAT read by the retry processing is successful, the read data DAT after the error detection and correction processing is sent to the NAND controller chip 200.

In step ST55, when the read data DAT is received, the ECC circuit 240 in the NAND controller chip 200 executes the error detection and correction processing on the read data DAT. When an error is not included in the read data DAT or when the error can be corrected by the ECC circuit 125 (step ST55; yes), the read data DAT is transmitted to the host device 2, and the processing of the NAND chip unit 100 ends.

On the other hand, when the error of the read data DAT cannot be corrected by the ECC circuit 125 (step ST55; no), the processing proceeds to step ST56. In step ST56, the prober 3 refers to the probe management table 335, updates the defect flag corresponding to the selected pad group PdGi to "True", and selects the pad group PdG(i+1) as a new selected pad group PdG. Then, the processing returns to the alignment processing (ST30).

By executing the operation as described above, the pad group PdG that can perform favorable communication can be appropriately selected, and desired data can be read from the NAND chip unit 100.

1.3 Effects According to Present Embodiment

According to the first embodiment, it is possible to suppress degradation of communication reliability between the probe electrode and the pad electrode. The effects will be described below.

The NAND chip unit 100 includes a plurality of pad units PdU, and the pad unit PdU includes a plurality of pad electrodes 11_1 to 11_n belonging to a plurality of pad groups PdG1 to PdGn different from each other. As a result, even when data communication processing by a selected pad group PdGi is disabled, the data communication processing can be executed using a new selected pad group PdG(i+1). For this reason, the number of times the touchdown processing can be executed is larger than that in a case where one pad electrode 11 is allocated to one signal. Therefore, degradation of electrical characteristics between the pad electrode and the probe electrode can be suppressed.

Further, the interface control system 33 stores, as the probe management table 335, information on how many times the touchdown processing has been executed on which pad group PdG of which storage wafer 10, and information on whether or not the pad group PdG can be used. As a result, the interface control system 33 can determine whether the touch-down processing can be performed using the selected pad group PdGi or the touchdown processing should be performed using the new selected pad group PdG (i+1) based on whether or not the number of probes for the selected pad group PdGi of the selected storage wafer has exceeded the threshold Th1. Therefore, it is possible to select the pad group PdG(i+1) having good electrical characteristics (on which the touchdown processing is not executed) before the pad group PdG cannot be used due to a plurality of times of touch down processing, and it is possible to suppress degradation of response performance of the storage system 1.

The pad electrode 11 includes the conductor 78 including aluminum (Al) and the conductor 79 provided on the top surface of the conductor 78 and including a dissimilar metal of aluminum (Al). As a result, a dissimilar metal harder than pad electrodes usually used as a bonding pad in a NAND chip can be brought into contact with the probe electrode 21. Therefore, an upper limit (threshold Th1) of the number of times the touchdown processing can be executed for each pad electrode 11 can be increased.

Further, the storage wafer 10 is formed by bonding the wafer LW and the wafer UW. More specifically, the wafer UW provided with the memory cell array MCA is bonded to the top surface of the wafer LW provided with the peripheral circuit PERI. By bonding the wafer LW and the wafer UW, the peripheral circuit PERI and the memory cell array MCA provided on the different wafers can be stacked along the Z direction, and a sufficient region can be secured for both the memory cell array MCA and the peripheral circuit PERI. For this reason, the ECC circuit 125 can be provided in the peripheral circuit PERI, and data encoded on the side of the prober 3 can be decoded on the side of the storage wafer 10. Therefore, it is possible to execute error detection and correction processing of data caused by poor communication between the probe electrodes 21 and the pad electrodes 11, and it is possible to determine whether or not the pad electrode 11 cannot be used.

1.4 Modifications

Note that the above-described first embodiment can be variously modified. In a plurality of modifications described below, description of configurations and operations equivalent to those of the first embodiment will be omitted, and configurations and operations different from those of the first embodiment will be mainly described.

1.4.1 First Modification

In the first embodiment described above, the case where the plurality of pad electrodes 11 corresponding to one NAND chip unit 100 are disposed in the region surrounded by the dicing line 13 and the edge seal 14 has been described, but the present disclosure is not limited thereto. For example, a part of the plurality of pad electrodes 11 corresponding to one NAND chip unit 100 may be disposed outside the region surrounded by the dicing line 13 and the edge seal 14.

Figure 21:
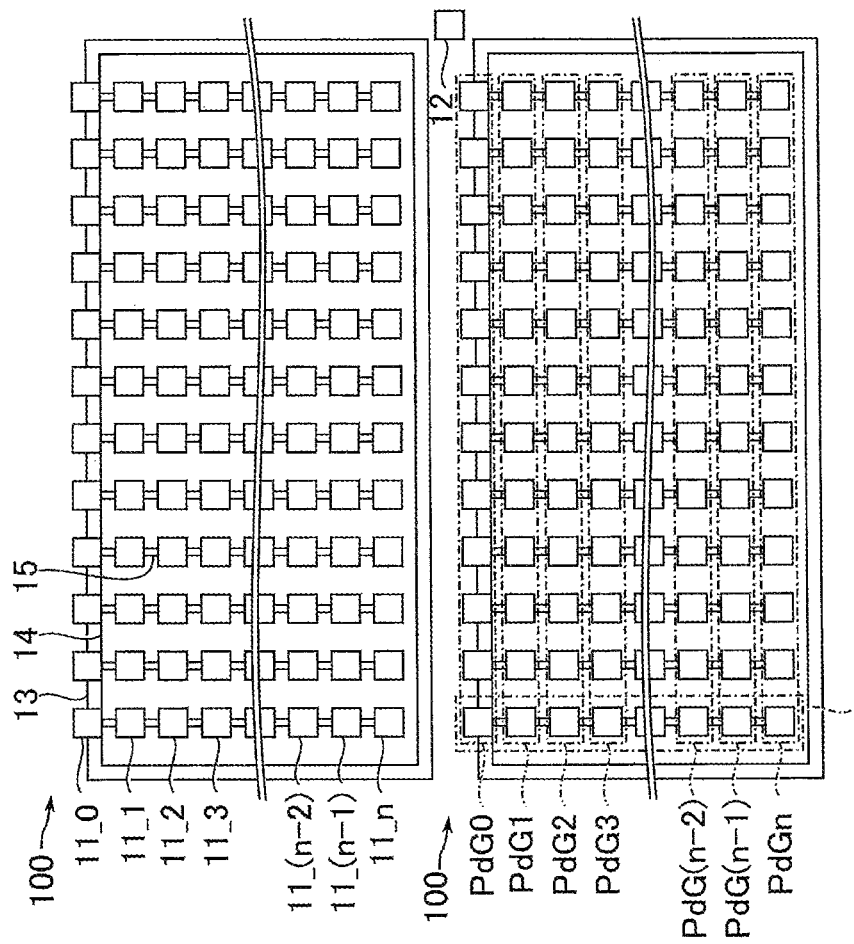
FIG. 21 is a top view of a NAND chip unit according to a first modification of the first embodiment.

FIG. 21 is a top view of a storage wafer according to a first modification of the first embodiment, and corresponds to FIG. 5 in the first embodiment.

As illustrated in FIG. 21, each of the plurality of pad units PdU includes n pad electrodes 11_1 to 11_$n$ disposed in a region surrounded by the dicing line 13 and the edge seal 14, and a pad electrode 11_0 disposed outside the region surrounded by the dicing line 13 or the edge seal 14. The pad electrodes 11_0 to 11_$n$ in the same pad unit PdU are commonly coupled by the interconnect 15. Note that the pad electrode 11_0 should not interfere with the pad electrode 11 and the interconnect 15 corresponding to another adjacent NAND chip unit 100, and may be provided beyond the dicing line 13 and the edge seal 14 corresponding to another adjacent NAND chip unit 100.

As described above, in the present embodiment, since the dicing processing is not executed along the dicing line 13, the pad electrode 11_0 disposed beyond the dicing line 13 can be used in the same manner as the other pad electrodes 11_1 to 11_$n$. As a result, the number of pad electrodes 11 that can be used for each NAND chip unit 100 can be increased. For this reason, the upper limit of the touchdown processing that can be executed on the storage wafer 10 can be increased. Therefore, degradation of communication reliability between the probe electrode and the pad electrode can be suppressed, and the life of the storage wafer 10 can be extended.

1.4.2 Second Modification

In the first embodiment and the first modification of the first embodiment described above, the case where the plurality of pad electrodes 11 in one pad unit PdU are disposed in parallel in the Y direction has been described. However, the plurality of pad electrodes 11 in one pad unit PdU may not be disposed in parallel in the Y direction.

Figure 22:
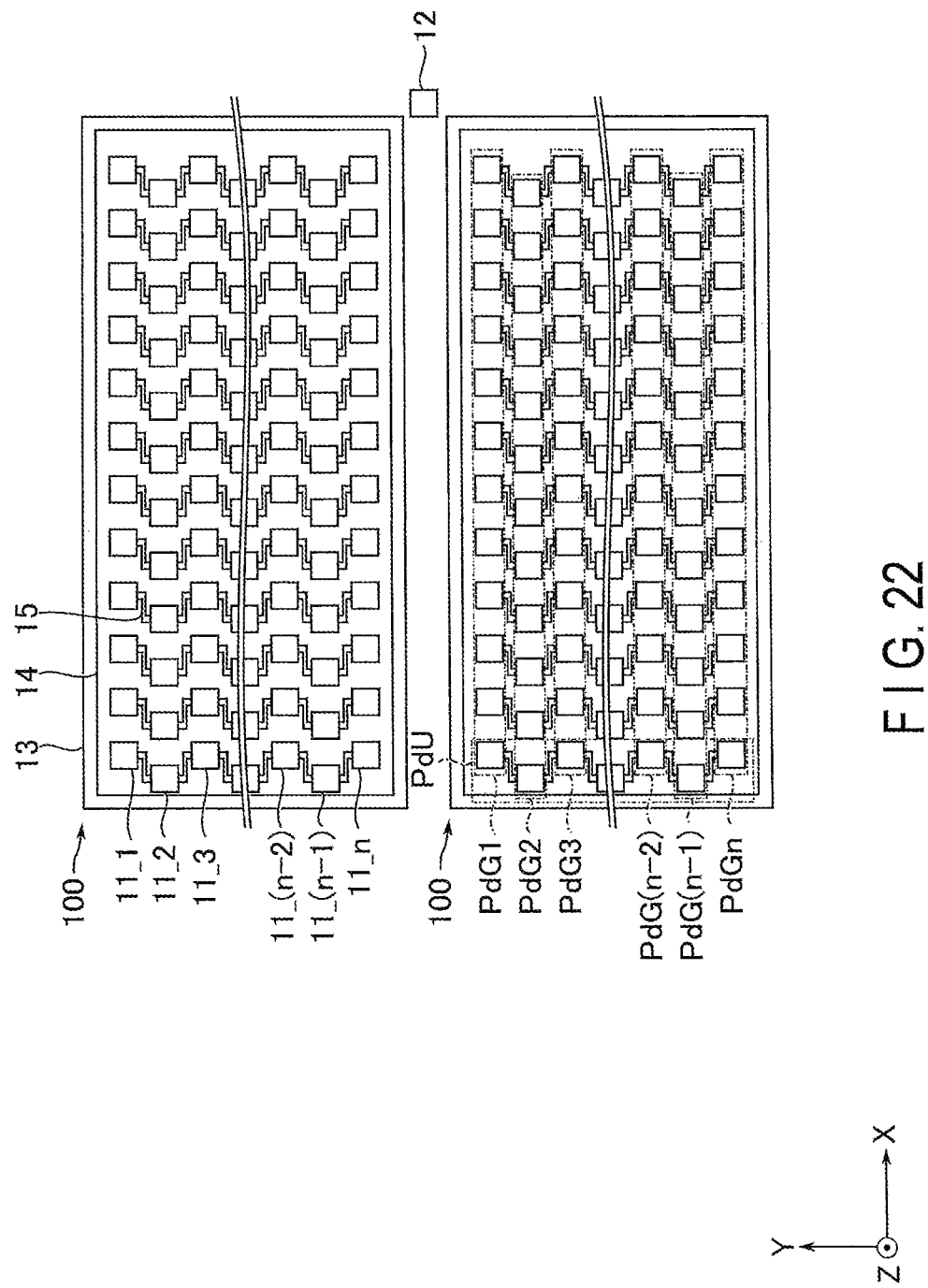
FIG. 22 is a top view of a NAND chip unit according to a second modification of the first embodiment.

FIG. 22 is a top view of a storage wafer according to a second modification of the first embodiment. FIG. 22 corresponds to FIG. 5 in the first embodiment.

As illustrated in FIG. 22, a pad electrode 11_$i$ belonging to a pad group PdGi and pad electrodes 11_($i$+1) and 11_($i$−1) belonging to pad groups PdG($i$+1) and PdG($i$−1) can be disposed along a direction crossing the Y direction (0<$i$<n). As a result, as compared with a case where a plurality of pad electrodes 11 in one pad unit PdU are disposed in parallel in the Y direction, a distance between the pad electrode 11_$i$ and the pad electrodes 11_($i$+1) and 11_($i$−1) can be increased. Therefore, it is possible to reduce a load of alignment between the probe electrode 21 and the pad electrode 11 in the alignment processing.

1.4.3 Third Modification

In the first embodiment and the first modification and the second modification of the first embodiment described above, the case where the plurality of pad electrodes 11 in one pad group PdG are disposed in parallel in the X direction has been described. However, the plurality of pad electrodes 11 in one pad group PdG may not be disposed in parallel in the X direction.

Figure 23:
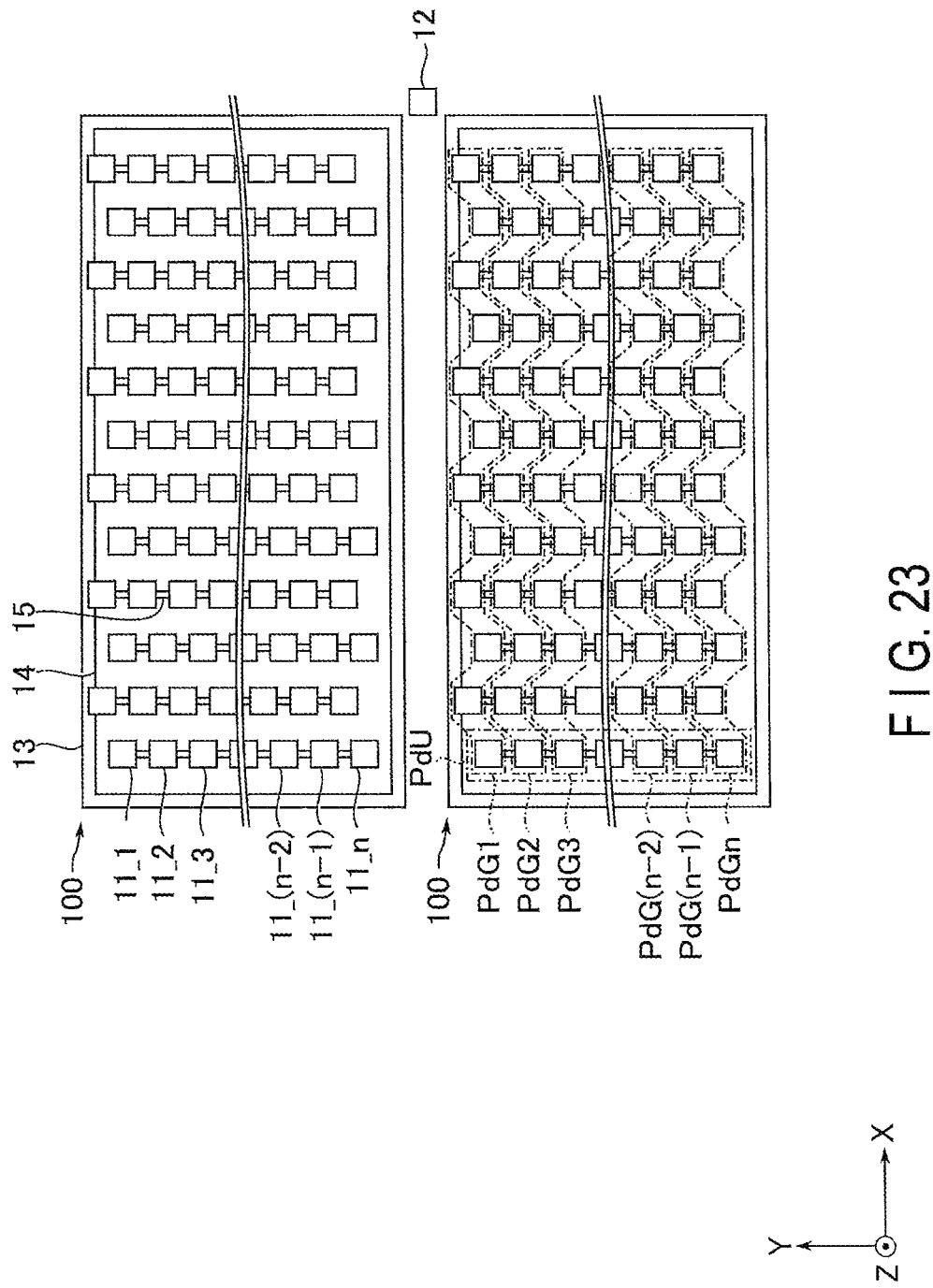
FIG. 23 is a top view of a NAND chip unit according to a third modification of the first embodiment.

FIG. 23 is a top view of a storage wafer according to a third modification of the first embodiment. FIG. 23 corresponds to FIG. 5 in the first embodiment.

As illustrated in FIG. 23, a plurality of pad electrodes 11_1 to 11_$n$ belonging to a certain pad unit PdU can be disposed along a direction crossing the X direction with a plurality of pad electrodes 11_1 to 11_$n$ belonging to an adjacent pad unit PdU. As a result, as compared with a case where the plurality of pad electrodes 11 in one pad group PdG are disposed in parallel in the X direction, a distance between the pad electrodes 11 in one pad group PdG can be increased. Therefore, it is possible to reduce a load of alignment between the probe electrode 21 and the pad electrode 11 in the alignment processing.

Note that, in the first to third modifications of the first embodiment described above, all the pad groups PdG1 to PdGn in all the NAND chip units 100 have the same arrangement pattern. That is, a relative positional relation between the pad electrode 11 belonging to the certain pad group PdG and the corresponding pad electrode 11 belonging to another pad group PdG does not change depending on the pad unit PdU to which these two pad electrodes 11 belong. In other words, a quadrilateral formed by two pad electrodes 11 belonging to a certain pad group PdG and two pad electrodes 11 corresponding to the two pad electrodes 11 in another pad group PdG becomes a parallelogram. As a result, an arbitrary pad group PdG can be selected without changing the arrangement of the probe electrodes 21.

1.4.4 Fourth Modification

In the first embodiment and the first to third modifications of the first embodiment described above, the case where the top surface of the conductor 79 provided as the portion of the pad electrode 11 in contact with the probe electrode 21 is located below the top surface of the insulator PI has been described, but the present disclosure is not limited thereto, and the top surface of the conductor 79 may be located above the top surface of the insulator PI.

Figure 24:
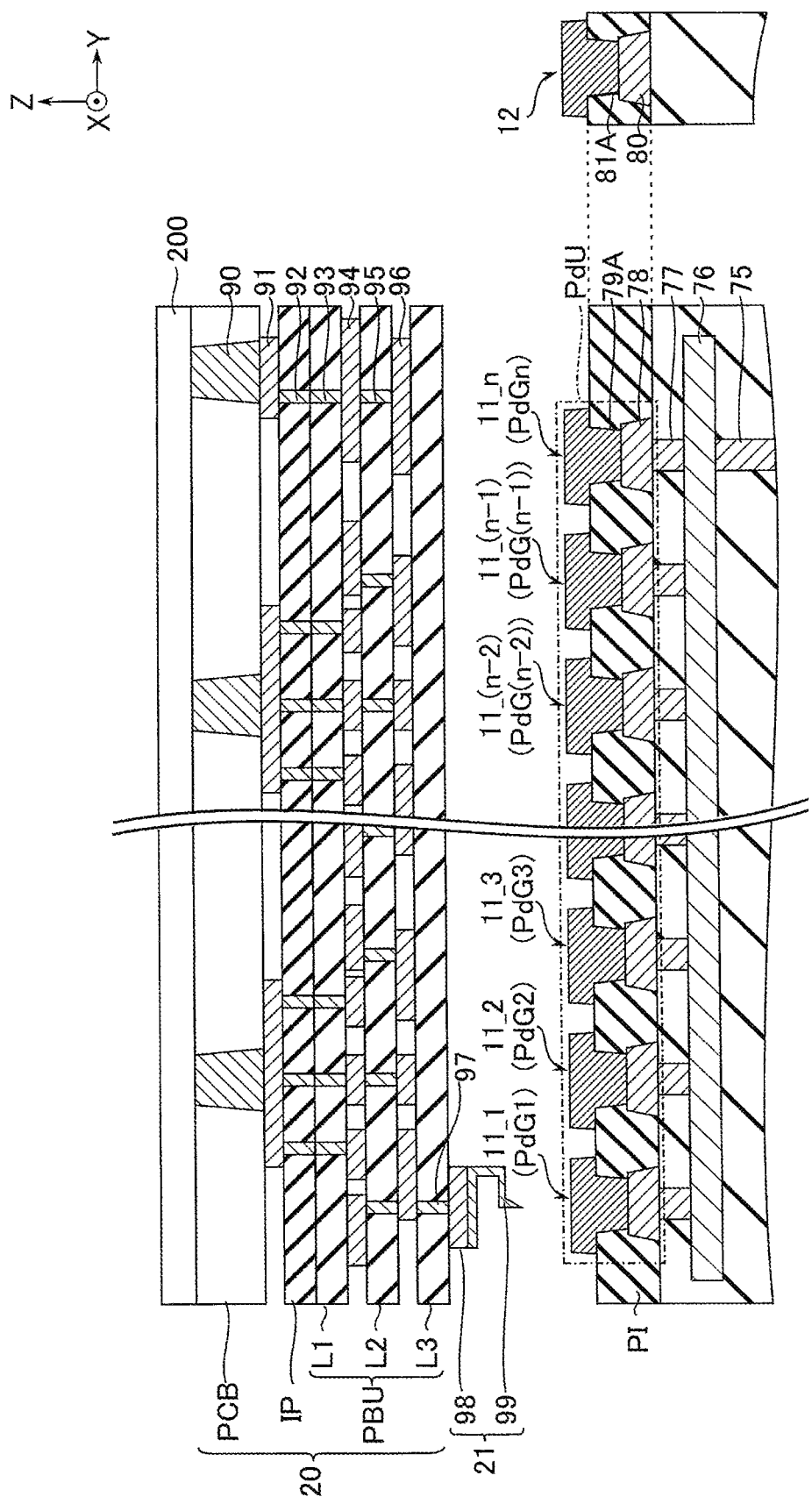
FIG. 24 is a cross-sectional view of a probe card and a storage wafer according to a fourth modification of the first embodiment.

FIG. 24 is a cross-sectional view illustrating an example of a configuration corresponding to a pad unit and an alignment mark according to a fourth modification of the first embodiment, and corresponds to FIG. 12 in the first embodiment.

As illustrated in FIG. 24, a conductor 79A that functions as a part of the pad electrode 11 and has a contact surface with the probe electrode 21 on the top surface of the storage wafer 10 is provided on the top surface of the conductor 78. The conductor 79A is a dissimilar metal to the conductor 78 grown on the conductor 78 by an electroless plating growth method, and includes, for example, at least one metal selected from nickel (Ni), gold (Au), cobalt (Co), palladium (Pd), copper (Cu), and silver (Ag). A set of the plurality of conductors 78 and 79A arranged along the X direction constitutes one pad group PdU, and is commonly coupled to the conductor 76 via the conductor 77 provided corresponding to each of a plurality of sets. A top surface of the conductor 79A is located, for example, above (in the +Z direction) the top surface of the insulator PI and has an area larger than that of the top surface of the conductor 78. Further, the conductor 79A has a portion in contact with the top surface of the insulator PI above the insulator PI. That is, the conductor 79A has a protruding structure including a portion protruding upward with respect to the insulator PI.

The alignment mark 12 includes a conductor 80 and a conductor 81A provided on a top surface of the conductor 80. Similarly to the conductor 79A, the conductor 81A has a top surface located above (+Z direction) the top surface of the insulator PI, and the top surface of the conductor 81A has an area larger than that of the top surface of the conductor 78. In addition, the conductor 81A has a portion in contact with the top surface of the insulator PI above the insulator PI. That is, the conductor 81A has a protruding structure including a portion protruding upward with respect to the insulator PI.

With the above configuration, the area of the top surface of the pad electrode 11 that can come in contact with the probe electrode 21 can be increased. As a result, it is possible to alleviate the requirement on alignment accuracy between the probe electrode 21 and the pad electrode 11 at the time of the touchdown processing. Further, the pad electrodes 11 and the alignment mark 12 are caused to have the same configuration, so that the pad electrodes 11 and the alignment mark 12 can be provided in the same manufacturing process. Therefore, an increase in the manufacturing load of the storage wafer 10 can be suppressed. However, it is not always necessary to cause the pad electrodes 11 and the alignment mark 12 to have the same configuration, and the size, shape, or material of the pad electrode 11 and the alignment mark 12 can be changed depending on the case.

1.4.5 Fifth Modification

In the first embodiment and the first to fourth modifications of the first embodiment described above, the case where the probe pin 99 is provided as the portion of the probe electrode 21 that comes into contact with the pad electrode 11 has been described, but the present disclosure is not limited thereto. For example, the probe electrode 21 may come in contact with the pad electrode 11 by an electrode having a flat plate shape.

Figure 25:
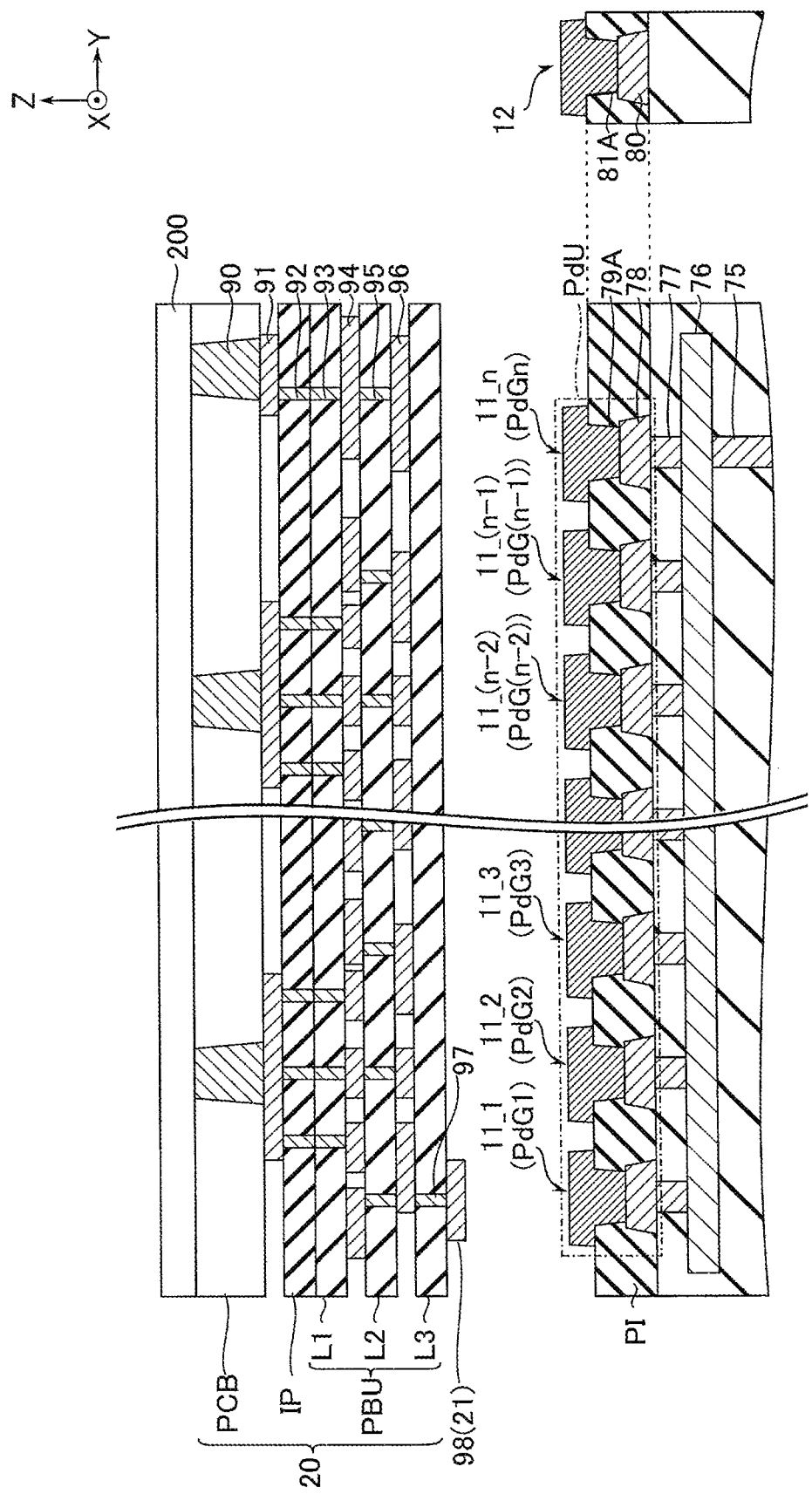
FIG. 25 is a cross-sectional view of a probe card and a storage wafer according to a fifth modification of the first embodiment.

FIG. 25 is a cross-sectional view illustrating an example of a configuration corresponding to a pad unit and an alignment mark according to a fifth modification of the first embodiment, and corresponds to FIG. 24 in the fourth modification of the first embodiment.

As illustrated in FIG. 25, the probe electrode 21 includes the conductor 98 having a flat plate shape, but may not include the probe pin 99.

As described in the fourth modification of the first embodiment, when the pad electrode 11 protrudes upward with respect to the insulator PI, restriction of interference with the insulator PI when the probe electrode 21 comes into contact with the pad electrode 11 is alleviated. As a result, it is possible to increase a contact area of the probe electrode 21 with respect to the pad electrode 11. Therefore, a contact portion of the probe electrode 21 with respect to the pad electrode 11 can be changed from the cantilever type probe pin 99 to the conductor 98 having a flat plate shape. Therefore, the configuration of the probe electrode 21 can be simplified, and an increase in the design load of the probe card 20 can be suppressed.

2. Second Embodiment

Next, a storage system according to a second embodiment will be described.

In the first embodiment, a case where conductors 78 and 79 used as bonding pads when a storage wafer 10 is diced to separate and use a plurality of NAND chip units 100 are redundant has been described. A second embodiment is different from the first embodiment in that a redistribution layer is provided above one conductor 78 provided immediately above a pad contact PdC, and the redistribution layer functions as a plurality of redundant pad electrodes 11. In the following description, description of configurations and operations equivalent to those of the first embodiment will be omitted, and configurations and operations different from those of the first embodiment will be mainly described.

2.1 Configuration Corresponding to Pad Unit and Alignment Mark

Figure 26:
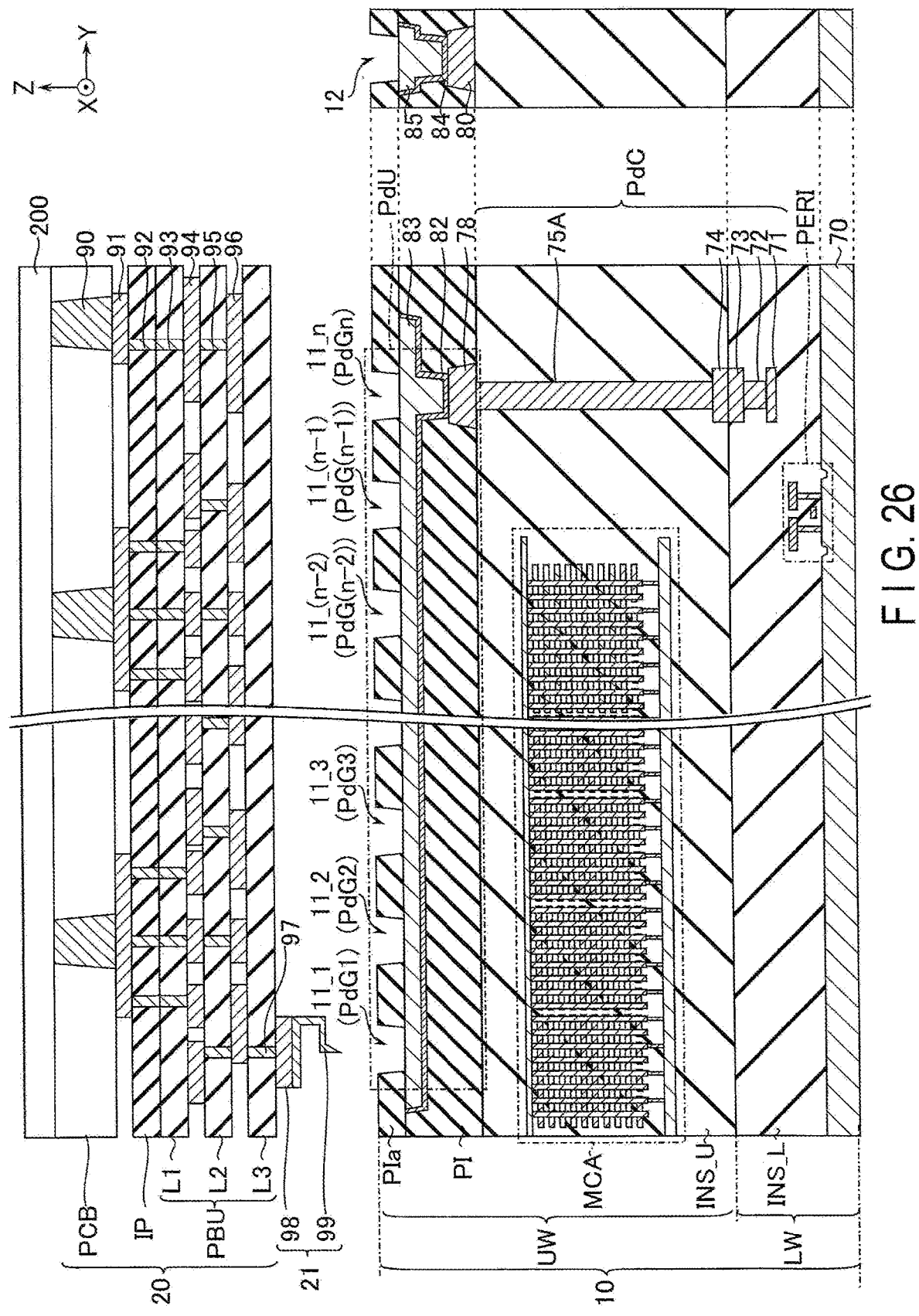
FIG. 26 is a cross-sectional view of a probe card and a storage wafer according to a second embodiment.

FIG. 26 is an example of a configuration corresponding to a pad unit and an alignment mark according to the second embodiment, and corresponds to FIG. 12 in the first embodiment.

As illustrated in FIG. 26, a conductor 75A functioning as a contact is provided on a top surface of a conductor 74. The conductor 78 including, for example, aluminum (Al) is provided on a top surface of the conductor 75A. As described above, the conductor 78 is a bonding pad to be bonded to a bonding interconnect when the NAND chip unit 100 is cut out from the storage wafer 10 and used. The conductor 75A is coupled to the conductor 78 without going through a conductor (a conductor 76 in FIG. 12) functioning as a interconnect 15.

On a top surface of the conductor 78, a conductor 83 is provided as a redistribution layer with a conductor 82 functioning as a barrier metal of the conductor 83 interposed therebetween. The conductor 83 includes, for example, copper (Cu). The conductors 82 and 83 include a contact portion that comes in contact with the conductor 78 and extends in a Z direction, and an interconnect portion that extends in a Y direction above the contact portion and functions as the pad unit PdU and the interconnect 15.

The conductors 82 and 83 are provided by, for example, a damascene method. More specifically, after an insulator PI is provided on an insulator INS_U and the conductor 78, a region of the insulator PI that will function as a redistribution layer is etched to expose the conductor 78. After the conductor 82 is provided in the etched region, the conductor 83 is provided so as to fill the remaining portion of the region. Therefore, a side surface of the conductor 83 comes in contact with the conductor 82 not only at the contact portion but also at the interconnect portion.

On a top surface of the conductor 83, an insulator PIa is provided so as to divide the conductor 83 into n parts along the Y direction when viewed from above. As a result, the conductor 83 has n portions that can come into contact with the probe electrode 21 on the top surface of the storage wafer 10, and the n portions function as n pad electrodes 11_1 to 11_n (that is, the pad unit PdU) electrically coupled to each other.

The alignment mark 12 is formed on a top surface of the insulator INS_U so as to have the same configuration as the pad electrodes 11, for example. More specifically, a conductor 80 is provided on the top surface of the insulator INS_U. The conductor 80 includes, for example, aluminum (Al). On a top surface of the conductor 80, a conductor 85 is provided with a conductor 84 functioning as a barrier metal interposed therebetween. The conductor 85 includes, for example, copper (Cu). The conductors 84 and 85 include a contact portion that comes in contact with the conductor 80 and a portion that is visible above the contact portion to be distinguished from the surrounding insulators PI and PIa. The conductors 84 and 85 are provided in the same process as the conductors 82 and 83, for example, by a damascene method. The conductors 84 and 85 are electrically non-coupled from the other conductors provided on the storage wafer 10 by the insulator PI.

2.2 Effects According to Present Embodiment

According to the second embodiment, the interconnect 15 and the pad unit PdU are provided as a redistribution layer above the conductor 78. As a result, the pad unit PdU can be provided without executing a process of providing the interconnect 15 between the conductor 78 and the memory cell array MCA and a process of providing the n conductors 78 electrically coupled to the interconnect 15. Therefore, the process until the conductor 78 is provided can be matched between the present embodiment in which the storage wafer 10 is used in units of wafers and a case where the storage wafer is cut out and used in units of the NAND chip unit 100. Therefore, an increase in the manufacturing load of the storage wafer 10 can be suppressed.

In addition, by providing the redistribution layer above the conductor 78, a degree of freedom in arrangement of the pad electrodes 11 can be increased.

More specifically, for example, the conductors 78 provided in a plurality of NAND chip units 100 may be electrically coupled by the redistribution layer. As a result, a plurality of transmission paths through which the same information is transmitted to the plurality of NAND chip units 100 can be integrated into one. Therefore, the number of pad electrodes 11 on the storage wafer 10 can be reduced, and the number of probe electrodes 21 on a probe card 20 can be reduced.

Further, for example, by redistributing the pad electrodes 11 from the position of the conductor 78, the plurality of pad electrodes 11 electrically coupled to a certain NAND controller chip 200 may be concentrated in the vicinity of the NAND controller chip 200 when viewed from above. As a result, the probe electrodes 21 electrically coupled to the NAND controller chip 200 can be concentrated in the vicinity of the NAND controller chip 200 when viewed from above. Therefore, a interconnect length between the NAND controller chip 200 and the probe electrode 21 can be shortened, a timing deviation of a signal between the interconnects can be reduced, and an increase in a design load of the interconnects in the probe card 20 can be suppressed.

Further, for example, the pad electrodes 11 may be arranged at equal intervals on the storage wafer 10 by redistributing the pad electrodes 11. As a result, the probe electrodes 21 on the probe card 20 can also be arranged at equal intervals. Therefore, the restriction on the interference between the probe electrodes 21 can be alleviated, and the design load of the probe card 20 can be reduced.

2.3 Modifications

Note that the second embodiment described above can be variously modified. In a plurality of modifications described below, description of configurations and operations equivalent to those of the second embodiment will be omitted, and configurations and operations different from those of the second embodiment will be mainly described.

2.4.1 First Modification

In the second embodiment described above, the case where the redistribution layer is provided by the damascene method has been described, but the present disclosure is not limited thereto. For example, the redistribution layer may be provided by etching a conductor provided on the conductor 78 as the bonding pad.

Figure 27:
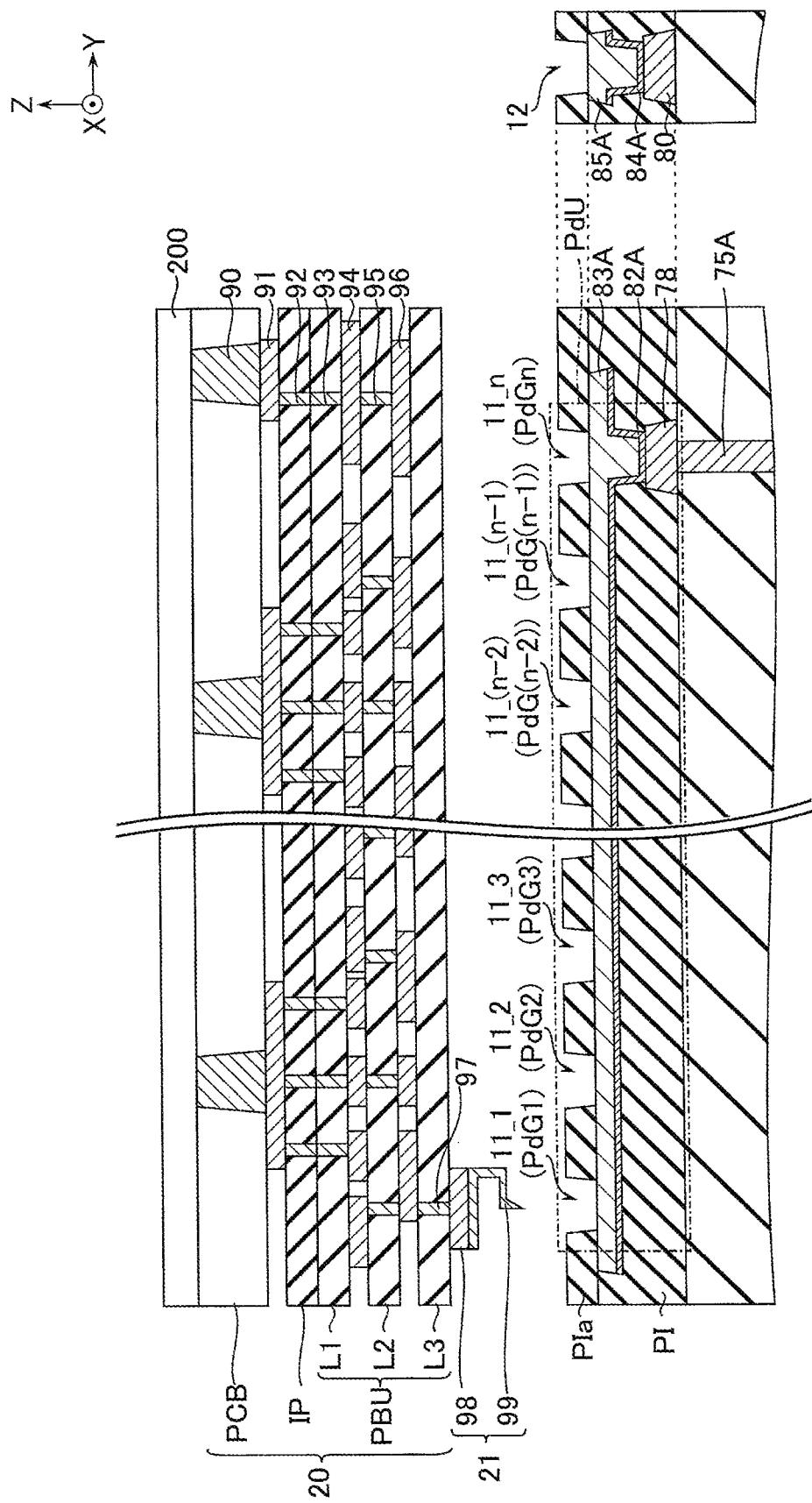
FIG. 27 is a cross-sectional view of a probe card and a storage wafer according to a first modification of the second embodiment.

FIG. 27 is an example of a configuration corresponding to a pad unit and an alignment mark according to a first modification of the second embodiment, and corresponds to FIG. 26 in the second embodiment.

As illustrated in FIG. 27, a conductor 82A functioning as a barrier metal is provided on the top surface of the conductor 78, and a conductor 83A is provided on a top surface of the conductor 82A. The conductor 83A includes, for example, copper (Cu). The conductors 82A and 83A include a contact portion that comes in contact with the conductor 78 and extends in the Z direction, and a interconnect portion that extends in the Y direction above the contact portion and functions as the pad unit PdU and the interconnect 15.

The conductors 82A and 83A are processed into an appropriate shape as redistribution by etching, for example. More specifically, the insulator PI is provided on the insulator INS_U and the conductor 78 up to a height at which the contact portions of the conductors 82A and 83A are to be provided. Thereafter, a region of the insulator PI where the contact portion is to be provided is etched to expose the conductor 78. Subsequently, the conductor 82A is provided over the entire top surfaces of the conductor 78 and the insulator PI, and the conductor 83A is provided on the top surface of the conductor 82A. The conductor 83A is provided up to a height at which the interconnect portion is to be provided. In addition, the conductors 82A and 83A are etched into an appropriate shape as a redistribution layer, and the etched regions are filled with the insulator PI. Therefore, the side surface of the conductor 83A comes in contact with the conductor 82A at the contact portion, but comes in contact with the insulator PI at the interconnect portion.

The alignment mark 12 is formed on a top surface of the insulator INS_U so as to have the same configuration as the pad electrodes 11, for example. More specifically, a conductor 80 is provided on the top surface of the insulator INS_U. A conductor 84A functioning as a barrier metal is provided on a top surface of the conductor 80, and a conductor 85A is provided on a top surface of the conductor 84A. The conductor 85A includes, for example, copper (Cu). The conductors 84A and 85A include a contact portion that comes in contact with the conductor 80 and a portion that is visible above the contact portion to be distinguished from the surrounding insulators PI and PIa. The conductors 84A and 85A are provided, for example, in the same process as the conductors 82A and 83A. The conductors 84A and 85A are electrically noncoupled from the other conductors provided on the storage wafer 10 by the insulator PI.

Even with the above configuration, similarly to the second embodiment, the interconnect 15 and the pad unit PdU can be provided above the conductor 78. Therefore, the same effects as those of the second embodiment can be obtained.

2.4.2 Second Modification

In the first modification of the second embodiment described above, the case where the conductors 82A and 83A include the contact portion that comes in contact with the conductor 78 and the interconnect portion that functions as the pad unit PdU and the interconnect 15 above the contact portion has been described, but the present disclosure is not limited thereto. For example, conductor corresponding to the interconnect portion may be provided after a conductor different from the conductor 78 is provided on the top surface of the conductor 78 by an electroless plating growth method.

Figure 28:
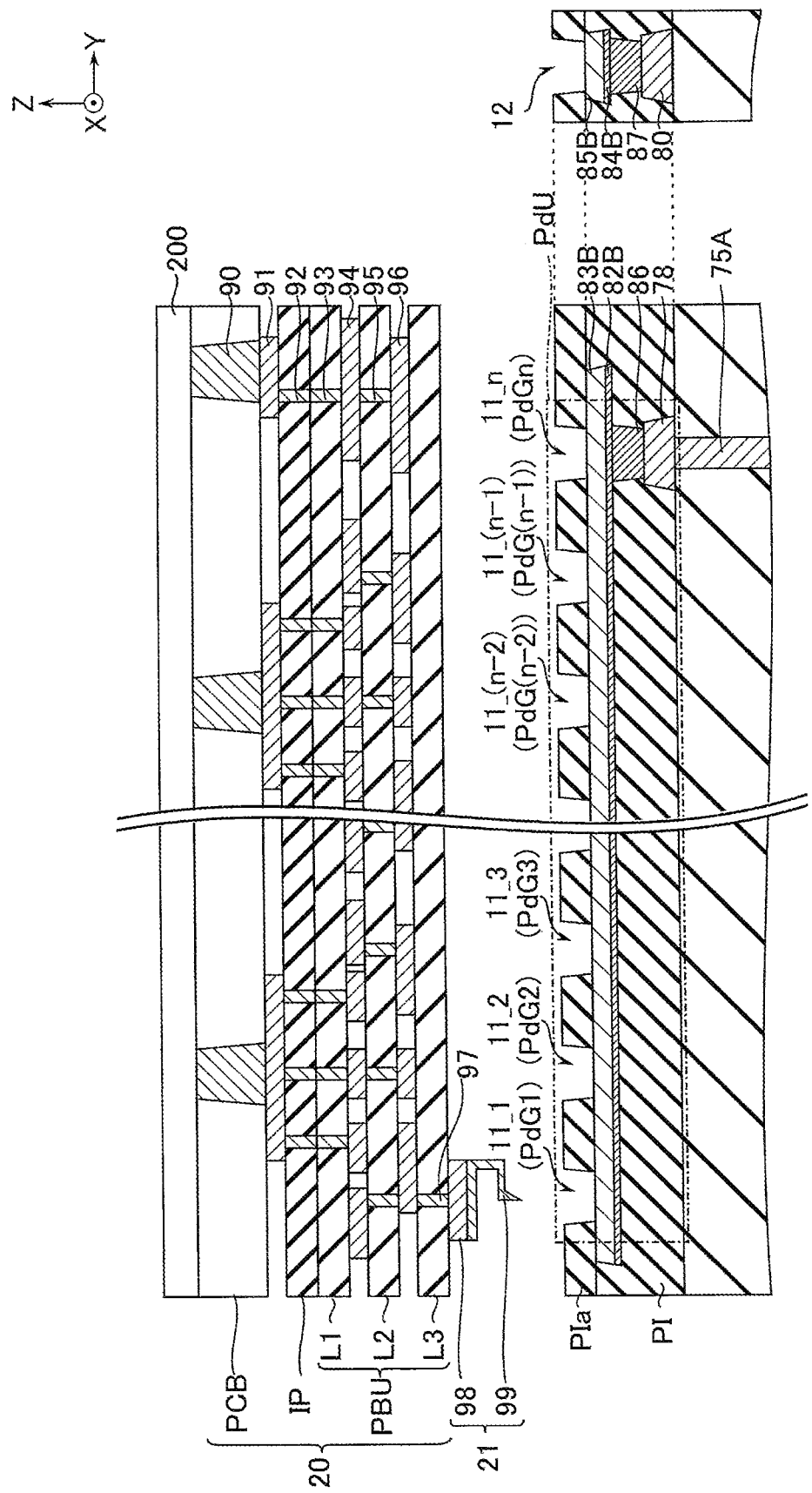
FIG. 28 is a cross-sectional view of a probe card and a storage wafer according to a second modification of the second embodiment.

FIG. 28 is an example of a configuration corresponding to a pad unit and an alignment mark according to a second modification of the second embodiment, and corresponds to FIG. 27 in the first modification of the second embodiment.

As illustrated in FIG. 28, a conductor 86 is provided on the top surface of the conductor 78. The conductor 86 is a dissimilar metal to the conductor 78 grown on the conductor 78 by an electroless plating growth method, and includes, for example, at least one metal selected from nickel (Ni), gold (Au), cobalt (Co), palladium (Pd), copper (Cu), and silver (Ag).

A conductor 82B functioning as a barrier metal is provided on a top surface of the conductor 86, and a conductor 83B is provided on a top surface of the conductor 82B. The conductor 83B includes, for example, copper (Cu). Since the conductors 82B and 83B have the same configuration and manufacturing method as the interconnect portions of the conductors 82A and 83A in the first modification of the second embodiment, the description thereof will be omitted.

The alignment mark 12 is formed on a top surface of the insulator INS_U so as to have the same configuration as the pad electrode 11, for example. More specifically, the conductor 80 is provided on the top surface of the insulator INS_U, and a conductor 87 is provided on the top surface of the conductor 80. The conductor 87 includes, for example, at least one metal selected from nickel (Ni), gold (Au), cobalt (Co), palladium (Pd), copper (Cu), and silver (Ag), and includes the same material as the conductor 86. A conductor 84B functioning as a barrier metal is provided on the top surface of the conductor 86, and a conductor 85B is provided on a top surface of the conductor 84B. The conductor 85B includes, for example, copper (Cu). Since the conductors 84B and 85B have the same configuration and manufacturing method as the interconnect portions of the conductors 84A and 85A in the first modification of the second embodiment, the description thereof will be omitted.

Even with the above configuration, similarly to the second embodiment and the first modification of the second embodiment, the interconnect 15 and the pad unit PdU can be provided above the conductor 78. Therefore, the same effects as those of the second embodiment and the first modification of the second embodiment can be obtained.

2.4.3 Third Modification

In the second embodiment and the first and second modifications of the second embodiment described above, the case where the insulator PIa that divides the exposed surface of the conductor 83 into n parts is provided on the top surface of the conductor 83 functioning as the pad unit PdU and the interconnect 15 has been described, but the present disclosure is not limited thereto. For example, a surface of the conductor 83 that reaches the top surface of the storage wafer 10 may not be divided into n parts by the insulator PIa.

Figure 29:
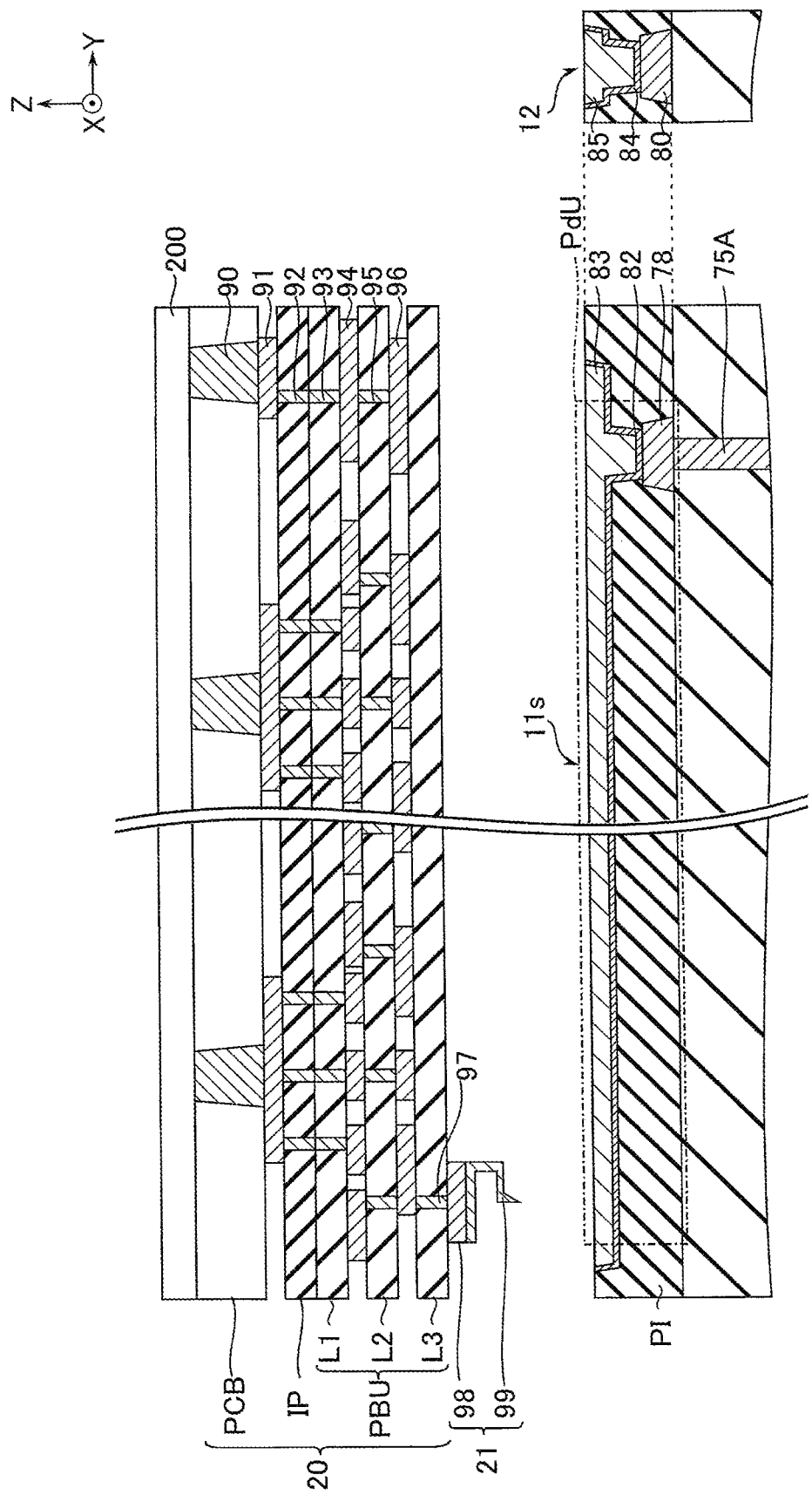
FIG. 29 is a cross-sectional view of a probe card and a storage wafer according to a third modification of the second embodiment.

FIG. 29 is an example of a configuration corresponding to a pad unit and an alignment mark according to a third modification of the second embodiment, and corresponds to FIG. 26 in the second embodiment.

As illustrated in FIG. 29, the conductor 83 extends along the Y direction and has a surface of which the top surface reaches the top surface of the storage wafer 10, and the surface is not divided along the Y direction by the insulator PIa.

With the above configuration, the pad unit PdU is not the plurality of pad electrodes 11_1 to 11_n divided into n parts, but one pad electrode 11s extending along the Y direction. As a result, an area of the pad unit PdU can be increased, and a degree of freedom of a position to be brought into contact with the probe electrode 21 at the time of the touchdown processing can be increased.

In the above example, the case where the number of probes for each pad group PdG is managed by the probe management table 335 has been described, but the second modification of the second embodiment is not limited thereto. For example, the probe management table 335 may store the number of probes not in units of the pad group PdG but in units of the storage wafer 10. In this case, a prober 3 may continuously change the position of the pad electrode 11s to be brought into contact with the probe electrode 21 along the Y direction, according to the number of probes per unit of the storage wafer 10. That is, the prober 3 may change the contact position with the probe electrode 21 on the pad electrode 11s every time the touchdown processing is executed.

3. Third Embodiment

Next, a storage system according to a third embodiment will be described.

In a third embodiment, a specific example of a plurality of pad electrodes 11 redistributed on a storage wafer 10 by a configuration including a redistribution layer described in the second embodiment is illustrated. In the following description, a pad electrode 11 including aluminum (Al) and formed on a NAND chip unit 100 and a pad electrode 11R formed above the pad electrode 11 with the redistribution layer interposed therebetween are distinguished as necessary.

3.1 Configuration of Redistributed Pad Electrode

Figure 31:
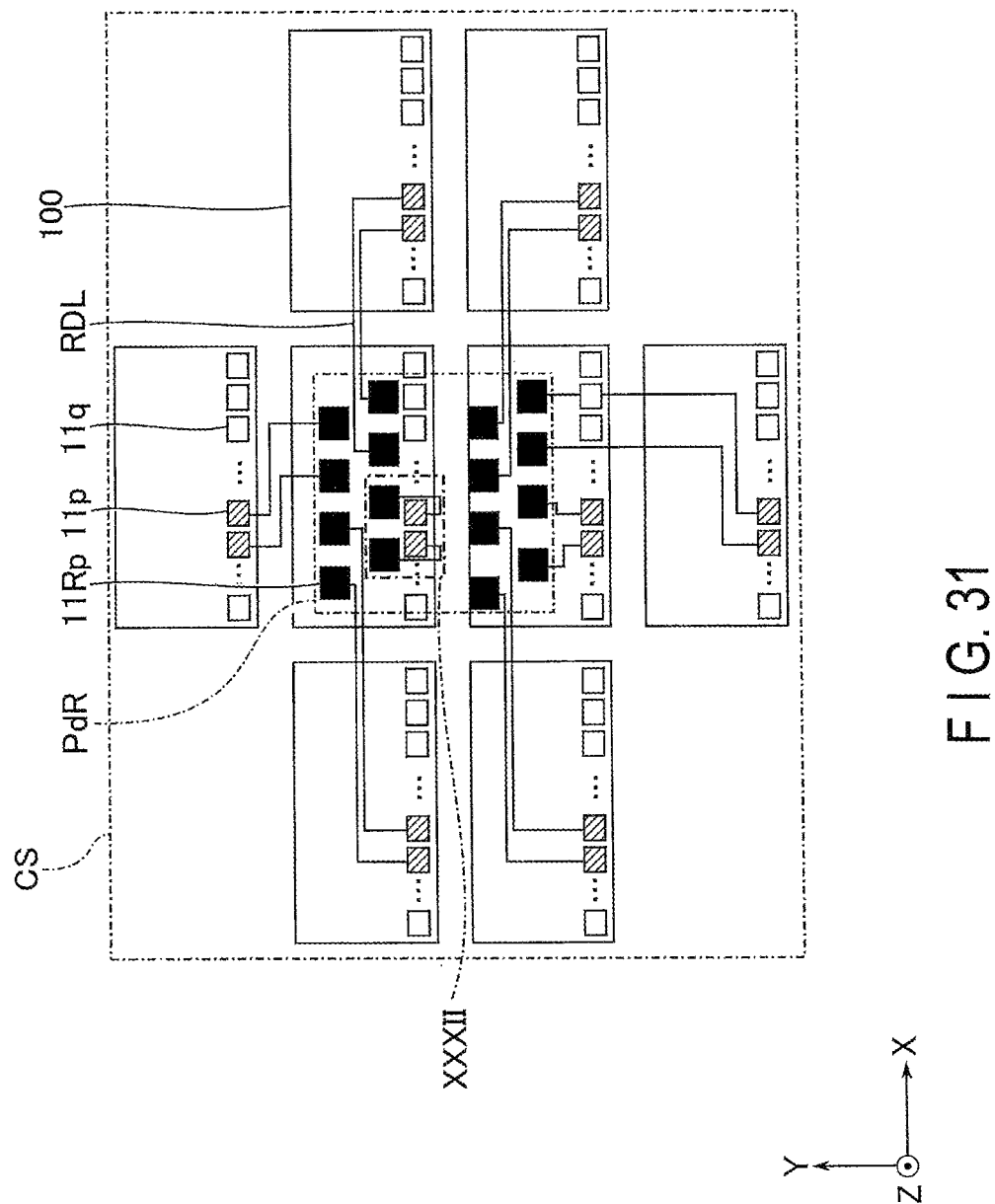
FIG. 31 is a top view illustrating a positional relation between redistributed pad electrodes and pad electrodes before being redistributed according to the third embodiment.

FIG. 30 is a schematic diagram illustrating an example of a configuration of a redistributed pad electrode according to the third embodiment. FIG. 30 schematically illustrates a part of a coupling relation between one NAND controller chip 200 a the storage wafer 10. FIG. 31 is a top view illustrating an example of a positional relation between a redistributed pad electrode and a pad electrode before being redistributed according to the third embodiment. FIG. 31 corresponds to FIG. 30, and illustrates a change in the position of the pad electrode before and after the redistribution when the storage wafer 10 is viewed from the above. In FIGS. 30 and 31, an interlayer insulating film is omitted as appropriate. Note that, in FIGS. 30 and 31, for convenience of description, a dicing line 13 and an edge seal 14 are illustrated as one solid rectangle surrounding a plurality of pad electrodes 11 in the corresponding NAND chip unit 100.

As illustrated in FIGS. 30 and 31, a set (chip set CS) of a plurality of NAND chip units 100 included in the storage wafer 10 is coupled to one corresponding NAND controller chip 200 via a probe card 20 and a probe electrode 21. Each of the plurality of NAND chip units 100 includes, for example, a plurality of pad electrodes 1ip and a plurality of pad electrodes 11q. In the examples of FIGS. 30 and 31, the chip set CS includes eight NAND chip units 100. Further, in the examples of FIGS. 30 and 31, each of the eight NAND chip units 100 in the chip set CS includes two pad electrodes 11p.

The pad electrode 11p is a pad electrode to be coupled to a pad electrode 11Rp redistributed in a region PdR via a redistribution layer RDL. The redistribution layer RDL can be formed across (the dicing line 13 and the edge seal 14 of) the NAND chip units 100. That is, the redistribution layer RDL can be formed so as to cross the dicing line 13. The pad electrode 11p is used, for example, to apply a power supply voltage. The pad electrode 11q is a pad electrode to be coupled to a pad electrode (not illustrated in the drawings) redistributed outside the region PdR via a redistribution layer (not illustrated in the drawings). The pad electrode 11q is used, for example, to input and output various control signals. The two adjacent pad electrodes 11 are disposed apart from each other by a pitch p1 in plan view, for example. The pitch p1 is, for example, 30 micrometers. In the third embodiment, the pad electrode 11p of the pad electrodes 11p and 11q will be mainly described.

The region PdR is located immediately below the corresponding NAND controller chip 200 and is smaller than a region including the entire chip set CS. For example, the region PdR is included in the region including the entire chip set CS in plan view and includes the corresponding NAND controller chip 200. That is, the pad electrode 11Rp redistributed in the region PdR is closer to the NAND controller chip 200 than the pad electrode 11p before being redistributed in plan view.

A plurality of pad electrodes 11Rp are redistributed so as to spread two-dimensionally in the region PdR, for example. In the example of FIG. 30, a case where the two adjacent pad electrodes 11Rp are arranged apart from each other by a pitch p2 in an X direction and are arranged apart from each other by a pitch p3 in a direction crossing the X direction is illustrated. The pitches p2 and p3 are longer than the pitch p1 (p2>p1 and p3>p1). The pitches p2 and p3 are desirably longer than 100 micrometers, for example. The pitches p2 and p3 are more desirably longer than 200 micrometers, for example. In addition, an area of the pad electrode 11Rp is larger than an area of the pad electrode 11p in plan view.

Figure 32:
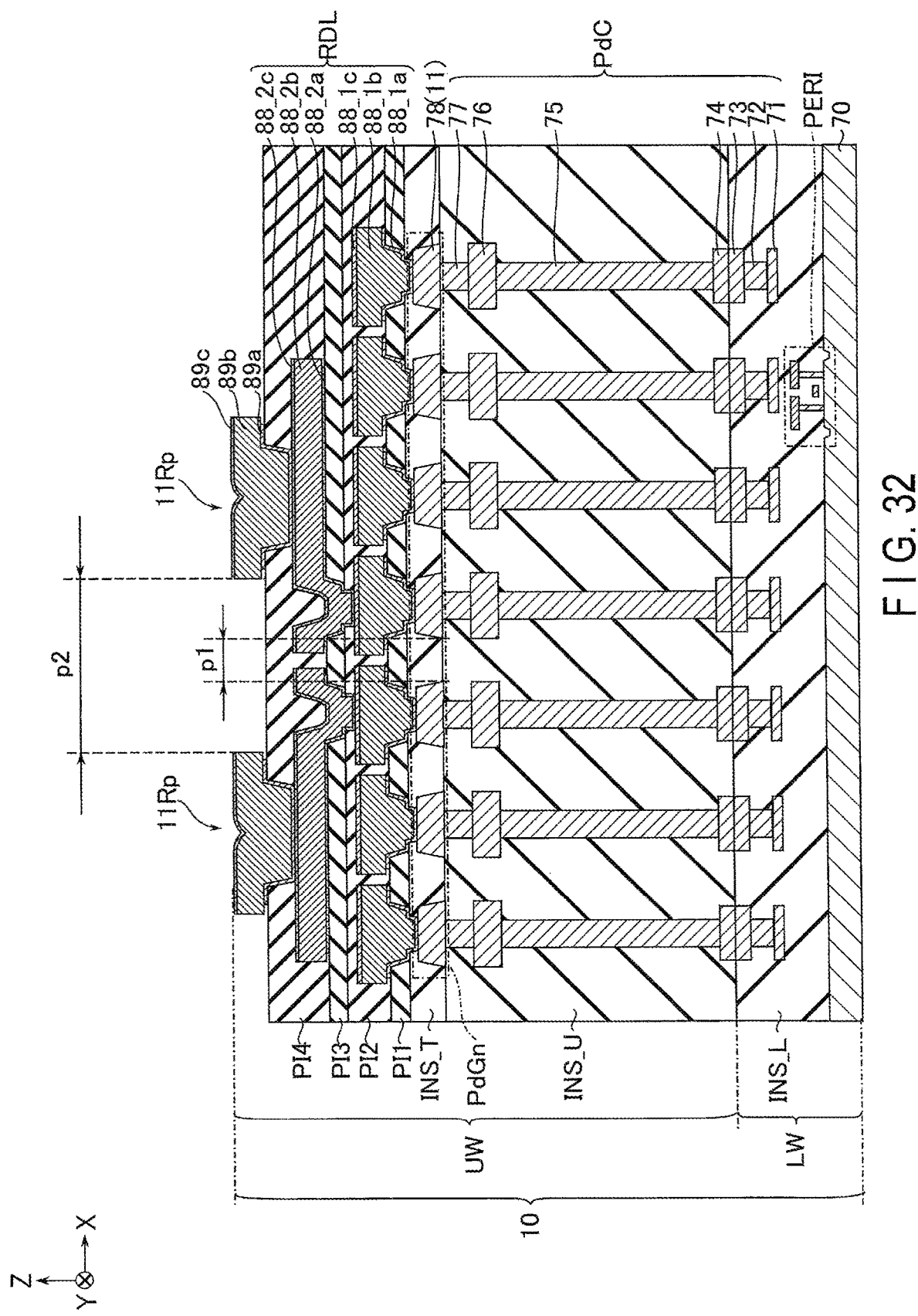
FIG. 32 is a side view of a storage wafer when the arrangement of main components in a region XXXII in FIG. 31 is viewed along the Y direction.

FIG. 32 is a side view of the arrangement of main components of a region XXXII in FIG. 31 as viewed along a Y direction, and illustrates an example of a configuration including the redistributed pad electrodes according to the third embodiment. For this reason, in FIG. 32, various components are illustrated on the same plane of paper for convenience of description, but the various components illustrated in FIG. 32 are not necessarily at the same position along the Y direction. In FIG. 32, since a configuration from a semiconductor substrate 70 to a conductor 78 corresponding to the pad electrodes 11p and 11q is the same as that in FIG. 11 in the first embodiment, the description thereof is omitted. Note that a plurality of conductors 78 arranged along the X direction are adjacent to each other along the X direction at a distance of the pitch p1.

As illustrated in FIG. 32, a conductor 88 used as the redistribution layer RDL is provided on a top surface of each of the plurality of conductors 78. Each of the plurality of conductors 88 includes, for example, a conductor 88_1 extending along the Y direction and a conductor 88_2 extending along the X direction. As described above, the conductor 88 has a structure of at least two layers having portions extending in different directions.

The conductor 88_1 is used as the redistribution layer RDL of the lower layer in the redistribution layer RDL of the two layers. The film thickness of the conductor 88_1 is substantially constant. Further, the conductor 88_1 is not planarized by chemical mechanical polishing (CMP). Therefore, although not clearly illustrated in FIG. 32, a contact portion of the conductor 88_1 with the conductor 78 can have a recessed shape with respect to a portion extending along the Y direction. The conductor 88_1 includes a conductor 88_1a, a conductor 88_1b, and a conductor 88_1c.

The conductor 88_1a is used as a seed layer of the conductor 88_1b. The conductor 88_1a includes, for example, titanium copper (TiCu). The conductor 88_1a includes a first portion in contact with the conductor 78, a second portion extending along the Y direction above the first portion, and a third portion coupling the first portion and the second portion.

On a top surface of an insulator INS_U, an oxide film INS_T is provided so as to be in contact with a side surface of the conductor 78, a side surface of the first portion of the conductor 88_1a, and a bottom surface of the third portion of the conductor 88_1a.

On a top surface of the oxide film INS_T, an organic film PI1 is provided so as to be in contact with a side surface of the third portion of the conductor 88_1a and a bottom surface of the second portion of the conductor 88_1*a*. The organic film PI1 is used as a passivation layer. The organic film PI1 includes, for example, polyimide.

The conductor 88_1*b* is used as a main interconnect portion of the redistribution layer RDL of the lower layer. The conductor 88_1*b* includes, for example, copper (Cu). The bottom surface of the conductor 88_1*b* is in contact with the top surface of the corresponding conductor 88_1*a*. Note that the bottom surface of the conductor 88_1*b* can have a portion not in contact with the conductor 88_1*a* at an end portion along an XY plane.

The conductor 88_1*c* is used as a protective layer of the conductor 88_1*b*. The conductor 88_1*c* includes, for example, nickel (Ni). The bottom surface of the conductor 88_1*c* is in contact with the top surface of the corresponding conductor 88_1*b*. The top surface of the conductor 88_1*c* has a portion in contact with the bottom surface of the corresponding conductor 88_2.

The conductor 88_2 is used as the redistribution layer RDL of the upper layer in the redistribution layer RDL of the two layers. The film thickness of each of the conductors 88_2 is substantially constant. Further, the conductor 88_2 is not planarized by CMP. Therefore, similarly to the conductor 88_1, a contact portion of the conductor 88_2 with the conductor 88_1 can have a recessed shape with respect to a portion extending along the X direction. The conductor 88_2 includes a conductor 88_2*a*, a conductor 88_2*b*, and a conductor 88_2*c*.

The conductor 88_2*a* is used as a seed layer of the conductor 88_2*b*. The conductor 88_2*a* includes, for example, titanium copper (TiCu). The conductor 88_2*a* includes a first portion in contact with the conductor 88_1*c*, a second portion extending along the X direction above the first portion, and a third portion coupling the first portion and the second portion.

On a top surface of the organic film PI1, an organic film PI2 is provided so as to be in contact with a side surface of the second portion of the conductor 88_1*a*, a side surface of the conductor 88_1*b*, a side surface of the conductor 88_1*c*, a side surface of the first portion of the conductor 88_2*a*, and a bottom surface of the third portion of the conductor 88_2*a*. The organic film PI2 is used as a passivation layer. The organic film PI2 includes, for example, polyimide.

On a top surface of the organic film PI2, an organic film. PI3 is provided so as to be in contact with a side surface of the third portion of the conductor 88_2*a* and a bottom surface of the second portion of the conductor 88_2*a*. The organic film PI3 is used as a passivation layer. The organic film PI3 includes, for example, polyimide.

The conductor 88_2*b* is used as a main interconnect portion of the redistribution layer RDL of the lower layer. The conductor 88_2*b* includes, for example, copper (Cu). The bottom surface of the conductor 88_2*b* is in contact with the top surface of the corresponding conductor 88_2*a*. Note that the bottom surface of the conductor 88_2*b* can have a portion not in contact with the conductor 88_2*a* at an end portion along the XY plane.

The conductor 88_2*c* is used as a protective layer of the conductor 88_2*b*. The conductor 88_2*c* includes, for example, nickel (Ni). The bottom surface of the conductor 88_2*c* is in contact with the top surface of the corresponding conductor 88_2*b*. The top surface of the conductor 88_2*c* has a portion in contact with the bottom surface of the corresponding conductor 89.

The conductor 89 is used as the pad electrode 11Rp. The top surface of the conductor 89 can have a shape in which a center portion is recessed with respect to a peripheral edge portion. The conductor 89 includes a conductor 89*a*, a conductor 89*b*, and a conductor 89*c*.

The conductor 89*a* is used as a seed layer of the conductor 89*b*. The conductor 89*a* includes, for example, titanium copper (TiCu). The conductor 89*a* includes a first portion in contact with the conductor 88_2*c* and a second portion coupled to the first portion and extending on the XY plane above the first portion.

On a top surface of the organic film PI3, an organic film PI4 is provided so as to be in contact with a side surface of the second portion of the conductor 88_2*a*, a side surface of the conductor 88_2*b*, a side surface of the conductor 88_2*c*, a side surface of the first portion of the conductor 89*a*, and a bottom surface of the second portion of the conductor 89*a*. The organic film PI4 is used as a passivation layer. The organic film PI4 includes, for example, polyimide.

The conductor 89*b* is used as a main part of the pad electrode 11Rp. The conductor 89*b* includes, for example, nickel (Ni). The bottom surface of the conductor 89*b* is in contact with the top surface of the corresponding conductor 89*a*. Note that the bottom surface of the conductor 89*b* can have a portion not in contact with the conductor 89*a* at an end portion along the XY plane.

The conductor 89*c* is used as a protective layer of the conductor 89*b*. The conductor 89*c* includes, for example, gold (Au). The bottom surface of the conductor 89*c* is in contact with the top surface of the corresponding conductor 89*b*. The top surface of the conductor 89*c* is located above the organic film PI4 in order to be in contact with the probe electrode 21.

Note that, in FIG. 32, for convenience of description, the conductor 78 and the conductor 89 are illustrated to be located in the same XZ plane, but in actuality, the conductor 89 is not provided immediately above the conductor 78. This is to avoid the conductor 89 from being recessed below the organic film PI4 due to a recessed shape of a portion of the conductor 88_1 located immediately above the conductor 78.

3.2 Effects According to Present Embodiment

According to the third embodiment, the pad electrode 11 before redistribution and the pad electrode 11R after redistribution are coupled by the redistribution layer RDL of at least two layers. As a result, the pad electrode 11R can be redistributed to a desired position in the XY plane with respect to the pad electrode 11.

Specifically, the pad electrodes can be redistributed such that the pitches p2 and p3 between the pad electrodes 11R adjacent to each other are longer than the pitch p1 between the pad electrodes 11 adjacent to each other. As a result, it is possible to reduce the load of alignment in the alignment processing of the probe electrode 21 brought into contact with the redistributed pad electrode 11Rp.

Further, the pad electrode 11*p* is coupled to the pad electrode 11Rp arranged so as to sandwich the dicing line 13 via the redistribution layer RDL crossing the dicing line 13. As a result, the plurality of pad electrodes 11*p* interspersed for each NAND chip unit 100 can be aggregated into the plurality of pad electrodes 11Rp in the region PdR that is narrower than the region surrounding the chip set CS and immediately below the NAND controller chip 200. Therefore, a length of an interconnect between the probe electrode 21 and the NAND controller chip 200 can be decreased as compared with a case where a pad electrode outside the region PdR is used. Therefore, the interconnecting design load in the probe card 20 can be reduced.

3.3 Modifications

Note that the above-described third embodiment can be variously modified.

3.3.1 First Modification

In the third embodiment described above, the case where the individual pad electrode 11Rp is allocated to the pad electrode 11p in each NAND chip unit 100 has been described, but the present disclosure is not limited thereto. For example, the pad electrode 11Rp may be shared between the NAND chip units 100.

Figure 33:
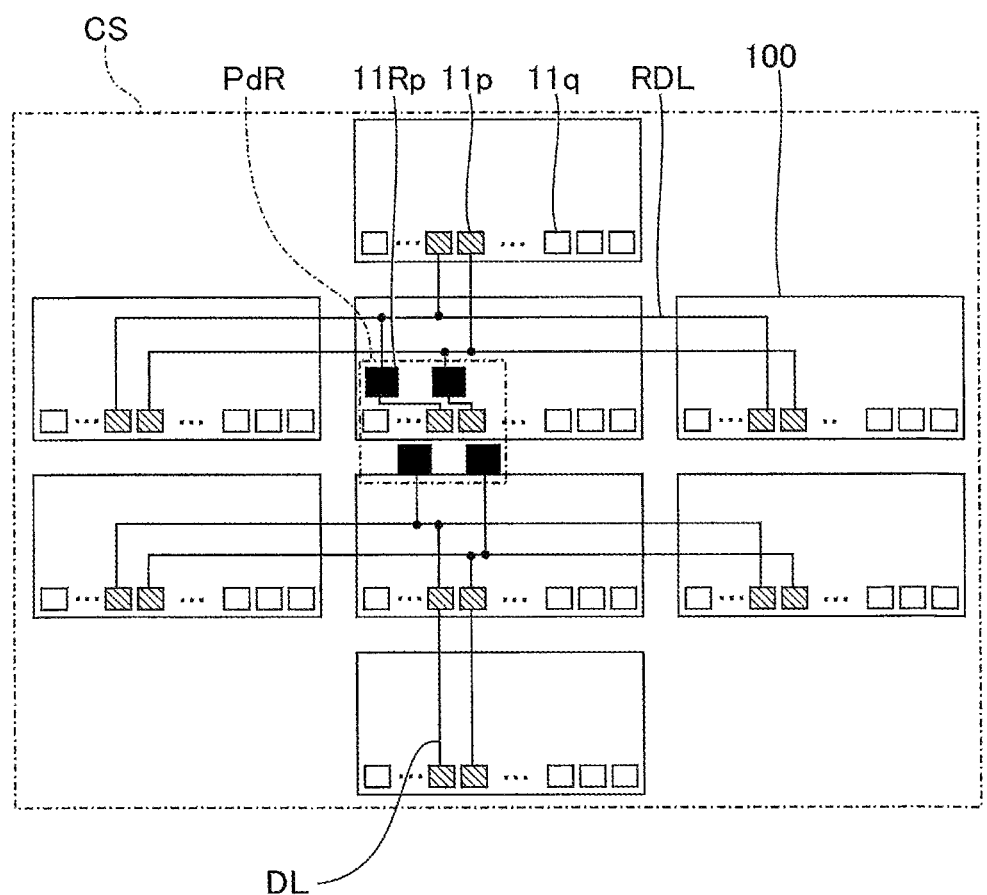
FIG. 33 is a top view illustrating a positional relation between redistributed pad electrodes and pad electrodes before being redistributed according to a first modification of the third embodiment.

FIG. 33 is a top view illustrating an example of a positional relation between a redistributed pad electrode and a pad electrode before being redistributed according to a first modification of the third embodiment. In the example of FIG. 33, a case where each of the eight NAND chip units 100 in the chip set CS includes two pad electrodes 11p is illustrated.

As illustrated in FIG. 33, in the region PdR, four pad electrodes 11Rp are allocated to 16 pad electrodes 11p in the chip set CS. That is, one pad electrode 11Rp is commonly coupled to four pad electrodes 11p in different NAND chip units 100 via at least one redistribution layer RDL.

The plurality of pad electrodes 11p commonly coupled to the pad electrode 11Rp may be coupled to the pad electrode 11Rp via different redistribution layers RDL. That is, the number of redistribution layers RDL coupling one pad electrode Rp and the plurality of pad electrodes 11p may be two or more.

Further, a certain pad electrode 11p may be coupled to another pad electrode 11p without going through a redistribution layer RDL (for example, via an interconnect layer DL formed in the same layer as the pad electrode 11p). In addition, the certain pad electrode 11p may be coupled to the pad electrode 11Rp via the redistribution layer RDL coupled to another pad electrode 11p.

According to the above configuration, when a common signal or voltage is supplied to the plurality of NAND chip units 100, the number of pad electrodes 11Rp for supplying the common signal or voltage can be reduced. As a result, the margin of the pitch between the pad electrodes 11Rp can be taken larger. Therefore, the load of alignment in the alignment processing can be reduced.

3.3.2 Second Modification

In the third embodiment and the first modification of the third embodiment described above, the case where there is one pad electrode 11Rp coupled to one pad electrode 11p has been described, but the present disclosure is not limited thereto. For example, one pad electrode 11p may be provided with a plurality of pad electrodes 11Rp.

FIG. 34 is a top view illustrating an example of a positional relation between a redistributed pad electrode and a pad electrode before being redistributed according to a second modification of the third embodiment. In the example of FIG. 34, a case where each of the eight NAND chip units 100 in the chip set CS includes one pad electrode 11p is illustrated.

As illustrated in FIG. 34, 16 pad electrodes 11Rp are allocated to 8 pad electrodes 11p in the chip set CS in the region PdR. That is, one pad electrode 11p is commonly coupled to two pad electrodes 11Rp via the redistribution layer RDL.

According to the above configuration, as described in the first embodiment and the second embodiment, the pad electrode 11Rp to be brought into contact with the probe electrode 21 can be caused to be redundant. As a result, even when the first pad electrode 11Rp cannot be used due to the touchdown processing, the NAND chip unit 100 and the NAND controller chip 200 can be coupled by using the second pad electrode 11Rp. In FIG. 34, the case where the two pad electrodes 11Rp are provided for one pad electrode 1ip has been described, but the present disclosure is not limited thereto, and three or more pad electrodes 11Rp may be provided. Further, a plurality of pad electrodes 11R may be provided for the pad electrode 11q. The number of pad electrodes 11R provided for the pad electrode 11q may be different from the number of pad electrodes 11Rp provided for the pad electrode 11p.

4. Others

In the first to third embodiments and various modifications described above, the case where the NAND controller chip 200 and the NAND chip unit 100 are coupled by moving the storage wafer 10 with respect to the fixed probe card 20 has been described, but the present disclosure is not limited thereto. For example, the probe card 20 may be moved with respect to the fixed storage wafer 10, or both the storage wafer 10 and the probe card 20 may have the drive control system 32 that is movable.

Further, in the first to third embodiments and various modifications described above, the case where the probe management table 335 is stored in the interface control system 33 has been described, but the present disclosure is not limited thereto. For example, the probe management table 335 may be appropriately stored in the storage wafer 10 or may be managed by the host device 2.

Further, in the first to third embodiments and various modifications described above, the case where one prober 3 is provided in the storage system 1 has been described. However, a plurality of probers 3 may be provided in the storage system 1. In this case, it is desirable that the total number of probes executed for the storage wafer 10 regardless of which of the plurality of probers 3 is used be aggregated and stored in the probe management table 335. Therefore, the probe management table 335 may be managed by a device (for example, the host device 2) that can control the plurality of probers 3.

Further, in the first to third embodiments and various modifications described above, the case where the storage wafer 10 is provided by bonding the two wafers LW and UW has been described, but the present disclosure is not limited thereto. For example, the plurality of NAND chip units 100 in the storage wafer 10 may be provided on one wafer. In this case, the memory cell array MCA may be provided on the substrate, or may be provided above the substrate without being in contact with the substrate. When the memory cell array MCA is provided on the substrate, the peripheral circuit PERI can be provided on the substrate around the memory cell array MCA. Further, when the memory cell array MCA is provided above the substrate, the peripheral circuit PERI can be provided on the substrate below the memory cell array MCA.

Further, in the first to third embodiments and various modifications described above, the case where the semiconductor storage device provided in the storage wafer 10 is the NAND type flash memory has been described, but the present disclosure is not limited thereto. For example, the semiconductor storage device provided in the storage wafer 10 may be a NOR type flash memory.

The invention claimed is:

1. A storage system comprising:
a first memory chip unit including a first pad electrode including a first portion and a second portion electrically coupled to each other, and a first memory cell array electrically coupled to the first pad electrode; and
a prober that is able to hold the first memory chip unit and executes reading and writing on the first memory cell array of the held first memory chip unit, wherein
the prober includes
a probe card including a first probe electrode that is able to be in contact with the first pad electrode of the held first memory chip unit, and a first memory controller that is able to be electrically coupled to the first probe electrode and execute reading and writing on the first memory cell array via the first probe electrode, and
a movement mechanism that moves the probe card or the held first memory chip unit to bring the first pad electrode of the held first memory chip unit into contact with the first probe electrode, and
the movement mechanism executes a first operation that brings the first probe electrode into contact with the first portion of the first pad electrode and does not bring the first probe electrode into contact with the second portion of the first pad electrode, and a second operation that does not bring the first probe electrode into contact with the first portion of the first pad electrode and brings the first probe electrode into contact with the second portion of the first pad electrode.

2. The storage system according to claim 1, further comprising:
a first wafer including the first memory chip unit, wherein
the prober is able to hold the first wafer, and holds the first memory chip unit by holding the first wafer, and
the movement mechanism moves the first memory chip unit by moving the first wafer.

3. The storage system according to claim 2, wherein
the first wafer further includes a second memory chip unit including a second pad electrode including a first portion and a second portion electrically coupled to each other, and a second memory cell array electrically coupled to the second pad electrode,
the probe card further includes a second probe electrode electrically coupled to the first memory controller,
the first operation further includes bringing the second probe electrode into contact with the first portion of the second pad electrode, and
the second operation further includes bringing the second probe electrode into contact with the second portion of the second pad electrode.

4. The storage system according to claim 2, wherein
the first wafer further includes a third memory chip unit including a third pad electrode including a first portion and a second portion electrically coupled to each other, and a third memory cell array electrically coupled to the third pad electrode,
the probe card further includes a third probe electrode and a second memory controller electrically coupled to the third probe electrode,
the first operation further includes bringing the third probe electrode into contact with the first portion of the third pad electrode, and
the second operation further includes bringing the third probe electrode into contact with the second portion of the third pad electrode.

5. The storage system according to claim 2, wherein
the first pad electrode has a convex shape from the first wafer toward the probe card in a state where the first wafer is placed in the prober, and
a portion of the first probe electrode facing the first wafer placed in the prober has a flat plate shape.

6. The storage system according to claim 1, wherein
the movement mechanism is configured to
execute the first operation when a first condition is not satisfied, and
execute the second operation when the first condition is satisfied.

7. The storage system according to claim 6, wherein
the first condition includes that the number of times of contact between the first probe electrode and the first portion of the first pad electrode is equal to or larger than a first threshold.

8. The storage system according to claim 7, further comprising:
a first wafer including the first memory chip unit; and
a second wafer, wherein
the prober is able to hold the first wafer, and holds the first memory chip unit by holding the first wafer,
the movement mechanism moves the first memory chip unit by moving the first wafer, and
the movement mechanism is further able to execute a third operation that brings the first probe electrode into contact with the second wafer.

9. The storage system according to claim 8, wherein
the movement mechanism is configured to execute the first operation or the second operation after executing the third operation, when a second condition is satisfied.

10. The storage system according to claim 9, wherein
the second condition includes that the number of times of contact between the first probe electrode and the first wafer is equal to or larger than a second threshold larger than the first threshold.

11. The storage system according to claim 6, wherein
the first condition includes that the first memory controller has failed in error correction processing of data from the first memory chip unit.

12. The storage system according to claim 6, wherein
the first condition includes that the first memory chip unit has failed in error correction processing of data from the first memory controller.

13. The storage system according to claim 1, wherein
the first memory chip unit includes a latch circuit that is commonly coupled to the first portion and the second portion of the first pad electrode.

14. A memory chip unit comprising:
a memory structure including a plurality of first conductor layers stacked in a first direction above a substrate, a first semiconductor layer extending in the first direction in the plurality of first conductor layers, and a first charge storage layer provided between the plurality of first conductor layers and the first semiconductor layer;
a first interconnect layer and a second interconnect layer provided above the memory structure so as to be electrically insulated from each other;
a second conductor layer provided on a top surface of a first portion of the first interconnect layer;
a third conductor layer provided on a top surface of a second portion of the first interconnect layer;

a fourth conductor layer provided on a top surface of the first portion of the second interconnect layer; and a fifth conductor layer provided on a top surface of a second portion of the second interconnect layer, wherein the second conductor layer, the third conductor layer, the fourth conductor layer, and the fifth conductor layer include aluminum (Al), and a relative position of the fourth conductor layer with respect to the second conductor layer is matched with a relative position of the fifth conductor layer with respect to the third conductor layer in a plane parallel to the substrate.

15. The memory chip unit according to claim 14, wherein a direction in which the second conductor layer and the third conductor layer are arranged is parallel to a direction in which the fourth conductor layer and the fifth conductor layer are arranged, and a direction in which the second conductor layer and the fourth conductor layer are arranged is parallel to a direction in which the third conductor layer and the fifth conductor layer are arranged.

16. The memory chip unit according to claim 14, further comprising:

a sixth conductor layer provided on a top surface of the second conductor layer; and a seventh conductor layer provided on a top surface of the third conductor layer, wherein the sixth conductor layer and the seventh conductor layer include a metal different from a metal of the second conductor layer and the third conductor layer.

17. The memory chip unit according to claim 16, wherein the sixth conductor layer and the seventh conductor layer include at least one metal selected from nickel (Ni), gold (Au), cobalt (Co), palladium (Pd), copper (Cu), and silver (Ag).

18. The memory chip unit according to claim 16, wherein a top surface of the sixth conductor layer and a top surface of the seventh conductor layer are located above a top surface of an insulator layer between the sixth conductor layer and the seventh conductor layer.

19. The memory chip unit according to claim 14, further comprising a dicing line provided between the second conductor layer and the third conductor layer.

20. A wafer comprising:

a memory structure including a plurality of first conductor layers stacked in a first direction above a substrate, a first semiconductor layer extending in the first direction in the plurality of first conductor layers, and a first charge storage layer provided between the plurality of first conductor layers and the first semiconductor layer;

a second conductor layer provided above the memory structure;

a third conductor layer provided above the second conductor layer;

a fourth conductor layer electrically coupling the second conductor layer and the third conductor layer; and an insulator layer provided between the second conductor layer and the third conductor layer and including polyimide, wherein in plan view, the fourth conductor layer crosses a dicing line, and the second conductor layer and the third conductor layer sandwich the dicing line.

21. The wafer according to claim 20, wherein the second conductor layer includes aluminum (Al), and the fourth conductor layer includes copper (Cu).

22. The wafer according to claim 21, further comprising:

a fifth conductor layer adjacent to the second conductor layer in a first plane parallel to the substrate; and a sixth conductor layer adjacent to the third conductor layer in a second plane parallel to the substrate, wherein a distance between the third conductor layer and the sixth conductor layer is longer than a distance between the second conductor layer and the fifth conductor layer.

23. The wafer according to claim 22, further comprising:

a seventh conductor layer electrically coupled to the sixth conductor layer in the first plane, wherein a distance between the third conductor layer and the sixth conductor layer is shorter than a distance between the second conductor layer and the seventh conductor layer.

24. The wafer according to claim 22, wherein a direction in which the second conductor layer and the fifth conductor layer are arranged is different from a direction in which the third conductor layer and the sixth conductor layer are arranged.

25. The wafer according to claim 21, wherein an area of the third conductor layer is larger than an area of the second conductor layer in plan view.

26. The wafer according to claim 21, further comprising:

an eighth conductor layer electrically coupled to the third conductor layer via the second conductor layer and including aluminum (Al).

27. The wafer according to claim 21, further comprising:

a ninth conductor layer electrically coupled to the third conductor layer without going through the second conductor layer and including aluminum (Al).

28. The wafer according to claim 21, further comprising:

a tenth conductor layer electrically coupled to the third conductor layer without going through the second conductor layer and the fourth conductor layer and including aluminum (Al).

29. The wafer according to claim 21, wherein the third conductor layer includes gold (Au) or nickel (Ni).

* * * * *